(12) United States Patent
Bower et al.

(10) Patent No.: US 11,854,788 B2
(45) Date of Patent: Dec. 26, 2023

(54) MICRO ASSEMBLED LED DISPLAYS AND LIGHTING ELEMENTS

(71) Applicant: X Display Company Technology Limited, Dublin (IE)

(72) Inventors: Christopher Bower, Raleigh, NC (US); Matthew Meitl, Durham, NC (US); David Gomez, Holly Springs, NC (US); Salvatore Bonafede, Chapel Hill, NC (US); David Kneeburg, Durham, NC (US); Alin Fecioru, Cork (IE); Carl Prevatte, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 319 days.

(21) Appl. No.: 17/203,314

(22) Filed: Mar. 16, 2021

(65) Prior Publication Data

US 2021/0225815 A1    Jul. 22, 2021

Related U.S. Application Data

(63) Continuation of application No. 16/244,860, filed on Jan. 10, 2019, now Pat. No. 10,985,143, which is a
(Continued)

(51) Int. Cl.
*H01L 25/075* (2006.01)
*G09G 3/32* (2016.01)
(Continued)

(52) U.S. Cl.
CPC .......... *H01L 25/0753* (2013.01); *F21V 9/08* (2013.01); *G02B 26/04* (2013.01); *G02F 1/167* (2013.01);
(Continued)

(58) Field of Classification Search
CPC . H01L 25/0753; H01L 27/156; H01L 27/167; H01L 33/36; H01L 33/38;
(Continued)

(56) References Cited

U.S. PATENT DOCUMENTS 6,028,977 A    2/2000   Newsome
6,084,579 A    7/2000   Hirano
(Continued)

FOREIGN PATENT DOCUMENTS

CN          1975521 A    6/2007
CN        101142694 A    3/2008
(Continued)

OTHER PUBLICATIONS

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.
(Continued)

*Primary Examiner* — Jaehwan Oh
*Assistant Examiner* — John M Parker
(74) *Attorney, Agent, or Firm* — Choate, Hall & Stewart LLP; William R. Haulbrook; Michael D. Schmitt

(57) ABSTRACT

The disclosed technology provides micro-assembled micro-LED displays and lighting elements using arrays of micro-LEDs that are too small (e.g., micro-LEDs with a width or diameter of 10 μm to 50 μm), numerous, or fragile to assemble by conventional means. The disclosed technology provides for micro-LED displays and lighting elements assembled using micro-transfer printing technology. The micro-LEDs can be prepared on a native substrate and printed to a display substrate (e.g., plastic, metal, glass, or other materials), thereby obviating the manufacture of the
(Continued)

micro-LEDs on the display substrate. In certain embodiments, the display substrate is transparent and/or flexible.

18 Claims, 63 Drawing Sheets

Related U.S. Application Data continuation of application No. 14/743,788, filed on Jun. 18, 2015, now Pat. No. 10,224,460.

(60) Provisional application No. 62/169,531, filed on Jun. 1, 2015, provisional application No. 62/148,603, filed on Apr. 16, 2015, provisional application No. 62/131,230, filed on Mar. 10, 2015, provisional application No. 62/056,419, filed on Sep. 26, 2014, provisional application No. 62/055,485, filed on Sep. 25, 2014, provisional application No. 62/029,533, filed on Jul. 27, 2014, provisional application No. 62/026,695, filed on Jul. 20, 2014, provisional application No. 62/014,077, filed on Jun. 18, 2014.

(51) Int. Cl.

| | | |
|---|---|---|
| H01L 33/38 | (2010.01) | |
| H01L 23/482 | (2006.01) | |
| H01L 23/538 | (2006.01) | |
| G02F 1/167 | (2019.01) | |
| H01L 33/62 | (2010.01) | |
| H01L 33/50 | (2010.01) | |
| H01L 33/60 | (2010.01) | |
| G02B 26/04 | (2006.01) | |
| H01L 25/16 | (2023.01) | |
| H01L 33/36 | (2010.01) | |
| H01L 33/48 | (2010.01) | |
| H05K 1/03 | (2006.01) | |
| H05K 1/09 | (2006.01) | |
| H05K 1/18 | (2006.01) | |
| H05K 5/00 | (2006.01) | |
| G09G 3/22 | (2006.01) | |
| H01L 27/15 | (2006.01) | |
| F21V 9/08 | (2018.01) | |
| H01L 33/58 | (2010.01) | |
| F21Y 105/10 | (2016.01) | |
| F21Y 115/10 | (2016.01) | |
| F21Y 113/13 | (2016.01) | |
| H01L 33/20 | (2010.01) | |
| H01L 33/40 | (2010.01) | |

(52) U.S. Cl.
CPC ............... *G09G 3/22* (2013.01); *G09G 3/32* (2013.01); *H01L 23/4821* (2013.01); *H01L 23/5381* (2013.01); *H01L 25/167* (2013.01); *H01L 27/156* (2013.01); *H01L 33/36* (2013.01); *H01L 33/38* (2013.01); *H01L 33/385* (2013.01); *H01L 33/48* (2013.01); *H01L 33/50* (2013.01); *H01L 33/502* (2013.01); *H01L 33/508* (2013.01); *H01L 33/58* (2013.01); *H01L 33/60* (2013.01); *H01L 33/62* (2013.01); *H05K 1/0306* (2013.01); *H05K 1/09* (2013.01); *H05K 1/181* (2013.01); *H05K 1/182* (2013.01); *H05K 5/0017* (2013.01); *F21Y 2105/10* (2016.08); *F21Y 2113/13* (2016.08); *F21Y 2115/10* (2016.08); *G09G 2300/0452* (2013.01); *G09G 2300/0842* (2013.01); *G09G 2310/0264* (2013.01); *H01L 33/20* (2013.01); *H01L 33/405* (2013.01); *H01L 2224/18* (2013.01); *H01L 2224/73267* (2013.01); *H01L 2224/92244* (2013.01); *H05K 2201/0329* (2013.01); *H05K 2201/10106* (2013.01); *H05K 2201/10128* (2013.01); *H05K 2201/10166* (2013.01)

(58) Field of Classification Search
CPC ... H01L 33/385; H01L 33/50; H01L 23/4821; G09G 2300/0426
See application file for complete search history.

(56) References Cited

U.S. PATENT DOCUMENTS

| | | |
|---|---|---|
| 6,142,358 A | 11/2000 | Cohn et al. |
| 7,195,733 B2 | 3/2007 | Rogers et al. |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 8,333,860 B1 | 12/2012 | Bibl et al. |
| 8,470,701 B2 | 6/2013 | Rogers et al. |
| 8,506,867 B2 | 8/2013 | Menard |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 2004/0227704 A1 | 11/2004 | Wang et al. |
| 2005/0168987 A1 | 8/2005 | Tamaoki et al. |
| 2007/0035340 A1 | 2/2007 | Kimura |
| 2010/0317132 A1* | 12/2010 | Rogers ............... H01L 21/6835 257/E33.059 |
| 2011/0315956 A1 | 12/2011 | Tischler et al. |
| 2013/0187174 A1 | 7/2013 | Tischler |
| 2013/0309792 A1 | 11/2013 | Tischler et al. |
| 2014/0111410 A1* | 4/2014 | Guo ............... G09G 3/2003 345/87 |
| 2014/0159043 A1 | 6/2014 | Sakariya et al. |

(56) References Cited

U.S. PATENT DOCUMENTS

| | | | | |
|---|---|---|---|---|
| 2014/0367705 A1* | 12/2014 | Bibl | ..................... | H01L 33/62 438/27 |
| 2016/0093600 A1 | 3/2016 | Bower et al. | | |
| 2017/0338374 A1 | 11/2017 | Zou et al. | | |

FOREIGN PATENT DOCUMENTS

| | | |
|---|---|---|
| CN | 102939497 A | 2/2013 |
| CN | 114725083 A | 7/2022 |
| JP | 2001-057447 A | 2/2001 |
| WO | WO-2005/072455 A2 | 8/2005 |
| WO | WO-2011/159426 A2 | 12/2011 |

OTHER PUBLICATIONS

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer et al., 63.2: AMOLED Displays Using Transfer-Printed Integrated Circuits, SID 09 Digest, 40(2):947-950 (2009).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

\* cited by examiner

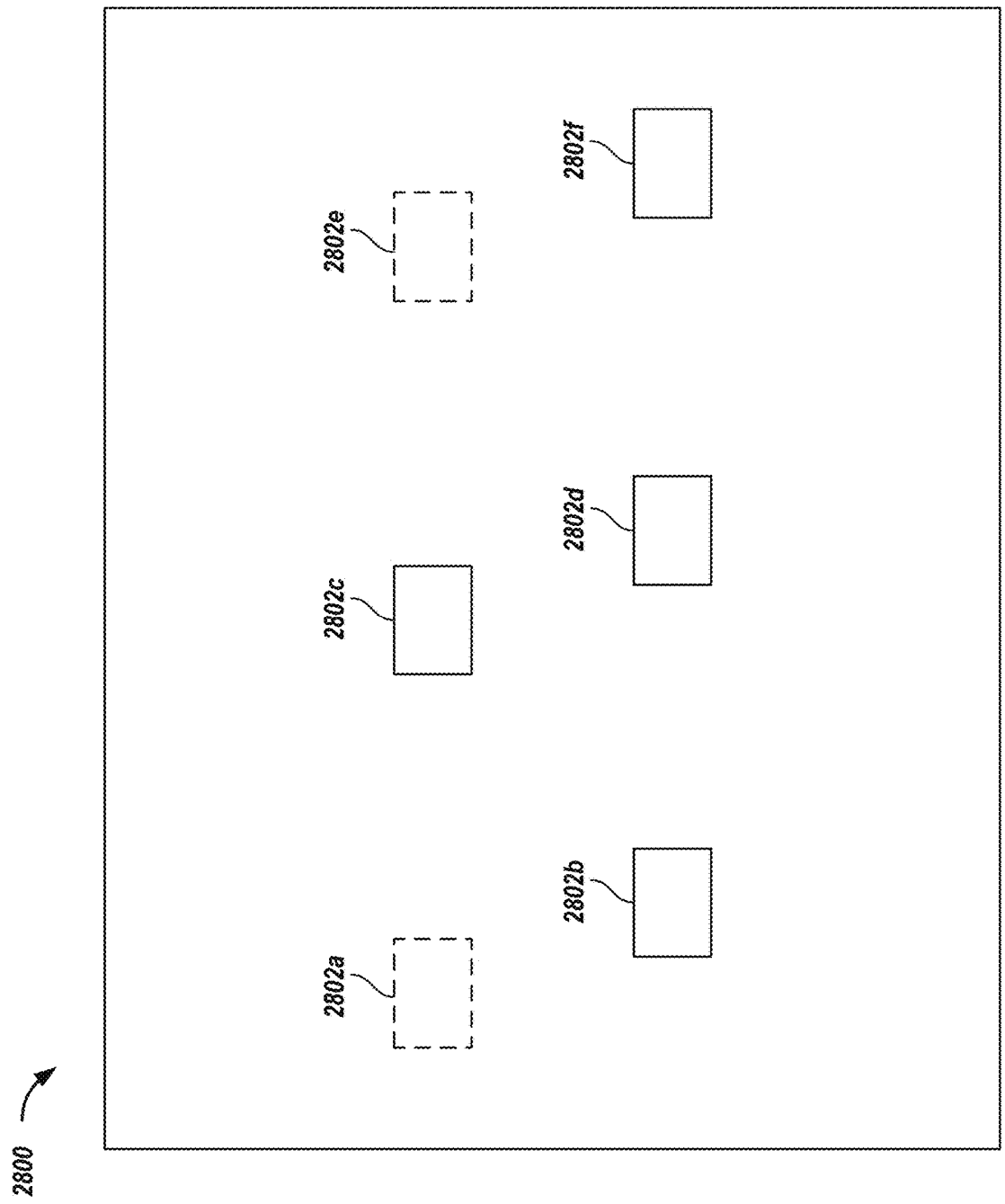

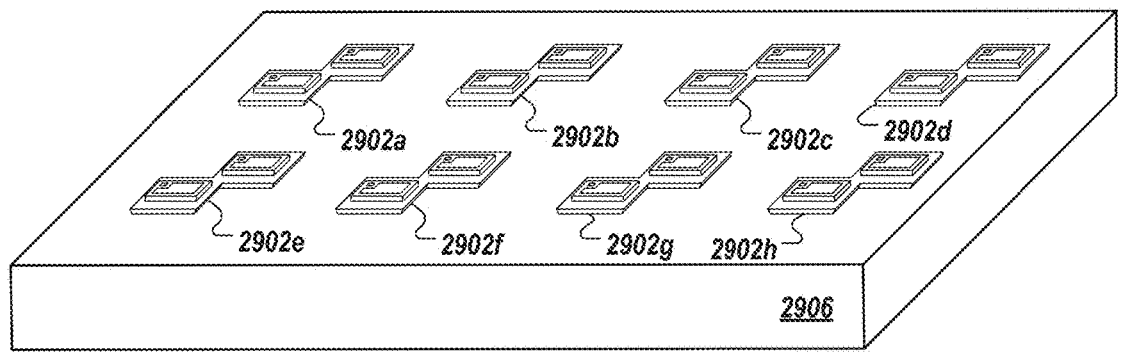
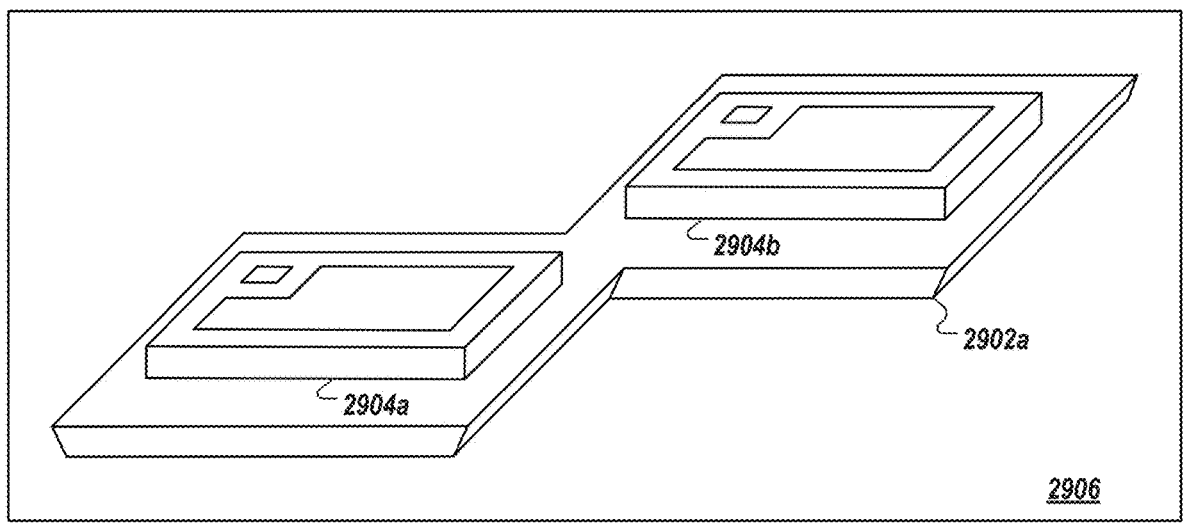
FIG. 29

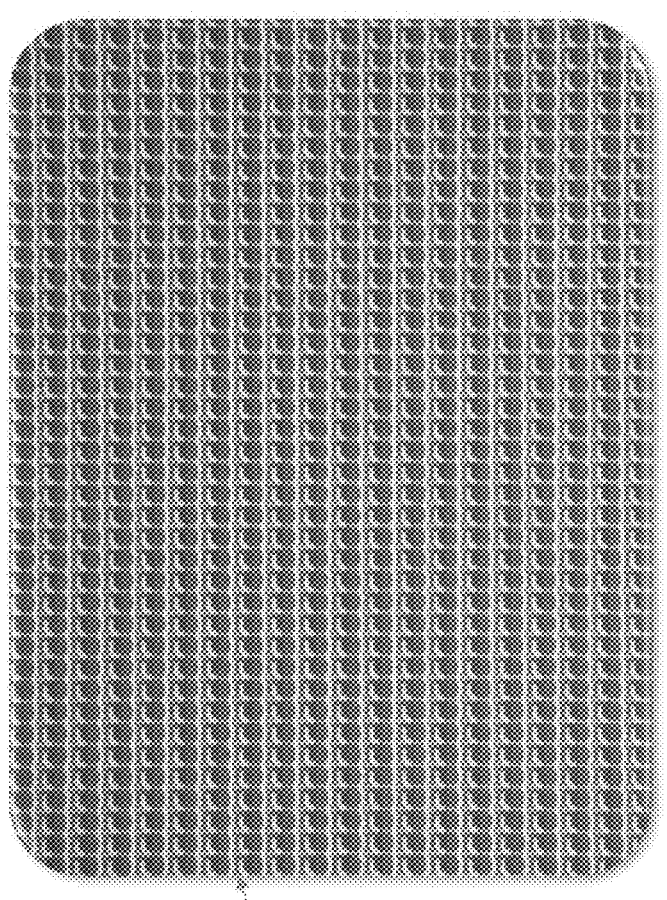
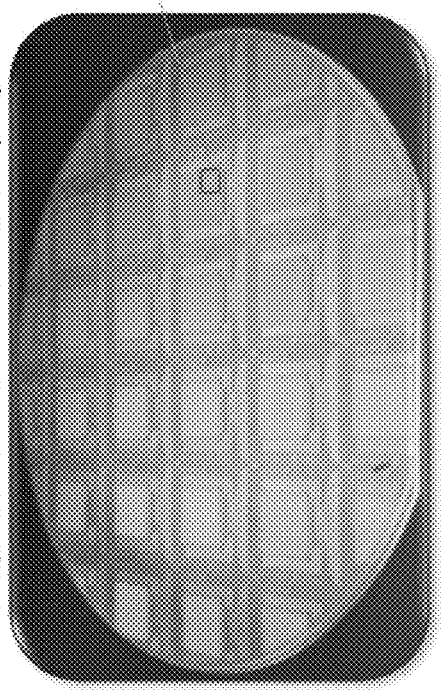
Completed Passive Matrix Displays
FIG. 44

1" Red PMiLED display over print

1" Red PMiLED display over smartphone LCD

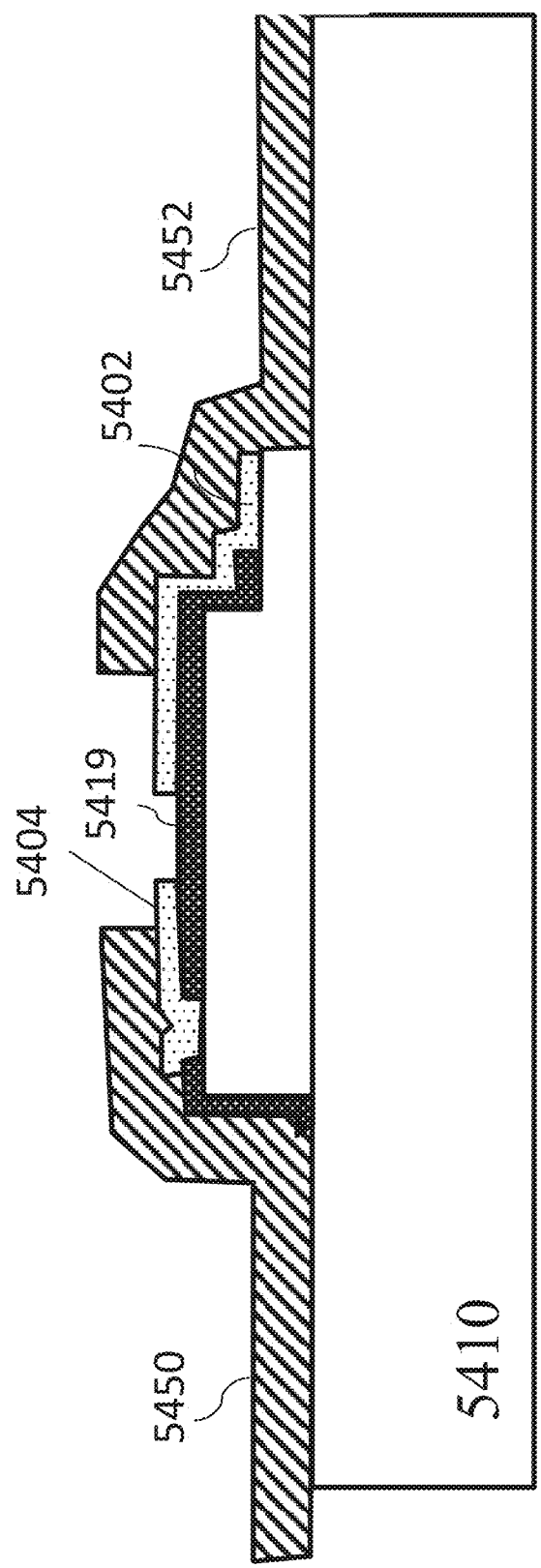

MICRO ASSEMBLED LED DISPLAYS AND LIGHTING ELEMENTS

RELATED APPLICATIONS

This application is a continuation of U.S. patent application Ser. No. 16/244,860, filed on Jan. 10, 2019, entitled "Micro Assembled LED Displays and Lighting Elements," which is a continuation of U.S. patent application Ser. No. 14/743,788, filed on Jun. 18, 2015, entitled "Micro Assembled LED Displays and Lighting Elements," which claims priority to and the benefit of U.S. Provisional Patent Application No. 62/014,077, filed Jun. 18, 2014, titled "Micro Assembled LED Displays and Lighting Elements," U.S. Provisional Patent Application No. 62/026,695, filed Jul. 20, 2014, titled "Micro Assembled LED Displays and Lighting Elements," U.S. Provisional Patent Application No. 62/029,533, filed Jul. 27, 2014, titled "Micro Assembled LED Displays and Lighting Elements," U.S. Provisional Patent Application No. 62/055,485, filed Sep. 25, 2014, titled "Interconnection Architectures Advantageous for Micro-LED Displays Assembled via Micro Transfer Printing," U.S. Provisional Patent Application No. 62/056,419, filed Sep. 26, 2014, titled "Interconnection Architectures Advantageous for Micro-LED Displays Assembled via Micro Transfer Printing," U.S. Provisional Patent Application No. 62/131,230, filed Mar. 10, 2015, titled "Passive Matrix Display with Bottom Emitting Inorganic Micro Scale Light Emitting Diodes," U.S. Provisional Patent Application No. 62/148,603, filed Apr. 16, 2015 and entitled "Micro Assembled Micro LED Displays and Lighting Elements," and U.S. Provisional Patent Application No. 62/169,531, filed Jun. 1, 2015 and entitled "Micro Assembled Micro LED Displays and Lighting Elements," the contents of each of which are incorporated by reference herein in their entireties.

FIELD OF INVENTION

Described herein are micro-assembled inorganic light-emitting diode (i.e., micro-LED) displays and lighting elements featuring arrays of micro-LEDs that are too small, numerous, or fragile to be assembled by conventional means as well as micro-assembled jumpers that may be used to, among other things, repair micro-LED array devices.

BACKGROUND

Flat-panel displays are typically constructed with an array of light emitters distributed over a flat substrate surface. With the exception of plasma televisions, emissive flat-panel displays often rely on either (i) a backlight with pixel light control provided by liquid crystals and color filters (e.g., liquid crystal displays), (ii) organic colored light emitters (e.g., organic light-emitting diode displays), or (iii) organic white-light emitters with color filters (e.g., white organic light-emitting diode displays). Importantly, all three of these flat-panel display technologies are area emitters, that is, the entire area of each pixel is filled with the light emitter or light controller. Most of these displays are active-matrix displays that rely on local circuits formed on the substrate to control the pixel. These circuits (a single transistor for liquid crystal displays and two or more transistors for organic light-emitting diode displays) require significant area on the substrate, reducing the area available for light emission. Organic light-emitting diode displays typically have a 60% fill factor, also referred to as an active light-emitting area or aperture ratio, and liquid crystal displays can have an even larger fill factor depending on the display size and resolution.

Inorganic light-emitting diodes (LEDs) are typically manufactured using a semiconductor process requiring the use of various chemicals and materials. These manufacturing methods require the use of a rigid substrate, such as a sapphire substrate or a silicon substrate, that does not melt during the high-temperature manufacturing process. After fabricating the LEDs on the rigid substrate, the wafers are often cut up to form individual LEDs that are used in displays.

Early LED applications in displays include hand-held calculators with numeric LED displays. More recently, LEDs have been integrated as backlights for displays. Integrating LEDs in larger displays, such as display panels, involves complex wiring to each individual LED in the display panel. The use of LEDs in displays, such as RGB LED displays, continues to present numerous challenges, including increased complexity, limited display format, increased manufacturing costs, and reduced manufacturing yields. For example, a display with a resolution of 1280 by 720 includes 921,600 pixels. For a RGB LED display, each pixel must typically include three LEDs (a red, a green, and a blue LED) in each pixel. Thus, the display in this example must use 2,764,800 LEDs. In some cases, all of these LEDs must be arranged in a display that measures a few inches on the diagonal. Not only must these LEDs be small, but the LEDs must be arranged in an array with the appropriate wiring and driving circuitry. Moreover, the materials used to create each color of LED vary. Arranging different color LEDs during manufacture as required for a RGB display is extremely difficult. Semiconductor chip- or die-automated assembly equipment typically uses vacuum-operated placement heads, such as vacuum grippers or pick-and-place tools, to pick up and apply devices to a substrate. It is difficult to pick up and place ultra-thin and small devices using this technology.

Further, LEDs are typically formed with terminals on different faces of the micro-LED. These vertical LEDs are challenged in electrically isolating the anode and cathode during the process of interconnection. This necessitates depositing a vertical insulator between the terminals, e.g., in the robotic assembly of the LED display. For example, if one terminal is on the bottom and one terminal is on the top, the terminals occupy the same space in the x-y plane and a robust insulator is required. The panel-level formation of vertical electrical insulation between the two terminals of the LEDs adds additional steps and layers to the display, adding increased complexity in the display application.

For these reasons, among others, it is difficult and expensive to provide high-resolution RGB LED displays for consumers. Thus, there is a need for systems and methods of manufacturing displays using LEDs that provides low-cost manufacturing, improved yield, and improved reliability for the systems.

SUMMARY

Described herein are micro-assembled inorganic light-emitting diode (e.g., micro-LED) displays and lighting elements featuring arrays of micro-LEDs that are too small, numerous, or fragile to be assembled by conventional means (e.g., micro-LEDs with a width, length, height and/or diameter of 0.5 μm to 50 μm; e.g., a width of 1-50 μm, a length of 5-500 μm and a height of 0.5-50 μm). Rather, these displays are assembled using micro-transfer printing technology. The micro-LEDs can be prepared on a native substrate using high-temperature manufacturing techniques and printed to a non-native display substrate (e.g., polymer, plastic, resin, polyimide, polyethylene naphthalate, polyethylene terephthalate, metal, metal foil, glass, and sapphire, transparent materials, or flexible materials separate and distinct from the native substrate on which the micro-LED are originally made), thereby obviating the manufacture of the micro-LEDs on the display substrate which, among other things, cannot withstand the temperatures necessary to construct the semiconductor elements.

Micro-transfer printed micro-LEDs are bright (e.g., intensities from 300 W/cm$^2$ to 700 W/cm$^2$) and enable low power consumption. The displays can utilize a transparent (e.g., plastic, sapphire, or glass) substrate, and can be made lightweight or flexible, or both. Because the micro-LEDs take up a small proportion of the display area, and because the micro-LED wiring can be fine or transparent, the display itself can be transparent or semi-transparent. The displays can emit light from the front side, the back side, or both sides. In some embodiments, the display has an adhesive layer on one side, producing a decal-like display.

The sparsely distributed micro-LEDs allow for new functions including micro-sensors, power harvesting devices, gesture sensors (both contact and non-contact), image capture devices, and the like. The displays can also include micro-transfer printed micro integrated circuits, which provide CMOS performance and in some embodiments, embedded memory (e.g., non-volatile memory).

The active light-emitting area of an LED pixel is small and takes up minimal pixel area relative to conventional displays in which the semiconductor material occupies the entire display panel or a substantial portion thereof. For example, semiconductor material in the disclosed displays is only needed in locations of active elements, e.g., in certain embodiments, covering no greater than 40%, 30%, 20%, 10%, 5%, 3%, 1%, 0.5%, or 0.1% of the viewing area of the display. Thus, it is possible to manufacture displays with low fill factors (e.g., no greater than 40%, 30%, 20%, 10%, 5%, 3%, 1%, 0.5%, or 0.1%) without compromising display quality, due in part to the brightness of micro-LEDs, the efficiency of crystalline semiconductor substrates, and the ability to assemble the micro-LEDs in arrays using the manufacturing techniques described herein.

For example, in some embodiments, driving circuits are located in one or more pixels (e.g., on the same layer as the micro-LEDs). For example, the drive circuits may use only a small portion of a pixel (e.g., an area, for example, of 10 to 60 μm by 5 to 50 μm). The circuits required to drive micro-LEDS can consume, for example, less than 10%, 5%, 1%, 0.5%, or 0.1% of a pixel area, thereby allowing space to be available for other uses and/or improved transparency. For example, more complex circuits or multiple emitters can be placed at each pixel location without a loss in light emission or efficiency. In contrast, if multiple emitters and/or other active elements are included at each pixel location using other flat-panel display technologies, the area available for each pixel will be reduced, thereby resulting in reduced light output or lifetime. Thus, the disclosed micro-LED displays, including, for example, displays utilizing micro-LEDs on a display substrate, allow for more complexity, additional light emitters, or additional functionality to be placed in each pixel without significantly impacting (e.g., without any impact) display quality.

In certain embodiments, a yield of 99.99% or greater is achieved by micro-transfer printing micro-LEDs to a display substrate. Locating multiple inorganic micro-LEDs at each pixel site enables several possible technical advantages. Further, the display yield can be increased by locating redundant inorganic micro-LEDs at each light emitter or pixel site. For example, display yield is improved, in some embodiments, by using two or more identical light emitters at each pixel site because, for example, the display appears to function properly even if one light emitter at each pixel site, for example, is faulty. Redundant micro-LEDs, in certain embodiments, are electrically connected to the display upon a determination (e.g., during manufacturing or prior to distribution of the display) that a primary micro-LED is malfunctioning.

Further, additional emitters of different colors, in some embodiments, are provided within a pixel at no significant cost in substrate area or pixel performance. Additional colors can broaden the color gamut, for example, by adding yellow or cyan to the conventional red, green, and blue emitters. In some embodiments, 3D displays are provided using the disclosed technology. For example, a display, in some embodiments, utilizes two slightly different red, green, and blue emitters, thereby providing a 3-D display without decreasing the display frame rate. More complex control schemes are possible, such as, for example, update-on-demand. Furthermore, in some embodiments, local light sensors can be used to locally (or globally) calibrate the micro-LEDs (e.g., in real time). In certain embodiments, other micro devices, in addition to micro-LEDs, can be placed within each pixel. For example, micro sensing and micro integrated circuits (e.g., micro display drivers) can be placed within a pixel. An antenna, in some embodiments, is located within each pixel. The antenna can be used to stream power or data into the display using wireless signals/communications.

In certain embodiments, the disclosed technology includes advantageous interconnection architectures for micro-LED displays, for example, displays assembled via micro-transfer printing.

Typically, LEDs are formed with terminals on different faces of the micro-LED. Vertical LEDs are challenged in electrically isolating the anode and cathode during the process of interconnection. This necessitates depositing a vertical insulator between the terminals, e.g., in the robotic assembly of the LED display. For example, if one terminal is on the bottom and one terminal is on the top, the terminals occupy the same space in the x-y plane, and a robust insulator is required.

Additionally, horizontal separation of the contact pads allows the connections to the terminals of each micro-LED to be formed on a single level, thereby reducing the number of levels in the display and improving placement accuracy. In certain embodiments, micro-LEDs are assembled (e.g., via micro-transfer printing) onto the insulator and holes are created in the insulator to access column lines below the insulator. Thus, this architecture reduces the number of levels required to form the display.

Moreover, horizontal separation of contact pads on a micro-LED offers benefits not available from vertical LED structures. For example, displays that use vertical LED structures require the panel-level formation of vertical electrical insulation between the two terminals (contact pads) of the LEDs. By contrast, the disclosed technology avoids this problem, in certain embodiments, by placing the terminals on the same face of the micro-LED. Horizontal separation of the LED contact pads facilitates electrical isolation by dint of the horizontal separation of conductors, thereby avoiding a vertical electrical insulation requirement.

The disclosed technology, in certain embodiments, provides for an elongated micro-LED (e.g., a rectangular LED with a large aspect ratio) with horizontally separated contact pads. This configuration reduces the placement accuracy of display panel conductors required to assemble the micro-LEDs to the display panel. Moreover, fine lithography in the LED construction process can be used to minimize the separation distance between the terminals and other elements in the LED structure (e.g., a separation distance of distance of 100 nm to 200 microns), thus increasing the potential size of the micro-LED terminals. Reducing the lateral separation between the terminals and the LED structure elements, increasing the size of the terminals (within the confines of the dimensions of the LED), and horizontally separating the terminals increases the manufacturing tolerance for registration and lithography errors between the assembled micro-LEDs and the relatively coarse conductive lines used to interconnect the assembled micro-LEDs on the display substrate.

Furthermore, stacked transparent (or semi-transparent) displays are described herein, which allow for tunable brightness, defect compensation, increased definition, and/or 2.5-D or 3-D viewing.

Also described herein are displays formed of multiple integrated displays occupying the same viewing area as independent driver chips, displays with supplementary RGB inorganic micro-LEDs, multi-mode displays with a reflective display element and micro-LED emitter in the same pixel, displays having pixels with yellow micro-LEDs (and/or other non-traditional RGB colors, such as cyan) for more visually perfect devices, and micro-assembled micro-LED displays with, for example, up to 9 micro-LEDs per pixel. The disclosed technology also facilitates photoluminescent or functional testing of micro-assembled micro-LEDs.

The disclosed technology, in certain embodiments, utilizes micro-transfer printing techniques to form imaging devices such as micro-LED display devices. For example, in certain embodiments, electronically active components are transferred from a native substrate (e.g., inorganic semiconductor materials, single crystalline silicon wafers, silicon on insulator wafers, polycrystalline silicon wafers and GaAs wafers, Si (1 1 1), GaN, Sapphire, InP, InAlP, InGaAs, AlGaAs, GaSb, GaAlSb, AlSb, InSb, InGaAlSbAs, InAlSb, and InGaP) to a display substrate (e.g., a non-native substrate such as glass, plastic, or metal used to, for example, form an array of the active components on the non-native substrate). The transfer is, in some embodiments, performed using an elastomer stamp and/or electrostatic stamp. The release of the active components is controlled and predictable, thereby enabling production of the micro-LED displays described herein using micro-transfer printing techniques.

For example, micro-structured stamps, such as an elastomer stamp or electrostatic stamp (or other transfer device), can be used to pick up micro devices (e.g., micro-LEDs, sensors, or integrated circuits), transport the micro devices to a destination display substrate, and print the micro devices onto the display substrate. Surface adhesion forces can be used to control the selection and printing of these devices onto the display substrate. This process can be performed in massively in parallel, transferring hundreds to thousands of discrete structures in a single pick-up-and-print operation.

In one aspect, the invention is directed to an inorganic light-emitting diode display, the display comprising: a plurality of inorganic light-emitting diodes assembled in an array on a display substrate non-native to the plurality of light-emitting diodes, wherein each light-emitting diode of the array comprises a first metal terminal on a first side of the corresponding light-emitting diode horizontally separated from a second metal terminal on the first side of the same light-emitting diode by a horizontal distance, wherein the horizontal distance is from 100 nm to 20 microns.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each of the plurality of light emitters has a width from 2 to 5 μm, 5 to 10 μm, 10 to 20 μm, or 20 to 50 μm. In certain embodiments, each of the plurality of light emitters has a length from 2 to 5 μm, 5 to 10 μm, 10 to 20 μm, or 20 to 50 μm. In certain embodiments, each of the plurality of light emitters has with a height from 2 to 5 μm, 4 to 10 μm, 10 to 20 μm, or 20 to 50 μm.

In certain embodiments, a resolution of the display is 120×90, 1440×1080, 1920×1080, 1280×720, 3840×2160, 7680×4320, or 15360×8640.

In certain embodiments, each light-emitting diode comprises: a conduction layer; and an inorganic light-emitting layer disposed on a portion of the conduction layer, the conduction layer comprising a cantilever extension extending beyond an edge of the inorganic light-emitting layer, wherein the first metal terminal is disposed on a portion of the inorganic light-emitting layer and the second metal terminal is disposed on the cantilever extension of the conduction layer, wherein a current supplied between the first metal terminal and the second metal terminal causes the inorganic light-emitting layer to emit light.

In certain embodiments, the lateral conduction layer comprises at least one member selected from the group consisting of a metal mirror, dielectric mirror, high refractive index semiconductor, and semiconductor substantially transparent to the light emitted from the light-emitting diode, thereby forming an upward emitting display.

In certain embodiments, the lateral conduction layer comprises at least one member selected from the group consisting of a semiconductor substantially transparent to the light emitted from the LED, transparent conductive oxide, and thin metal mesh.

In certain embodiments, the first and second metal terminals are transparent. In certain embodiments, the first and second metal terminals comprise at least one member selected from the group consisting of: ITO, ZnO, carbon nanotube films, aluminum, silver, gold, nickel, platinum, titanium, and fine metal meshes.

In certain embodiments, the display is a downward emitting micro-LED display such that a majority of light emitted by the plurality of light-emitting diodes is emitted through the display substrate.

In certain embodiments, the display comprises a plurality of optical reflection structures, each optical reflection structure located on a same side of a corresponding light-emitting diode of the plurality of light-emitting diodes as the first metal terminal.

In certain embodiments, the first and second metal terminals are at least partially reflective, thereby allowing light emitted from a respective light-emitting diode to at least partially reflect off the first and second metal terminals and through a second face of each light-emitting diode, opposite the first face.

In certain embodiments, the materials located directly below at least a portion of each light-emitting diode are at least partially transparent.

In certain embodiments, the display is an upward emitting micro-LED display such that a majority of light emitted by the plurality of light-emitting diodes is emitted in a direction away from the display substrate.

In certain embodiments, the display comprises a plurality of optical reflection structures, each optical reflection structure located underneath a corresponding light-emitting diode of the plurality of light-emitting diodes on an opposite side of said light-emitting diode from the first metal terminal.

In certain embodiments, the first and second metal terminals are at least partially transparent, thereby allowing light emitted from a respective light-emitting diode to at least partially pass through the first and second metal terminals.

In certain embodiments, the display comprises a plurality of first interconnections each electrically connected to the first metal terminal of a corresponding light-emitting diode; and a plurality of second interconnections each electrically connected to the second metal terminal of a corresponding light-emitting diode, wherein the plurality of first interconnections and the plurality of second interconnections are on the first face.

In certain embodiments, the plurality of first interconnection features and the plurality of second interconnection features are in a single lithography level.

In certain embodiments, each of the plurality of first interconnections is electrically coupled to one column electrode of a plurality of column electrodes through a via of a plurality of vias in the insulator, each via associated with a light-emitting diode of the plurality of light-emitting diodes.

In certain embodiments, the plurality of column electrodes, the plurality of first interconnections, and the plurality of second interconnections are formed by lithography with a coarser resolution than the lithography used to form the first and second metal terminals.

In certain embodiments, each of the light-emitting diodes has a length greater or equal to two times its width. In certain embodiments, for each light-emitting diode of the plurality of light-emitting diodes, the corresponding first and second metal terminals cover at least half, two-thirds, or three-quarters of the lateral footprint of the corresponding light-emitting diode. In certain embodiments, the plurality of light-emitting diodes are assembled via micro-transfer printing.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light. In certain embodiments, the display substrate has a contiguous display substrate area that includes the plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, the combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In certain embodiments, for each inorganic light-emitting diode of the plurality of inorganic light-emitting diodes, the horizontal distance is of from 500 nm to 1 μm, 1 μm to 5 μm, 5 μm to 10 μm, or 10 μm to 20 μm. In certain embodiments, for each inorganic light-emitting diode of the plurality of inorganic light-emitting diodes, a surface of the first metal terminal and a surface of a second metal terminal share a plane.

In certain embodiments, the display comprises: a plurality of micro integrated circuits on the display substrate, each electrically connected with a set of the plurality of light-emitting diodes.

In certain embodiments, each integrated circuit is used to control LEDs that emit a certain color of light.

In certain embodiments, each set of the plurality of light-emitting diodes driven by a respective integrated circuit forms an independent sub-display.

In certain embodiments, the display comprises: a plurality of second inorganic light-emitting diodes assembled in a second array on a second display substrate non-native to the plurality of second light-emitting diodes, wherein each second light-emitting diode of the plurality of second light-emitting diodes comprises a first metal terminal on a first side of the corresponding light-emitting diode horizontally separated from a second metal terminal on the first side of the same light-emitting diode by a horizontal distance, wherein the horizontal distance is from 100 nm to 20 microns, wherein the first display substrate and the second substrate are stacked.

In certain embodiments, the display comprises: a plurality of second inorganic light-emitting diodes assembled in a second array on a side of the display substrate opposite the plurality of inorganic light-emitting diodes, wherein each second light-emitting diode of the plurality of second light-emitting diodes comprises a first metal terminal on a first side of the corresponding light-emitting diode horizontally separated from a second metal terminal on the first side of the same light-emitting diode by a horizontal distance, wherein the horizontal distance is from 100 nm to 20 microns, wherein the first display substrate and the second substrate are stacked.

In certain embodiments, the array of the plurality of inorganic light-emitting diodes has a different resolution than the second array of the plurality of second inorganic light-emitting diodes.

In certain embodiments, each of the plurality of inorganic light-emitting diodes has a first size, each of the plurality of second inorganic light-emitting diodes has a second size, and the first size is different than the second size.

In another aspect, the invention is directed to a method of forming a light-emitting diode display, the method comprising: forming a plurality of column lines on a substrate; depositing an insulator on the column lines; micro-transfer printing a plurality of light-emitting diodes onto the insulator, wherein each micro light-emitting diode comprises a first and second metal terminal on a first face of the light-emitting diode, where the substrate is non-native to the plurality of light-emitting diodes; forming a plurality of holes in the insulator, thereby exposing portions of each of the plurality of column lines; and depositing a plurality of conductive interconnections on the first face, the plurality of conductive interconnections comprising a plurality of row electrodes and a plurality of column interconnections, wherein each of the plurality of column interconnections electrically connect a column line to the first metal terminal of a corresponding light-emitting diode.

In certain embodiments, for each light-emitting diode of the plurality of light-emitting diodes, the first metal terminal is horizontally separated by a horizontal distance from 100 nm to 5 microns from the second metal terminal on the first face of the same light-emitting diode.

In certain embodiments, the first and second metal terminals are transparent. In certain embodiments, the first and second metal terminals are at least partially transparent, thereby allowing light emitted from a respective light-emitting diode to at least partially pass through the first and second metal terminals.

In certain embodiments, the display is a downward emitting micro-LED display such that a majority of light emitted by the plurality of light-emitting diodes is emitted through the display substrate.

In certain embodiments, the method comprises depositing a plurality of optical reflection structures, each optical reflection structure located above a light-emitting diode of the plurality of light-emitting diodes on an opposite side of said light-emitting diode from the display substrate.

In certain embodiments, the materials located directly below at least a portion of each light-emitting diode are at least partially transparent.

In certain embodiments, the first and second metal terminals are at least partially reflective, thereby allowing light emitted from a respective light-emitting diode to at least partially reflect off the first and second metal terminals and through a second face of each light-emitting diode, opposite the first face. In certain embodiments, the first and second metal terminals comprise at least one member selected from the group consisting of: ITO, ZnO, carbon nanotube films, aluminum, silver, gold, nickel, platinum, titanium, and fine metal meshes.

In certain embodiments, the display is an upward emitting micro-LED display such that a majority of light emitted by the plurality of light-emitting diodes is emitted in a direction away from the display substrate.

In certain embodiments, the method comprises: prior to micro-transfer printing the plurality of light-emitting diodes, depositing a plurality of optical reflection structures, each optical reflection structure located underneath a corresponding light-emitting diode of the plurality of light-emitting diodes.

In certain embodiments, each light-emitting diode comprises: a conduction layer; and an inorganic light-emitting layer disposed on a portion of the conduction layer, the conduction layer comprising a cantilever extension extending beyond an edge of the inorganic light-emitting layer, wherein the first metal terminal is disposed on a portion of the inorganic light-emitting layer and the second metal terminal is disposed on the cantilever extension of the conduction layer, wherein a current supplied between the first metal terminal and the second metal terminal causes the inorganic light-emitting layer to emit light.

In certain embodiments, the lateral conduction layer comprises at least one member selected from the group consisting of a metal mirror, dielectric mirror, high refractive index semiconductor, and semiconductor substantially transparent to the light emitted from the light-emitting diode, thereby forming an upward emitting display.

In certain embodiments, the lateral conduction layer comprises at least one member selected from the group consisting of a semiconductor substantially transparent to the light emitted from the LED, transparent conductive oxide, and thin metal mesh.

In certain embodiments, micro-transfer printing the plurality of light-emitting diodes comprises: providing a transfer device with a portion of the plurality of light-emitting diodes removably attached thereto, wherein said transfer device comprises a three-dimensional feature in at least partial contact with the portion of the plurality of light-emitting diodes; contacting the portion of the plurality of light-emitting diodes removably attached to said transfer device with the receiving surface of the substrate; and following said contacting of the portion of the plurality of light-emitting diodes with said receiving surface, separating said transfer device from the portion of the plurality of light-emitting diodes, wherein the portion of the plurality of light-emitting diodes is transferred onto said receiving surface.

In certain embodiments, the method comprises: a plurality of column electrodes, each electrically connected to a respective one of the plurality of first interconnections; and an insulator between the plurality of column electrodes and the plurality of light-emitting diodes, wherein the plurality of second interconnections comprise a plurality of row electrodes electrically connected to the second metal terminal of at least one of the plurality of light-emitting diodes.

In certain embodiments, each of the plurality of first interconnections is electrically coupled to one of the column electrodes of the plurality of column electrodes through a via of a plurality of vias in the insulator.

In certain embodiments, the plurality of column electrodes, the plurality of first interconnections, and the plurality of second interconnections are formed by lithography with a coarser resolution than the lithography used to form the first and second metal terminals.

In certain embodiments, the plurality of column electrodes, the plurality of first interconnections, and the plurality of second interconnections have a minimum line and space dimensional range of 2 microns to 2 millimeters.

In certain embodiments, each of the light-emitting diodes has a length greater or equal to two times its width.

In certain embodiments, the plurality of first interconnection features and the plurality of second interconnection features are in a single lithography level.

In certain embodiments, for each light-emitting diode of the plurality of light-emitting diodes, the corresponding first and second metal terminals cover at least half, two-thirds, or three-quarters the lateral footprint of the corresponding light-emitting diode.

In certain embodiments, the first face of each of the plurality of light-emitting diodes is on a side of each diode away from the display substrate.

In certain embodiments, the non-native substrate is a member selected from the group consisting of polymer, plastic, resin, polyimide, PEN, PET, metal, metal foil, glass, a semiconductor, and sapphire.

In certain embodiments, each of the plurality of light-emitting diodes has a width from 2 to 5 µm, 5 to 10 µm, 10 to 20 µm, or 20 to 50 µm. In certain embodiments, each of the plurality of light-emitting diodes has a length from 2 to 5 µm, 5 to 10 µm, 10 to 20 µm, or 20 to 50 µm. In certain embodiments, each of the plurality of light-emitting diodes has with a height from 2 to 5 µm, 4 to 10 µm, 10 to 20 µm, or 20 to 50 µm.

In certain embodiments, the display substrate has a transparency greater than or equal to 50%, 80%, 90%, or 95% for visible light.

In certain embodiments, the display substrate has a contiguous display substrate area that includes plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the plurality of conductive interconnections are deposited in a single step.

In certain embodiments, the method comprises: micro-transfer printing a plurality of micro integrated circuits on the display substrate, each electrically connected with a set of the plurality of light-emitting diodes. In certain embodiments, each integrated circuit is used to control LEDs that emit a certain color of light.

In certain embodiments, the method comprises: micro-transfer printing a plurality of second inorganic light-emitting diodes in a second array on a second display substrate non-native to the plurality of second light-emitting diodes, wherein each second light-emitting diode of the plurality of second light-emitting diodes comprises a first metal terminal on a first side of the corresponding light-emitting diode horizontally separated from a second metal terminal on the first side of the same light-emitting diode by a horizontal distance, wherein the horizontal distance is from 100 nm to 20 microns, wherein the first display substrate and the second substrate are stacked.

In certain embodiments, the method comprises: micro-transfer printing a plurality of second inorganic light-emitting diodes in a second array on a side of the display substrate opposite the plurality of inorganic light-emitting diodes, wherein each second light-emitting diode of the plurality of second light-emitting diode comprises a first metal terminal on a first side of the corresponding light-emitting diode horizontally separated from a second metal terminal on the first side of the same light-emitting diode by a horizontal distance, wherein the horizontal distance is from 100 nm to 20 microns, wherein the first display substrate and the second substrate are stacked.

In certain embodiments, the array of the plurality of inorganic light-emitting diodes has a different resolution than the second array of the plurality of second inorganic light-emitting diodes.

In certain embodiments, each of the plurality of inorganic light-emitting diodes has a first size, each of the plurality of second inorganic light-emitting diodes has a second size, and the first size is different than the second size.

In another aspect, the invention is directed to a display comprising: a display substrate; a first patterned metal layer on a surface of the display substrate; a dielectric layer on the display substrate and the first patterned metal layer; a polymer layer on the dielectric layer; a plurality of light emitters on a surface of the polymer layer, each light emitter of the plurality of light emitters having an anode and a cathode on a same side of the respective light emitter, wherein the display substrate is non-native to the plurality of light emitters; a plurality of vias formed through the polymer and dielectric layer, each via associated with a corresponding light emitter of the plurality of light emitters; and a second patterned metal layer, the second patterned metal layer comprising a plurality of anode interconnections and a plurality of cathode interconnections in a single layer, each anode interconnection electrically connecting the anode of a corresponding light emitter of the plurality of light emitters to the first patterned metal layer through a corresponding via of the plurality of vias and each cathode interconnections electrically contracting the cathode of a corresponding light emitter of the plurality of light emitters.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the plurality of light emitters comprise a plurality of inorganic light emitting diodes.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each of the plurality of light emitters has a width from 2 to 5 µm, 5 to 10 µm, 10 to 20 µm, or 20 to 50 µm. In certain embodiments, each of the plurality of light emitters has a length from 2 to 5 µm, 5 to 10 µm, 10 to 20 µm, or 20 to 50 µm. In certain embodiments, each of the plurality of light emitters has with a height from 2 to 5 µm, 4 to 10 µm, 10 to 20 µm, or 20 to 50 µm.

In certain embodiments, the display substrate has a transparency greater than or equal to 50%, 80%, 90%, or 95% for visible light.

In certain embodiments, the display substrate has a contiguous display substrate area, the plurality of light emitters each have a light-emissive area, and the combined light-emissive areas of the plurality of light emitters is less than or equal to one-quarter of the contiguous display substrate area.

In certain embodiments, the combined light-emissive areas of the plurality of light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the display substrate has a transparency greater than or equal to 50%, 80%, 90%, or 95% for visible light.

In certain embodiments, the display substrate is a member selected from the group consisting of polymer, plastic, resin, polyimide, PEN, PET, metal, metal foil, glass, a semiconductor, and sapphire.

In certain embodiments, the first patterned metal layer comprises a metal stack. In certain embodiments, the metal stack comprises Aluminum and Titanium. In certain embodiments, the Titanium is on the Aluminum.

In certain embodiments, the polymer layer is a photosensitive negative-acting semiconductor-grade epoxy.

In certain embodiments, the plurality of light emitters having been micro-transfer printed on the surface of the polymer layer using a print tool.

In certain embodiments, the print tool is a viscoelastic elastomer stamp.

In certain embodiments, the second patterned metal layer comprises a metal stack. In certain embodiments, the metal stack comprises Ti/Al/Ti.

In certain embodiments, the second patterned metal layer comprises a plurality of pads on the display substrate.

In certain embodiments, the plurality of light emitters comprises a plurality of red light emitters that emit red light, a plurality of green light emitters that emit green light, and a plurality of blue light emitters that emit blue light.

In certain embodiments, at least one of the anode and cathode of each light emitter of the plurality of light emitters is formed on a light-emitter dielectric layer.

In certain embodiments, the dielectric layer is silicon nitride.

In certain embodiments, the display substrate is flexible.

In another aspect the invention is directed to a method of forming a display, the method comprising: depositing a first metal layer on a display substrate; patterning the first metal layer to form a first patterned metal layer; depositing a layer of dielectric onto the first patterned metal layer to create an electrically insulating layer; applying an uncured polymer layer; micro-transfer printing a plurality of light emitters from a native substrate onto the polymer, wherein the native substrate is native to at least a portion of the plurality of light emitters and the light emitters each have an anode and a cathode for providing power to the light emitters; exposing the polymer to ultraviolet light to cure the polymer; forming a plurality of vias through the cured polymer and dielectric layer to expose a portion of the first patterned metal layer; depositing a second metal layer, wherein the second metal layer contacts an anode and a cathode of each light emitter of the plurality of light emitters; and patterning the second metal layer to form the second patterned metal layer, wherein the second patterned metal layer comprises a plurality of anode interconnections and a plurality of cathode interconnections, each anode interconnection electrically connecting the anode of a corresponding light emitter of the plurality of light emitters to the first patterned metal layer through a corresponding via of the plurality of vias and each cathode interconnection electrically contacting the cathode of a corresponding light emitter of the plurality of light emitters.

In certain embodiments, the plurality of light emitters comprises a plurality of inorganic light emitting diodes.

In certain embodiments, the method comprises: cutting the display substrate into a plurality of displays.

In certain embodiments, the method comprises: prior to cutting the non-native wafer into the plurality of displays, coating the wafer with a protective photoresist layer; and after cutting the display substrate into the plurality of displays, removing the protective photoresist layer from each display of the plurality of displays after cutting the display substrate into the plurality of displays.

In certain embodiments, the method comprises: providing a passive-matrix driver integrated circuit on receiving pads on a surface of the non-native wafer.

In certain embodiments, the method comprises: burning-in each light emitter of the plurality of light emitters.

In certain embodiments, the anode and cathode of a respective light emitter are horizontally separate by a horizontal distance, wherein the horizontal distance is 100 nm to 100 microns.

In certain embodiments, the polymer is a photosensitive negative-acting semiconductor-grade epoxy.

In certain embodiments, the first metal layer is deposited using metal physical vapor deposition. In certain embodiments, the first metal layer is patterned using photolithography.

In certain embodiments, patterning the first metal layer comprises: prior to depositing the first metal layer, applying a negative-acting photoresist to the first metal layer, selectively exposing the photoresist to light (e.g., using a mask), and developing the photoresist to form a lift-off template; and after depositing the first metal layer, removing the lift-off template, thereby forming the first patterned metal layer.

In certain embodiments, the first metal layer comprises a metal stack of Titanium on Aluminum on Titanium.

In certain embodiments, depositing the first metal layer comprising depositing the first metal layer using e-beam evaporation.

In certain embodiments, patterning the second metal layer comprises: patterning a lift-off mask in a negative acting photoresist; depositing a metal stack; and lifting-off of the photoresist mask to leave behind the second patterned metal layer.

In certain embodiments, the second metal layer comprises a metal stack.

In certain embodiments, the metal stack comprises Ti/Al/Ti.

In certain embodiments, the method comprises removing one or more solvents from the polymer using one or more heat treatments.

In certain embodiments, micro-transfer printing the plurality of light emitters comprises micro-transfer printing the plurality of light emitters using a print tool.

In certain embodiments, the print tool comprises a viscoelastic elastomer stamp.

In certain embodiments, micro-transfer printing the plurality of light emitters comprises using kinetically tunable adhesion between the plurality of light emitters and the viscoelastic elastomer surface.

In certain embodiments, micro-transfer printing the plurality of light emitters comprises: picking up at least a portion of the plurality of light emitters from the native substrate by contacting a viscoelastic elastomer stamp to a first surface of each of the light emitters in the portion of the plurality of light emitters and moving the viscoelastic elastomer stamp away from the native substrate at a first rate leading to an effective increase in the adhesion between the elastomer and the portion of the plurality of light emitters; and printing the portion of the plurality of light emitters to the non-native substrate by contacting a second surface of each of the light emitters picked up by the viscoelastic elastomer stamp to the polymer and moving the viscoelastic elastomer stamp away from the display substrate at a second rate, thereby leaving the light emitters picked up by the viscoelastic elastomer stamp on the polymer, wherein the second rate is less than the first rate.

In certain embodiments, the method comprises laterally shearing the stamp during the micro transfer printing process.

In certain embodiments, the plurality of light emitters comprises a plurality of red light emitters that emit red light, a plurality of green light emitters that emit green light, and a plurality of blue light emitters that emit blue light.

In certain embodiments, a resolution of the display is 120×90, 1440×1080, 1920×1080, 1280×720, 3840×2160, 7680×4320, or 15360×8640.

In certain embodiments, micro-transfer printing the plurality of light emitters from a native substrate onto the polymer comprises performing at least two micro transfer printing operations.

In certain embodiments, micro-transfer printing the plurality of light emitters from a native substrate onto the polymer comprises: micro-transfer printing a plurality of red light emitters that emit red light from a red light emitter native substrate; micro-transfer printing a plurality of green light emitters that emit green light from a green light emitter native substrate; and micro-transfer printing a plurality of blue light emitters that emit blue light from a blue light emitter native substrate, wherein the plurality of light emitters comprises the plurality of red light emitters, the plurality of green light emitters, and the plurality of blue light emitters.

In certain embodiments, the display substrate is flexible.

In another aspect, the invention is directed to an inorganic light-emitting diode comprising: a conduction layer; an inorganic light-emitting layer disposed on a portion of the conduction layer, the conduction layer comprising a cantilever extension extending beyond an edge of the inorganic light-emitting layer; a first metal terminal disposed on a portion of the inorganic light-emitting layer; a second metal terminal disposed on the cantilever extension of the conduction layer, wherein a current supplied between the first metal terminal and the second metal terminal causes the inorganic light-emitting layer to emit light; and a dielectric layer disposed on at least a portion of the inorganic light-emitting layer, wherein the dielectric layer electrically isolates the first metal terminal from the second metal terminal, wherein the first and second metal terminals are on a same side of the inorganic light-emitting diode and are separated by a horizontal distance of from 100 nm to 20 μm.

In certain embodiments, the inorganic light-emitting diode has a width from 0.5 to 2 μm, 2 to 5 μm, 5 to 10 μm, 10 to 20 μm, or 20 to 50 μm. In certain embodiments, the inorganic light-emitting diode has a length from 0.5 to 2 μm, 2 to 5 μm, 5 to 10 μm, 10 to 20 μm, or 20 to 50 μm. In certain embodiments, the inorganic light-emitting diode has with a height from 0.5 to 2 μm, 2 to 5 μm, 5 to 10 μm, 10 to 20 μm, or 20 to 50 μm. In certain embodiments, the horizontal distance is of from 500 nm to 1 μm, 1 μm to 5 μm, 5 μm to 10 μm, or 10 μm to 20 μm.

In certain embodiments, a surface of the first metal terminal and a surface of a second metal terminal share a plane.

In certain embodiments, for each light emitting diode of the plurality of light emitting diodes, the corresponding first and second metal terminals cover at least half, two-thirds, or three-quarters of the lateral footprint of the corresponding light emitting diode.

In certain embodiments, the lateral conduction layer comprises at least one member selected from the group consisting of a metal mirror, dielectric mirror, high refractive index semiconductor, and semiconductor substantially transparent to the light emitted from the light emitting diode, thereby forming an upward emitting display. In certain embodiments, the lateral conduction layer comprises at least one member selected from the group consisting of a semiconductor substantially transparent to the light emitted from the LED, transparent conductive oxide, and thin metal mesh.

In certain embodiments, the first and second metal terminals are transparent. In certain embodiments, the first and second metal terminals comprise at least one member selected from the group consisting of: ITO, ZnO, carbon nanotube films, aluminum, silver, gold, nickel, platinum, titanium, and fine metal meshes.

In another aspect, the invention is directed to an inorganic light-emitting diode display comprising a plurality of the inorganic light-emitting diodes, wherein the plurality of inorganic light-emitting diodes are disposed on a substrate.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, a resolution of the display is 120×90, 1440×1080, 1920×1080, 1280×720, 3840×2160, 7680×4320, or 15360×8640.

In certain embodiments, the method further comprises a plurality of optical reflection structures, each optical reflection structure located on a same side of a corresponding light emitting diode of the plurality of light emitting diodes as the first terminal.

In certain embodiments, the method further comprises a plurality of optical reflection structures, each optical reflection structure located underneath a corresponding light emitting diode of the plurality of light emitting diodes on an opposite side of said light emitting diode from the first metal terminal.

In certain embodiments, the method further comprises: a plurality of first interconnections each electrically connected to the first metal terminal of a corresponding light emitting diode; and a plurality of second interconnections each electrically connected to the second metal terminal of a corresponding light emitting diode, wherein the plurality of first interconnections and the plurality of second interconnections are on the first face.

In certain embodiments, the plurality of first interconnection features and the plurality of second interconnection features are in a single lithography level.

In certain embodiments, each of the plurality of first interconnections is electrically coupled to one column electrode of a plurality of column electrodes through a via of a plurality of vias in the insulator, each via associated with a light emitting diode of the plurality of light emitting diodes.

In certain embodiments, the plurality of column electrodes, the plurality of first interconnections, and the plurality of second interconnections are formed by lithography with a coarser resolution than the lithography used to form the first and second metal terminals.

In certain embodiments, each of the light emitting diodes has a length greater or equal to two times its width.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light.

In certain embodiments, the display substrate has a contiguous display substrate area that includes the plurality of light emitting diodes, each light emitting diode of the plurality of light emitting diodes has a light-emissive area, and the combined light-emissive areas of the plurality of light emitting diodes is less than or equal to one-quarter of the contiguous display substrate area.

In certain embodiments, the combined light-emissive areas of the plurality of light emitting diodes is less than or equal to one eighth, one tenth, one twentieth, one fiftieth, one hundredth, one five-hundredth, one thousandth, one two-thousandth, or one ten-thousandth of the contiguous display substrate area.

In another aspect, the invention is directed to an inorganic light emitting diode (LED) display, the display comprising: a display substrate; a plurality of pixels, each pixel comprising a set of primary inorganic LEDs connected to a display circuit and a set of redundant inorganic LEDs unconnected to the display circuit, wherein each of the redundant inorganic LEDs can be electrically connected to the display circuit to replace a corresponding defective LED that is one of the primary inorganic LEDs, wherein each primary and redundant inorganic LED is formed in or on a native substrate distinct and separate from the display substrate; and the native substrates are on the display substrate.

In certain embodiments, the display comprises a redundant LED electrically connected to the display circuit.

In certain embodiments, the display comprises a conductive jumper electrically connecting a redundant LED to the display circuit.

In another aspect, the invention is directed to an inorganic light emitting diode (LED) display, the display comprising: a display substrate; a plurality of pixels, each pixel comprising a set of primary inorganic LEDs and a set of redundant inorganic LEDs, wherein: each primary and redundant inorganic LED is formed in or on a native substrate distinct and separate from the display substrate; the native substrates are on the display substrate; and each inorganic LED of the redundant set is connected in series with a resistor to form a LED-resistor pair, and each LED-resistor pair is wired in parallel with a inorganic LED of the primary set.

In another aspect, the invention is directed to an inorganic light emitting diode (LED) display, the display comprising: a display substrate; a plurality of pixels, each pixel comprising a set of primary inorganic LEDs and a set of redundant inorganic LEDs, wherein: each primary and redundant inorganic LED is formed in or on a native substrate distinct and separate from the display substrate; the native substrates are on the display substrate; and each inorganic LED of the redundant set is connected in series with a diode to form an LED-diode pair, and each LED-diode pair is wired in parallel with an inorganic LED of the primary set.

In certain embodiments, the set of primary inorganic LEDs comprises a plurality of red inorganic LED that emits red light, a plurality of green inorganic LED that emits green light, and a plurality of blue inorganic LED that emits blue light, and the set of redundant inorganic LEDs comprises a plurality of redundant red inorganic LED that emits red light, a plurality of redundant green inorganic LED that emits green light, and a plurality of redundant blue inorganic LED that emits blue light.

In certain embodiments, the set of primary inorganic LEDs comprises a plurality of yellow inorganic LEDs that emit yellow light; and the set of redundant inorganic LEDs comprises a plurality of redundant yellow inorganic LEDs that emit yellow light.

In certain embodiments, the set of primary inorganic LEDs and the set of redundant inorganic LEDs are directly on the display substrate.

In certain embodiments, each pixel comprises an inorganic integrated circuit electrically connected to each inorganic LED in a respective pixel.

In certain embodiments, each pixel comprises a primary micro integrated circuit and a redundant micro integrated circuit.

In certain embodiments, the display substrate is a member selected from the group consisting of polymer, plastic, resin, polyimide, PEN, PET, metal, metal foil, glass, a semiconductor, and sapphire.

In certain embodiments, each inorganic LED has a width from 2 to 5 μm, 5 to 10 μm, 10 to 20 μm, or 20 to 50 μm. In certain embodiments, each inorganic LED has a length from 2 to 5 μm, 5 to 10 μm, 10 to 20 μm, or 20 to 50 μm. In certain embodiments, each inorganic LED has with a height from 2 to 5 μm, 4 to 10 μm, 10 to 20 μm, or 20 to 50 μm.

In certain embodiments, the display substrate has a transparency greater than or equal to 50%, 80%, 90%, or 95% for visible light.

In certain embodiments, the display substrate has a contiguous display substrate area that includes the set of primary inorganic LEDs and the set of redundant inorganic LEDs, each LED has a light-emissive area, and the combined light-emissive areas of LEDs is less than or equal to one-quarter of the contiguous display substrate area.

In certain embodiments, the combined light-emissive areas of the LEDs is less than or equal to one eighth, one tenth, one twentieth, one fiftieth, one hundredth, one five-hundredth, one thousandth, one two-thousandth, or one ten-thousandth of the contiguous display substrate area.

In another aspect, the invention is direct to a method of inorganic assembling a inorganic light emitting diode (LED) display, the method comprising: forming a plurality of printable inorganic LEDs in or on one or more native substrates; transfer printing the plurality of printable inorganic LEDs onto a display substrate separate and distinct from the one or more native substrates to form a plurality of pixels, wherein each pixel comprises a set of primary inorganic LEDs and a set of redundant inorganic LEDs; connecting the primary inorganic LEDs to a display circuit; and testing the display to identify defective primary inorganic LEDs.

In certain embodiments, the set of primary inorganic LEDs comprises a plurality of red inorganic LEDs that emit red light, a plurality of green inorganic LEDs that emit green light, and a plurality of blue inorganic LEDs that emit blue light, and the set of redundant inorganic LEDs comprises a plurality of redundant red inorganic LEDs that emit red light, a plurality of redundant green inorganic LEDs that emit green light, and a plurality of redundant blue inorganic LEDs that emit blue light.

In certain embodiments, the set of primary inorganic LEDs comprises a plurality of yellow inorganic LEDs that emit yellow light; and the set of redundant inorganic LEDs comprises a plurality of redundant yellow inorganic LEDs that emit yellow light.

In certain embodiments, the method comprises: disconnecting the defective primary inorganic LEDs from the display circuit.

In certain embodiments, the method comprises: establishing an electrical connection to a redundant inorganic LED in close proximity to each of the defective primary inorganic LEDs so that each of the redundant inorganic LEDs is connected to the display circuit.

In certain embodiments, establishing an electrical connection to each of the redundant LEDs comprises: directly and physically writing electrical traces.

In certain embodiments, establishing an electrical connection to each of said redundant LEDs comprises: placing a conductive jumper between each of said redundant LEDs and the respective defective LED by micro assembly. In certain embodiments, establishing an electrical connection to each of the redundant LEDs comprises: establishing electrical connection by solder reflow or contact between clean metal surfaces.

In certain embodiments, the method comprises prior to testing the display, connecting each redundant inorganic LED to the display circuit in series with a resistor to form an LED-resistor pair such that each LED-resistor pair is connected in parallel with a primary inorganic LED.

In certain embodiments, the method comprises: prior to testing the display, connecting each redundant inorganic LED to the display circuit in series with a diode to form an LED-diode pair such that each LED-diode pair is connected in parallel with a primary inorganic LED.

In certain embodiments, testing the display comprises: illuminating one or more of the primary inorganic LEDs; and identifying defective primary LEDs.

In certain embodiments, the display substrate is a member selected from the group consisting of polymer, plastic, resin, polyimide, PEN, PET, metal, metal foil, glass, a semiconductor, and sapphire.

In certain embodiments, the plurality of printable inorganic LEDs are micro transfer printed directly onto the display substrate.

In certain embodiments, each inorganic LED has a width from 2 to 5 μm, 5 to 10 μm, 10 to 20 μm, or 20 to 50 μm. In certain embodiments, each inorganic LED has a length from 2 to 5 μm, 5 to 10 μm, 10 to 20 μm, or 20 to 50 μm. In certain embodiments, each inorganic LED has with a height from 2 to 5 μm, 4 to 10 μm, 10 to 20 μm, or 20 to 50 μm.

In certain embodiments, the display substrate has a transparency greater than or equal to 50%, 80%, 90%, or 95% for visible light.

In certain embodiments, the display substrate has a contiguous display substrate area that includes the set of primary inorganic LEDs and the set of redundant inorganic LEDs, each LED has a light-emissive area, and the combined light-emissive areas of LEDs is less than or equal to one-quarter of the contiguous display substrate area.

In certain embodiments, the combined light-emissive areas of the LEDs is less than or equal to one eighth, one tenth, one twentieth, one fiftieth, one hundredth, one five-hundredth, one thousandth, one two-thousandth, or one ten-thousandth of the contiguous display substrate area.

In another aspect, the invention is directed to a micro-LED display, comprising: a display substrate that is at least partially transparent; an array of color-conversion structures on the display substrate, each color-conversion structure comprising a color-conversion material; and an array of micro-LEDS separate from the color-conversion structures, each micro-LED in the array of micro-LEDs on a corresponding one of the color-conversion structure in the array of color-conversion structures.

In certain embodiments, the display substrate comprises an array of recesses in which the color-conversion materials are located.

In certain embodiments, the recesses are filled with the color-conversion materials.

In certain embodiments, the micro-LEDs are located over the color-conversion materials on a side of the color-conversion materials opposite the display substrate so that most or all of the light emitted from the micro-LEDs emits downward through the color-conversion material and the display substrate.

In certain embodiments, the method comprises one or more reflective structures substantially covering a side of the micro-LEDs opposite the display substrate, so that the micro-LEDs reflect emitted light toward the display substrates.

In certain embodiments, the one or more reflective structures comprise array connection metals or micro-LED contacts.

In another aspect, the invention is directed to a micro-LED display, comprising: a display substrate; an array of micro-LEDS on the display substrate; and an array of color-conversion structures separate from the micro-LED structures, each color-conversion structure in the array of color-conversion structures on a corresponding one of the micro-LEDs in the array of micro-LEDs, wherein each color-conversion structure comprises a color-conversion material.

In certain embodiments, the color-conversion materials are on top of or at least partially surrounding the micro-LEDs on a side of the micro-LEDs opposite the display substrate.

In certain embodiments, the color-conversion materials comprise phosphor-bearing gels or resins, phosphor ceramics, or single-crystal phosphors. In certain embodiments, the color-conversion materials are chips of direct band gap semiconductors. In certain embodiments, the color-conversion materials are at least partially surrounding the micro-LEDs.

In certain embodiments, the display comprises supplementary mirror structures on the display substrate.

In certain embodiments, each micro-LED has an LED substrate separate from the display substrate.

In certain embodiments, the micro-LEDS are formed in a native substrate distinct and separate from the display substrate.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each micro-LED has a width from 2 to 5 μm, 5 to 10 μm, 10 to 20 μm, or 20 to 50 μm. In certain embodiments, each micro-LED has a length from 2 to 5 μm, 5 to 10 μm, 10 to 20 μm, or 20 to 50 μm. In certain embodiments, each micro-LED has with a height from 2 to 5 μm, 4 to 10 μm, 10 to 20 μm, or 20 to 50 μm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light.

In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the micro-LEDs is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the array of micro-LEDs comprises a plurality of red micro-LEDs that emit red light, a plurality of green micro-LEDs that emit green light, and a plurality of blue micro-LEDs that emit blue light, and each pixel comprises a red micro-LED of the plurality of red micro-LEDs, a green micro-LED of the plurality of green micro-LEDs, and a blue micro-LED of the plurality of blue micro-LEDs.

In certain embodiments, the micro-LEDs are inorganic micro-LEDs.

In another aspect, the invention is directed to a method of micro assembling a micro-LED light-emitter array, the method comprising: forming a plurality of micro-LEDs on a first substrate; providing a display substrate that is at least partially transparent; providing a plurality of color-conversion structures on the display substrate in an array, each color-conversion structure comprising a color-conversion material; micro assembling the plurality of micro-LEDs onto a display substrate such that each micro-LED of the plurality of micro-LEDs is on a corresponding one of the color-conversion structures of the plurality of color-conversion structures, wherein micro assembling the plurality of micro-LEDs onto the display substrate comprises: contacting a portion of the plurality of micro-LEDs with a first transfer device having a contact surface, thereby temporarily binding the portion of the plurality of micro-LEDs to the contact surface such that the contact surface has the portion of the plurality of micro-LEDs temporarily disposed thereon; contacting the portion of the plurality of micro-LEDs disposed on the contact surface of the first transfer device with a portion of the plurality of color-conversion structures; and separating the contact surface of the first transfer device and the portion of the plurality of micro-LEDs, wherein portion of the plurality of micro-LEDs are transferred onto the portion of color-conversion structures, thereby assembling the portion of the plurality of micro-LEDs on the portion of the color-conversion structures.

In certain embodiments, providing a plurality of color-conversion structures located over the display substrate in an array comprises, prior to micro assembling the plurality of micro-LEDs onto a display substrate: forming a plurality of recesses in the display substrate; and filling the plurality of recesses with color-conversion materials over which the plurality of printable LEDs are printed.

In certain embodiments, providing a plurality of color-conversion structures located over the display substrate in an array comprises, prior to micro assembling the plurality of micro-LEDs onto a display substrate: micro assembling chips of color-conversion material onto the display substrate.

In certain embodiments, the micro-LEDs are located over the color-conversion materials on a side of the color-conversion materials opposite the display substrate so that most or all of the light emitted from the micro-LEDs emits downward through the color-conversion material and the display substrate.

In certain embodiments, the method comprises one or more reflective structures substantially covering a side of the micro-LEDs opposite the display substrate, so that the micro-LEDs reflect emitted light toward the display substrates.

In certain embodiments, the one or more reflective structures comprise array connection metals or micro-LED contacts.

In another aspect, the invention is directed to a method of micro assembling a micro-LED light-emitter array, the method comprising: forming a plurality of micro-LEDs on a first substrate; providing a display substrate; micro assembling the plurality of micro-LEDs onto a display substrate, wherein micro assembling the plurality of micro-LEDs onto the display substrate comprises: contacting a portion of the plurality of micro-LEDs with a first transfer device having a contact surface, thereby temporarily binding the portion of the plurality of micro-LEDs to the contact surface such that the contact surface has the portion of the plurality of micro-LEDs temporarily disposed thereon; contacting the portion of the plurality of micro-LEDs disposed on the contact surface of the first transfer device with a portion of the plurality of color-conversion structures; separating the contact surface of the first transfer device and the portion of the plurality of micro-LEDs, wherein portion of the plurality of micro-LEDs are transferred onto the portion of color-conversion structures, thereby assembling the portion of the plurality of micro-LEDs on the portion of the color-conversion structures; and providing a plurality of color-conversion structures on the display substrate in an array such that each color-conversion structure of the plurality of color-conversion structures is on a corresponding one of the micro-LED of the plurality of micro-LEDs, wherein each color-conversion structure comprises a color-conversion material.

In certain embodiments, the color-conversion materials are on top of or at least partially surrounding the micro-LEDs on a side of the micro-LEDs opposite the display substrate.

In certain embodiments, the color-conversion materials comprise phosphor-bearing gels or resins, phosphor ceramics, or single-crystal phosphors. In certain embodiments, the color-conversion materials are chips of direct band gap semiconductors. In certain embodiments, the color-conversion materials are at least partially surrounding the micro-LEDs.

In certain embodiments, the method comprises supplementary mirror structures on the display substrate.

In certain embodiments, each micro-LED has an LED substrate separate from the display substrate.

In certain embodiments, the micro-LEDS are formed in a native substrate distinct and separate from the display substrate.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each micro-LED has a width from 2 to 5 µm, 5 to 10 µm, 10 to 20 µm, or 20 to 50 µm. In certain embodiments, each micro-LED has a length from 2 to 5 µm, 5 to 10 µm, 10 to 20 µm, or 20 to 50 µm. In certain embodiments, each micro-LED has with a height from 2 to 5 µm, 4 to 10 µm, 10 to 20 µm, or 20 to 50 µm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light.

In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the micro-LEDs is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the plurality of micro-LEDs comprises a plurality of red micro-LEDs that emit red light, a plurality of green micro-LEDs that emit green light, and a plurality of blue micro-LEDs that emit blue light, and each pixel comprises a red micro-LED of the plurality of red micro-LEDs, a green micro-LED of the plurality of green micro-LEDs, and a blue micro-LED of the plurality of blue micro-LEDs.

In certain embodiments, the micro-LEDs are inorganic micro-LEDs.

In another aspect, the invention is directed to a multi-functional display, comprising: a display substrate; an array of micro-LEDs on the display substrate; and an array of functional elements on the display substrate, the micro-LEDs interlaced between the functional elements, wherein the display substrate is non-native to the micro-LEDs and the functional elements.

In certain embodiments, the functional elements are sensors or transceivers. In certain embodiments, the functional elements comprise at least one member selected from the group consisting of: image capture devices, optical sensors, photodiodes, infrared sensors, gesture sensors, infrared sensors, temperature sensors, power harvest devices, solar cells, motion energy scavenging devices, piezoelectric devices, capacitors, antennas, and wireless transmission devices.

In certain embodiments, the functional elements have a different spatial density over the display substrate than the micro-LEDs.

In certain embodiments, the micro-LEDs are formed in a native substrate separate and distinct from the display substrate.

In certain embodiments, the functional elements are formed in a native substrate separate and distinct from the display substrate. In certain embodiments, the number of functional elements is less than or equal to the number of micro-LEDs in the display. In certain embodiments, the number of functional elements is less than or equal to one-third of the number of micro-LEDs in the display.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each micro-LED has a width from 2 to 5 µm, 5 to 10 µm, 10 to 20 µm, or 20 to 50 µm. In certain embodiments, each micro-LED has a length from 2 to 5 µm, 5 to 10 µm, 10 to 20 µm, or 20 to 50 µm. In certain embodiments, each micro-LED has with a height from 2 to 5 µm, 4 to 10 µm, 10 to 20 µm, or 20 to 50 µm. In certain embodiments, each functional element has at least one of a width, length, and height from 2 to 5 µm, 4 to 10 µm, 10 to 20 µm, or 20 to 50 µm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light.

In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the micro-LEDs is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the array of micro-LEDs and the array of functional elements are on a common plane.

In certain embodiments, the multi-functional display comprises a plurality of micro-integrated circuits, each micro-integrated circuit connected to at least one micro-LED in the array of micro-LEDs and at least one functional element in the array of functional elements.

In certain embodiments, the multi-functional display comprises: a polymer layer on the display substrate, wherein the array of micro-LEDs and the array of functional elements are on the polymer layer such that the polymer layer is between the display substrate and the array of micro-LEDs and the array of functional elements.

In certain embodiments, the multi-functional display comprises: a first patterned metal layer on a surface of the display substrate; a dielectric layer on the display substrate and the first patterned metal layer, wherein the polymer layer is on the display substrate; a plurality of vias formed through the polymer and dielectric layer, each via associated with a corresponding micro-LED; and a second patterned metal layer, the second patterned metal layer comprising a plurality of anode interconnections and a plurality of cathode interconnections in a single layer, each anode interconnection electrically connecting the anode of a corresponding micro-LED to the first patterned metal layer through a corresponding via of the plurality of vias and each cathode interconnections electrically contracting the cathode of a corresponding micro-LED.

In certain embodiments, the multi-functional display comprises: a plurality of pixels, each pixel comprises at least one micro-LED in the array of micro-LEDs and at least one functional element in the array of functional elements.

In certain embodiments, the array of micro-LEDs comprises a plurality of red micro-LEDs that emit red light, a plurality of green micro-LEDs that emit green light, and a plurality of blue micro-LEDs that emit blue light, and each pixel comprises a red micro-LED of the plurality of red micro-LEDs, a green micro-LED of the plurality of green micro-LEDs, and a blue micro-LED of the plurality of blue micro-LEDs.

In certain embodiments, micro-LEDs are inorganic micro-LEDs.

In another aspect, the invention is directed to a method of micro assembling a light emitting diode (LED) display interlaced with functional elements, the method comprising: forming a plurality of micro-LEDs on a first substrate; forming a plurality of functional elements on a second substrate; micro assembling the plurality of micro-LEDs onto a display substrate, non-native to the plurality of micro-LEDs and the plurality of function elements, wherein micro assembling the plurality of micro-LEDs onto the display substrate comprises: contacting a portion of the plurality of micro-LEDs with a first transfer device having a contact surface, thereby temporarily binding the portion of the plurality of micro-LEDs to the contact surface such that the contact surface has the portion of the plurality of micro-LEDs temporarily disposed thereon; contacting the portion of the plurality of micro-LEDs disposed on the contact surface of the first transfer device with a receiving surface of the display substrate; separating the contact surface of the first transfer device and the portion of the plurality of micro-LEDs, wherein portion of the plurality of micro-LEDs are transferred onto the receiving surface, thereby assembling the portion of the plurality of micro-LEDs on the receiving surface of the display substrate; and micro assembling the plurality of functional elements onto a display substrate, comprising: contacting a portion of the plurality of functional elements of the portion of the plurality of functional elements with a second transfer device, thereby binding the portion of the plurality of functional elements to the contact surface such that the contact surface has the portion of the plurality of functional elements disposed thereon; contacting the portion of the plurality of functional elements disposed on the contact surface of the second transfer device with the receiving surface of the display substrate; and separating the contact surface of the second transfer device and portion of the plurality of functional elements, wherein the portion of the plurality of functional elements is transferred onto the receiving surface of the display substrate, thereby assembling the portion of the plurality of functional elements on the receiving surface of the display substrate.

In certain embodiments, the plurality of functional elements are sensors or transceivers.

In certain embodiments, the plurality of functional elements comprise at least one member selected from the group consisting of: image capture devices, optical sensors, photodiodes, infrared sensors, gesture sensors, infrared sensors, temperature sensors, power harvest devices, solar cells, motion energy scavenging devices, piezoelectric devices, capacitors, antennas, and wireless transmission devices.

In certain embodiments, the plurality of functional elements have a different spatial density over the display substrate than the micro-LEDs.

In certain embodiments, the micro-LEDs are formed in a native substrate separate and distinct from the display substrate.

In certain embodiments, the plurality of functional elements are formed in a native substrate separate and distinct from the display substrate.

In certain embodiments, the number of functional elements is less than or equal to than the number of micro-LEDs in the display.

In certain embodiments, the number of functional elements is less than or equal to than one-third of the number of micro-LEDs in the display.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each micro-LED has a width from 2 to 5 µm, 5 to 10 µm, 10 to 20 µm, or 20 to 50 µm. In certain embodiments, each micro-LED has a length from 2 to 5 µm, 5 to 10 µm, 10 to 20 µm, or 20 to 50 µm. In certain embodiments, each micro-LED has with a height from 2 to 5 µm, 4 to 10 µm, 10 to 20 µm, or 20 to 50 µm. In certain embodiments, each functional element has at least one of a width, length, and height from 2 to 5 µm, 4 to 10 µm, 10 to 20 µm, or 20 to 50 µm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light.

In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the plurality of micro-LEDs and the plurality of functional elements are on a common plane.

In certain embodiments, the method comprises: a plurality of micro-integrated circuits, each micro-integrated circuit connected to at least one micro-LED in the plurality of micro-LEDs and at least one functional element of plurality of functional elements.

In certain embodiments, the method comprises: a polymer layer on the display substrate, wherein the plurality of micro-LEDs and the plurality of functional elements are on polymer layer such that the polymer layer is between the display substrate and the plurality of micro-LEDs and the plurality of functional elements.

In certain embodiments, the method comprises: a first patterned metal layer on a surface of the display substrate; a dielectric layer on the display substrate and the first patterned metal layer, wherein the polymer layer is on the display substrate; a plurality of vias formed through the polymer and dielectric layer, each via associated with a corresponding micro-LED; and a second patterned metal layer, the second patterned metal layer comprising a plurality of anode interconnections and a plurality of cathode interconnections in a single layer, each anode interconnection electrically connecting the anode of a corresponding micro-LED to the first patterned metal layer through a corresponding via of the plurality of vias and each cathode interconnections electrically contracting the cathode of a corresponding micro-LED.

In certain embodiments, the method comprises: a plurality of pixels, each pixel comprises at least one micro-LED in the plurality of micro-LEDs and at least one functional element in the plurality of functional elements.

In certain embodiments, the plurality of micro-LEDs comprises a plurality of red micro-LEDs that emit red light, a plurality of green micro-LEDs that emit green light, and a plurality of blue micro-LEDs that emit blue light, and each pixel comprises a red micro-LED of the plurality of red micro-LEDs, a green micro-LED of the plurality of green micro-LEDs, and a blue micro-LED of the plurality of blue micro-LEDs.

In certain embodiments, the micro-LEDs are inorganic micro-LEDs.

In certain embodiments, the second transfer device is the first transfer device.

In certain embodiments, the first transfer device comprises an elastomer stamp.

In another aspect, the invention is directed to a multi-mode display, comprising: a display substrate; a first emissive inorganic micro-LED display formed over the display substrate; and a second display formed over the display substrate, the second display of a different type than the first emissive micro-LED display.

In certain embodiments, the second display is a non-emissive reflective display. In certain embodiments, the second display is an electrophoretic or MEMs-based display.

In certain embodiments, the first display comprises a plurality of first pixels and the second display comprises a plurality of second pixels, wherein each of the plurality of first pixels is smaller than each of the plurality of second pixels.

In certain embodiments, the multi-mode display comprises a controller for switching between the first display and the second display.

In certain embodiments, the multi-mode display comprises a cell phone, a smart phone, or a tablet computing device.

In certain embodiments, the first display is located over a different portion of the display substrate than the second display.

In certain embodiments, the first display and the second display are located over a same portion of the display substrate. In certain embodiments, the first display is located on top of the second display on a side of the second display opposite the display substrate.

In certain embodiments, light-controlling elements of the first display are interlaced on the display substrate with light-controlling elements of the second display.

In certain embodiments, the micro-LEDS are formed in an native substrate distinct and separate from the display substrate.

In certain embodiments, the first display and the second display are formed on the display substrate. In certain embodiments, the first display is on a first side of the display substrate and the second display is on a second side of the display substrate, opposite the first side.

In certain embodiments, the second display is on the display substrate and the first display is on a micro-LED display substrate, separate from the display substrate and located over the display substrate.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each micro-LED has a width from 2 to 5 μm, 5 to 10 μm, 10 to 20 μm, or 20 to 50 μm. In certain embodiments, each micro-LED has a length from 2 to 5 μm, 5 to 10 μm, 10 to 20 μm, or 20 to 50 μm. In certain embodiments, each micro-LED has with a height from 2 to 5 μm, 4 to 10 μm, 10 to 20 μm, or 20 to 50 μm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light. In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the micro-LEDs is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the first emissive micro-LED display comprise a plurality of red micro-LEDs that emit red light, a plurality of green micro-LEDs that emit green light, and a plurality of blue micro-LEDs that emit blue light, and each pixel of the first emissive micro-LED display comprises a red micro-LED of the plurality of red micro-LEDs, a green micro-LED of the plurality of green micro-LEDs, and a blue micro-LED of the plurality of blue micro-LEDs.

In certain embodiments, the micro-LEDs are inorganic micro-LEDs.

In certain embodiments, the first emissive inorganic micro-LED display comprises a plurality of inorganic micro-LEDs formed in an LED substrate separate and distinct from the display substrate and the second display is formed on or in and is native to the display substrate, wherein the LED substrate is adhered to the display substrate.

In another aspect, the invention is directed to a method of micro assembling a micro-LED light-emitter array, the method comprising: forming a plurality of micro-LEDs on a first substrate; providing a display substrate; micro assembling the plurality of micro-LEDs over the display substrate, thereby forming a first emissive micro-LED display over the display substrate; and forming a second display over the display substrate, the second display of a different type than the first emissive micro-LED display.

In certain embodiments, the second display is a non-emissive reflective display.

In certain embodiments, the second display is an electrophoretic or MEMs-based display.

In certain embodiments, the first display comprises a plurality of first pixels and the second display comprises a plurality of second pixels, wherein each of the plurality of first pixels is smaller than each of the plurality of second pixels.

In certain embodiments, the method further comprises a controller for switching between the first display and the second display.

In certain embodiments, the method further comprises a cell phone, a smart phone, or a tablet computing device.

In certain embodiments, the first display is located over a different portion of the display substrate than the second display. In certain embodiments, the first display and the second display are located over a same portion of the display substrate. In certain embodiments, the first display is located on top of the second display on a side of the second display opposite the display substrate.

In certain embodiments, light-controlling elements of the first display are interlaced on the display substrate with light-controlling elements of the second display.

In certain embodiments, the micro-LEDS are formed in an native substrate distinct and separate from the display substrate.

In certain embodiments, the first display and the second display are formed on the display substrate.

In certain embodiments, the first display is on a first side of the display substrate and the second display is on a second side of the display substrate, opposite the first side.

In certain embodiments, the second display is on the display substrate and the first display is on a micro-LED display substrate, separate from the display substrate and located over the display substrate.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. In certain embodiments, each micro-LED has a width from 2 to 5 µm, 5 to 10 µm, 10 to 20 µm, or 20 to 50 µm. In certain embodiments, each micro-LED has a length from 2 to 5 µm, 5 to 10 µm, 10 to 20 µm, or 20 to 50 µm. In certain embodiments, each micro-LED has with a height from 2 to 5 µm, 4 to 10 µm, 10 to 20 µm, or 20 to 50 µm.

In certain embodiments, a resolution of the display is 120×90, 1440×1080, 1920×1080, 1280×720, 3840×2160, 7680×4320, or 15360×8640.

In certain embodiments, the display substrate has a transparency greater than or equal to 50%, 80%, 90%, or 95% for visible light. In certain embodiments, the display substrate has a contiguous display substrate area that includes the micro-LEDs, each micro-LED has a light-emissive area, and the combined light-emissive areas of the micro-LEDs is less than or equal to one-quarter of the contiguous display substrate area.

In certain embodiments, the combined light-emissive areas of the micro-LEDs is less than or equal to one eighth, one tenth, one twentieth, one fiftieth, one hundredth, one five-hundredth, one thousandth, one two-thousandth, or one ten-thousandth of the contiguous display substrate area.

In certain embodiments, each micro-LED has an anode and a cathode on a same side of the respective micro-LED.

In certain embodiments, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

In certain embodiments, the display substrate is a member selected from the group consisting of polymer, plastic, resin, polyimide, PEN, PET, metal, metal foil, glass, a semiconductor, and sapphire.

In certain embodiments, the plurality of micro-LEDs comprises a plurality of red micro-LEDs that emit red light, a plurality of green micro-LEDs that emit green light, and a plurality of blue micro-LEDs that emit blue light, and each pixel comprises a red micro-LED of the plurality of red micro-LEDs, a green micro-LED of the plurality of green micro-LEDs, and a blue micro-LED of the plurality of blue micro-LEDs.

In certain embodiments, the micro-LEDs are inorganic micro-LEDs.

In another aspect, the invention is directed to a micro assembled device, comprising: a device substrate; a first electrical conductor on the device substrate; a second electrical conductor on the device substrate; a conductive jumper element distinct and separate from the device substrate having one or more jumper conductors; and wherein the conductive jumper element is on the device substrate with the first jumper conductor of the one or more jumper conductors in electrical contact with the first electrical conductor and the second electrical conductor.

In certain embodiments, the conductive jumper element is a conductive passive device.

In certain embodiments, the conductive jumper element is an active device. In certain embodiments, the active device is a CMOS device. In certain embodiments, the active device comprises at least one of drive circuitry and non-volatile memory.

In certain embodiments, the conductive jumper element is housed within a structure suitable for micro transfer printing. In certain embodiments, the conductive jumper element comprises one or more of a semiconductor, silicon, silicon on insulator, glass, metal, and a dielectric.

In certain embodiments, the jumper conductor comprises a semiconductor, a metal, a noble metal, gold, silver, platinum, copper, stainless steel, nickel, chromium, solder, PbSn, AgSn, or AgSn.

In certain embodiments, a portion of the conductive jumper element adjacent to the conductor substrate is recessed.

In certain embodiments, the device comprises a third electrical conductor on the conductor substrate that is electrically isolated from the first electrical conductor and the second electrical conductor, wherein the third electrical conductor is located under the recess of the conductive jumper element.

In certain embodiments, the recess comprises an exposed insulator.

In certain embodiments, the conductive jumper element comprises a first terminal electrically connected to a second terminal with an exposed insulator there between, wherein the first terminal, second terminal, and the exposed insulator form a planar surface on at least one side of the conductive jumper element.

In certain embodiments, the device comprises a third electrical conductor on the conductor substrate that is electrically isolated from the first electrical conductor and the second electrical conductor, wherein the third electrical conductor that is contacted by the exposed insulator.

In certain embodiments, a portion of at least one of the jumper conductors is covered with an insulator.

In certain embodiments, a central portion of at least one of the jumper conductors is covered with an insulator separating exposed ends of the jumper conductor.

In certain embodiments, the substrate is a display substrate and the conductive jumper element electrically connects a redundant light emitter to a display circuit.

In certain embodiments, the redundant light emitter is connected to the display circuit in place of a defective primary light emitter.

In certain embodiments, a distance between the first electrical conductor and the second electrical conductor is from 100 nm to 500 nm, 500 nm to 1 micron, 1 micron to 20 microns, 20 microns to 50 microns, or 50 microns to 100 microns. In certain embodiments, the device substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the conductive jumper element has a width from 2 to 5 µm, 5 to 10 µm, 10 to 20 µm, or 20 to 50 µm. In certain embodiments, the conductive jumper element has a length from 2 to 5 µm, 5 to 10 µm, 10 to 20 µm, or 20 to 50 µm. In certain embodiments, the conductive jumper element has with a height from 2 to 5 µm, 4 to 10 µm, 10 to 20 µm, or 20 to 50 µm.

In certain embodiments, the device substrate has a transparency greater than or equal to 50%, 80%, 90%, or 95% for visible light. In certain embodiments, the device substrate is a member selected from the group consisting of polymer, plastic, resin, polyimide, PEN, PET, metal, metal foil, glass, a semiconductor, and sapphire.

In certain embodiments, the conductive jumper element is a cross-over

In certain embodiments, the device comprises: a plurality of first electrical conductors on the device substrate, wherein the plurality of first electrical conductors comprises the first electrical conductor; a plurality of second electrical conductors on the device substrate, wherein the plurality of second electrical conductors comprises the second electrical conductor; a conductive jumper element distinct and separate from the device substrate having a plurality of jumper conductors, wherein the plurality of jumper conductors comprises the one or more jumper conductors; and each jumper conductor of the plurality of jumper conductors in electrical contact with a first electrical conductor of the plurality of electrical conductors and a second electrical conductor of the plurality of second electrical conductors.

In another aspect, the invention is directed to a method of providing a micro assembled device, comprising: providing a device comprising a device substrate; a first electrical conductor on the device substrate; a second electrical conductor on the device substrate; and micro assembling a conductive jumper element having one or more jumper conductors on the device substrate, wherein the conductive jumper element is on the device substrate with the first jumper conductor of the one or more jumper conductors in electrical contact with the first electrical conductor and the second electrical conductor.

In certain embodiments, the conductive jumper element is a conductive passive device. In certain embodiments, the conductive jumper element is an active device. In certain embodiments, the active device is a CMOS device. In certain embodiments, the active device comprises at least one of drive circuitry and non-volatile memory.

In certain embodiments, the conductive jumper element is housed within a structure suitable for micro transfer printing.

In certain embodiments, the conductive jumper element comprises one or more of a semiconductor, silicon, silicon on insulator, glass, metal, and a dielectric.

In certain embodiments, the jumper conductor comprises a semiconductor, a metal, a noble metal, gold, silver, platinum, copper, stainless steel, nickel, chromium, solder, PbSn, AgSn, or AgSn.

In certain embodiments, a portion of the conductive jumper element adjacent to the conductor substrate is recessed.

In certain embodiments, a third electrical conductor on the conductor substrate that is electrically isolated from the first electrical conductor and the second electrical conductor, wherein the third electrical conductor is located under the recess of the conductive jumper element.

In certain embodiments, the recess comprises an exposed insulator.

In certain embodiments, the conductive jumper element comprises a first terminal electrically connected to a second terminal with an exposed insulator there between, wherein the first terminal, second terminal, and the exposed insulator form a planar surface on at least one side of the conductive jumper element.

In certain embodiments, the method comprises a third electrical conductor on the conductor substrate that is electrically isolated from the first electrical conductor and the second electrical conductor, wherein the third electrical conductor that is contacted by the exposed insulator.

In certain embodiments, a portion of at least one of the jumper conductors is covered with an insulator.

In certain embodiments, a central portion of at least one of the jumper conductors is covered with an insulator separating exposed ends of the jumper conductor.

In certain embodiments, the substrate is a display substrate and the conductive jumper element electrically connects a redundant light emitter to a display circuit.

In certain embodiments, the redundant light emitter is connected to the display circuit in place of a defective primary light emitter.

In certain embodiments, a distance between the first electrical conductor and the second electrical conductor is from 100 nm to 500 nm, 500 nm to 1 micron, 1 micron to 20 microns, 20 microns to 50 microns, or 50 microns to 100 microns.

In certain embodiments, the device substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the conductive jumper element has a width from 2 to 5 µm, 5 to 10 µm, 10 to 20 µm, or 20 to 50 µm.

In certain embodiments, the conductive jumper element has a length from 2 to 5 µm, 5 to 10 µm, 10 to 20 µm, or 20 to 50 µm.

In certain embodiments, the conductive jumper element has with a height from 2 to 5 µm, 4 to 10 µm, 10 to 20 µm, or 20 to 50 µm.

In certain embodiments, the device substrate has a transparency greater than or equal to 50%, 80%, 90%, or 95% for visible light.

In certain embodiments, the device substrate is a member selected from the group consisting of polymer, plastic, resin, polyimide, PEN, PET, metal, metal foil, glass, a semiconductor, and sapphire.

In certain embodiments, the conductive jumper element is a cross-over.

In certain embodiments, the method comprises: a plurality of first electrical conductors on the device substrate, wherein the plurality of first electrical conductors comprises the first electrical conductor; a plurality of second electrical conductors on the device substrate, wherein the plurality of second electrical conductors comprises the second electrical conductor; a conductive jumper element distinct and separate from the device substrate having a plurality of jumper conductors, wherein the plurality of jumper conductors comprises the one or more jumper conductors; and each jumper conductor of the plurality of jumper conductors in electrical contact with a first electrical conductor of the plurality of electrical conductors and a second electrical conductor of the plurality of second electrical conductors.

In certain embodiments, micro assembling the conductive jumper element comprises: contacting the conductive jumper element with a transfer device having a contact surface, thereby temporarily binding the conductive jumper element to the contact surface such that the contact surface has the conductive jumper element temporarily disposed thereon; contacting the conductive jumper element disposed on the contact surface of the transfer device with a receiving surface of the device substrate; and separating the contact surface of the transfer device and the conductive jumper element, wherein conductive jumper element is transferred onto the receiving surface, thereby assembling the portion of the conductive jumper element on the receiving surface of the device substrate.

In certain embodiments, the transfer device comprises an elastomer stamp.

BRIEF DESCRIPTION OF THE FIGURES

The foregoing and other objects, aspects, features, and advantages of the present disclosure will become more apparent and better understood by referring to the following description taken in conjunction with the accompanying drawings, in which:

FIG. 28 is an illustration of an example pixel prior to connection, according to an illustrative embodiment of the invention;

FIG. 29 is an illustration of implementing color conversion in micro-assembled micro-LED displays and lighting elements using color-conversion material, according to an illustrative embodiment of the invention;

FIG. 44 is an image of the completed display substrate with passive-matrix displays thereon, according to an illustrative embodiment of the invention, according to an illustrative embodiment of the invention;

FIGS. 54A-54E are schematic cross-sections of example architectures of micro-LEDs.

Figure 1:
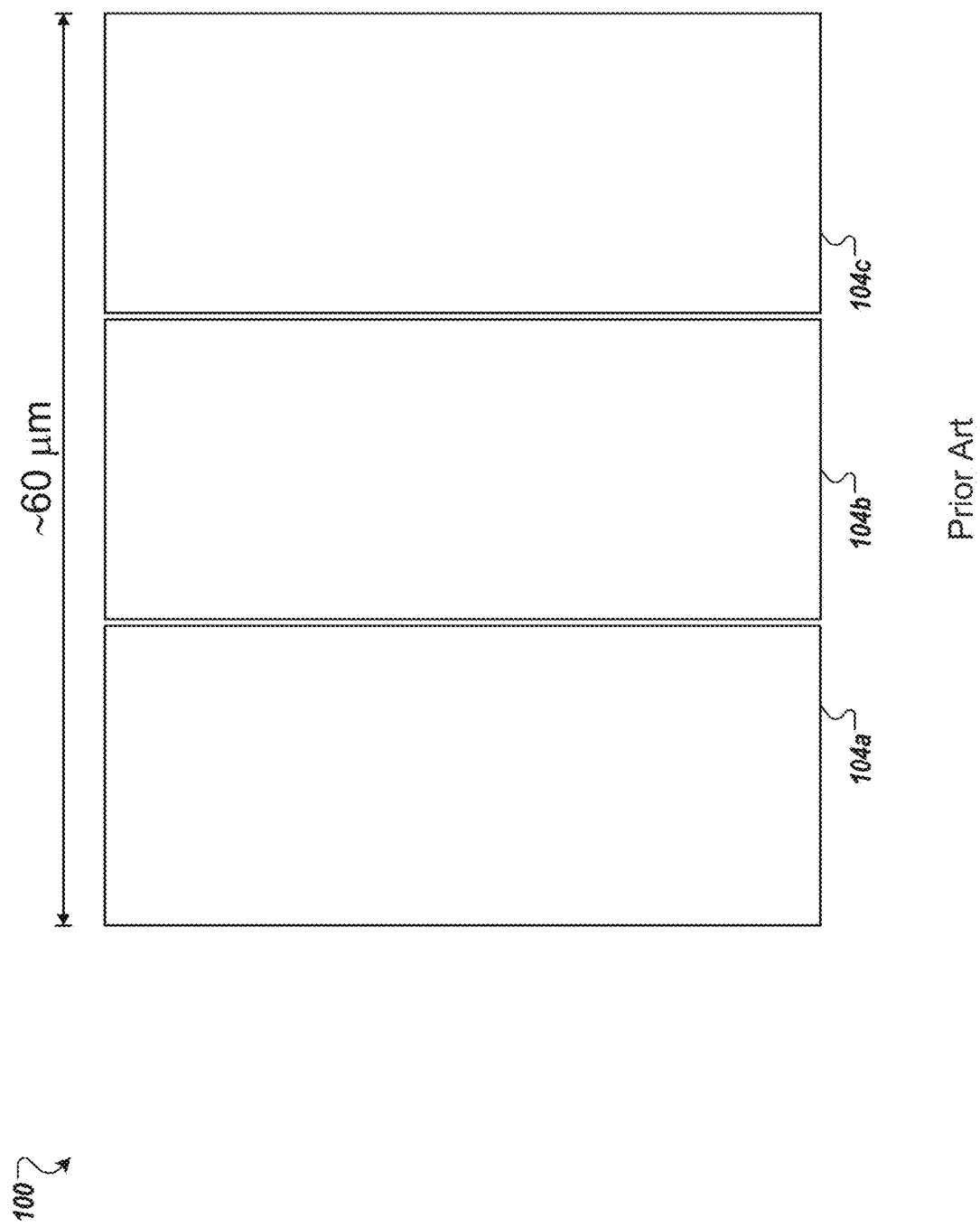
FIG. 1 is an illustration of a typical pixel used in an LCD display.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

As used herein the expression "semiconductor element" and "semiconductor structure" are used synonymously and broadly refer to a semiconductor material, structure, device, or component of a device. Semiconductor elements include high-quality single crystalline and polycrystalline semiconductors, semiconductor materials fabricated via high-temperature processing, doped semiconductor materials, organic and inorganic semiconductors, and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light-emitting diodes, lasers, p-n junctions, photodiodes, integrated circuits, and sensors. In addition, semiconductor element can refer to a part or portion that forms an functional semiconductor device or product.

"Semiconductor" refers to any material that is a material that is an insulator at a very low temperature, but which has an appreciable electrical conductivity at temperatures of about 300 Kelvin. The electrical characteristics of a semiconductor can be modified by the addition of impurities or dopants and controlled by the use of electrical fields. In the present description, use of the term semiconductor is intended to be consistent with use of this term in the art of microelectronics and electronic devices. Semiconductors useful in the present invention can include elemental semiconductors, such as silicon, germanium and diamond, and compound semiconductors, for example group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa1-_xAs$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light-emitting materials, such as light-emitting diodes (LEDs) and solid-state lasers. Impurities of semiconductor materials are atoms, elements, ions or molecules other than the semiconductor material(s) themselves or any dopants provided in the semiconductor material. Impurities are undesirable materials present in semiconductor materials that can negatively impact the electronic properties of semiconductor materials, and include but are not limited to oxygen, carbon, and metals including heavy metals. Heavy-metal impurities include, but are not limited to, the group of elements between copper and lead on the periodic table, calcium, sodium, and all ions, compounds and/or complexes thereof.

"Substrate" refers to a structure or material on which, or in which, a process is (or has been) conducted, such as patterning, assembly or integration of semiconductor elements. Substrates include, but are not limited to: (i) a structure upon which semiconductor elements are fabricated, deposited, transferred or supported (also referred to as a native substrate); (ii) a device substrate, for example an electronic device substrate; (iii) a donor substrate having elements, such as semiconductor elements, for subsequent transfer, assembly or integration; and (iv) a target substrate for receiving printable structures, such as semiconductor elements. A donor substrate can be, but is not necessarily, a native substrate.

"Display substrate" as used herein refers to the target substrate (e.g., non-native substrate) for receiving printable structures, such as semiconductor elements. Examples of display substrate materials include polymer, plastic, resin, polyimide, polyethylene naphthalate, polyethylene terephthalate, metal, metal foil, glass, flexible glass, a semiconductor, and sapphire.

The terms "micro" and "micro-device" as used herein refer to the descriptive size of certain devices or structures in accordance with embodiments of the invention. As used herein, the terms "micro" and "micro-device" are meant to refer to structures or devices on the scale of 0.5 to 250 μm. However, it is to be appreciated that embodiments of the present invention are not necessarily so limited, and that certain aspects of the embodiments can be applicable to larger or smaller size scales.

As used herein, "micro-LED" refers to an inorganic light-emitting diode on the scale of 0.5 to 250 μm. For example, micro-LEDs can have at least one of a width, length, and height (or two or all three dimensions) from 0.5 to 2 μm, 2 to 5 μm, 5 to 10 μm, 10 to 20 μm, 20 to 50 μm, 20 to 50 μm, 50 to 100 μm, or 100 to 250 μm. Micro-LEDs emit light when energized. The color of the light emitted by an LED varies depending upon the structure of the micro-LED. For example, when energized a red micro-LED emits red light, a green micro-LED emits green light, a blue micro-LED emits blue light, a yellow micro-LED emits yellow light, and a cyan micro-LED emits cyan light.

"Printable" relates to materials, structures, device components, or integrated functional devices that are capable of transfer, assembly, patterning, organizing, or integrating onto or into substrates without exposure of the substrate to high temperatures (e.g. At temperatures less than or equal to about 400, 200, or 150 degrees Celsius). In one embodiment of the present invention, printable materials, elements, device components, or devices are capable of transfer, assembly, patterning, organizing and/or integrating onto or into substrates via solution printing, micro-transfer printing, or dry transfer contact printing.

"Printable semiconductor elements" of the present invention comprise semiconductor structures that can be assembled or integrated onto substrate surfaces, for example by using dry transfer contact printing, micro-transfer printing, or solution printing methods. In one embodiment, printable semiconductor elements of the present invention are unitary single crystalline, polycrystalline or microcrystalline inorganic semiconductor structures. In the context of this description, a unitary structure is a monolithic element having features that are mechanically connected. Semiconductor elements of the present invention can be undoped or doped, can have a selected spatial distribution of dopants and can be doped with a plurality of different dopant materials, including p- and n-type dopants. The present invention includes microstructured printable semiconductor elements having at least one cross-sectional dimension greater than or equal to about 1 micron and nanostructured printable semiconductor elements having at least one cross-sectional dimension less than or equal to about 1 micron. Printable semiconductor elements useful in many applications comprise elements derived from "top down" processing of high-purity bulk materials, such as high-purity crystalline semiconductor wafers generated using conventional high-temperature processing techniques. In one embodiment, printable semiconductor elements of the present invention comprise composite structures having a semiconductor operationally connected to at least one additional device component or structure, such as a conducting layer, dielectric layer, electrode, additional semiconductor structure, or any combination of these. In one embodiment, printable semiconductor elements of the present invention comprise stretchable semiconductor elements or heterogeneous semiconductor elements.

The term "flexible" refers to the ability of a material, structure, device or device component to be reversibly deformed into a curved shape, e.g., without undergoing a transformation that introduces significant strain, such as strain characterizing the failure point of a material, structure, device, or device component.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which can provide desired chemical or physical properties. "Dielectric" and "dielectric material" are used synonymously in the present description and refer to a substance that is highly resistant to flow of electric current and can be polarized by an applied electric field. Useful dielectric materials include, but are not limited to, $SiO_2$, $Ta_2O_5$, $TiO_2$, $ZrO_2$, $Y_2O_3$, $SiN_4$, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention can be organic polymers or inorganic polymers and can be in amorphous, semi-amorphous, crystalline or partially crystalline states. Polymers can comprise monomers having the same chemical composition or can comprise a plurality of monomers having different chemical compositions, such as a copolymer. Cross-linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Micro-transfer printing" as used herein refers to systems, methods, and techniques for the deterministic assembly of micro- and nano-materials, devices, and semiconductor elements into spatially organized, functional arrangements with two-dimensional and three-dimensional layouts. It is often difficult to pick up and place ultra-thin or small devices, however, micro-transfer printing permits the selection and application of these ultra-thin, fragile, or small devices, such as micro-LEDs, without causing damage to the devices themselves. Microstructured stamps (e.g., elastomeric, electrostatic stamps, or hybrid elastomeric/electrostatic stamps) can be used to pick up micro devices, transport the micro devices to a destination substrate, and print the micro devices onto the destination substrate. In some embodiments, surface adhesion forces are used to control the selection and printing of these devices onto the destination substrate. This process can be performed massively in parallel. The stamps can be designed to transfer a single device or hundreds to thousands of discrete structures in a single pick-up-and-print operation. For a discussion of micro-transfer printing generally, see U.S. Pat. Nos. 7,622, 367 and 8,506,867, each of which is hereby incorporated by reference in its entirety.

Micro-transfer printing also enables parallel assembly of high-performance semiconductor devices (e.g., micro-LED displays) onto virtually any substrate material, including glass, plastics, metals, other semiconductor materials, or other non-semiconductor materials. The substrates can be flexible, thereby permitting the production of flexible electronic devices. Flexible substrates can be integrated into a large number of configurations, including configurations not possible with brittle silicon-based electronic devices. Additionally, plastic substrates, for example, are mechanically rugged and can be used to provide electronic devices that are less susceptible to damage or electronic-performance degradation caused by mechanical stress. Thus, these materials can be used to fabricate electronic devices by continuous, high-speed, printing techniques capable of generating electronic devices over large substrate areas at low cost (e.g., roll-to-roll manufacturing).

Moreover, these micro-transfer printing techniques can be used to print semiconductor devices at temperatures compatible with assembly on plastic polymer substrates. In addition, semiconductor materials can be printed onto large areas of substrates thereby enabling continuous, high-speed printing of complex integrated electrical circuits over large substrate areas. Moreover, flexible electronic devices with good electronic performance in flexed or deformed device orientations can be provided to enable a wide range of flexible electronic devices.

The disclosed technology relates generally to the formation of transferable micro inorganic light-emitting diode (e.g., micro-LED) devices. Micro-assembled micro-LED displays and lighting elements use arrays of micro-LEDs that are too small, numerous, or fragile to assemble by conventional means (e.g., vacuum grippers or pick-and-place tools). The disclosed technology enables micro-assembled micro-LED displays and lighting elements using micro-transfer printing technology. The micro-LEDs can be prepared on a native substrate and printed to a destination substrate (e.g., plastic, metal, glass, or other materials) for example a display substrate. This enables a small active-area display, as semiconductor material is only used for the micro-LEDs or other active elements (e.g., drivers or transistors) and not across the entire display panel or a substantial portion thereof as is commonly found in thin-film displays (e.g., in certain embodiments, the present invention, provides display substrates with an active area less than or equal to 40%, 30%, 20%, 10%, 5%, 3%, 1%, 0.5%, or 0.1% of the display). In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the contiguous display-substrate area.

Micro-assembled micro-LED displays and lighting elements can provide substantially monochromatic, substantially white, or substantially tunable color. They can include micro-LEDs that emit substantially similar colors, for example, all blue or all red micro-LEDs, or they can include micro-LEDs of different colors, for example red, green, blue, yellow, or cyan micro-LEDs for rendering different colors on a display or lighting element. The colors of the micro-LEDs can be produced by direct emission from the micro-LEDs, by color conversion structures, or some combination thereof.

Micro-LEDs used in the disclosed displays, in some embodiments, benefit from passivation of the active junction perimeter. For example, prior to printing micro-LEDs to a display substrate, the junction perimeter of each micro-LED diode can be exposed (e.g., by etching) and a high band gap semiconductor (e.g., InGaAlP, InGaN, GaN, AlGaN) can be grown on the exposed junction perimeter, thereby reducing non-radiative recombination in the micro-LED.

Moreover, in certain embodiments, micro-LEDs carry current laterally a smaller distance than much larger, conventional LEDs. Accordingly, the micro-LED epi-structure can be thinner than the structures used for conventional LEDs. The micro-LED epi structure for displays can include thinner current-spreading layers or thinner buffer layers. In certain embodiments, conventional buffer layers can be omitted due to the epi-structure for micro-LEDs. Buffer layers are often needed as the thickness of a device increases to prevent the device substrate from cracking. The disclosed technology provides for such devices (e.g., devices less than a millimeter thick in some embodiments. Thin devices such as these do not need a buffer layer to prevent cracking of the substrate/device. In some embodiments, thin, strain-balanced alternating epitaxial layers can be used in place of the conventional buffer layers. By using alternating layers of crystalline material with different lattice structures, an overall structure with reduced strain is provided that can also serve the overall function of the epitaxial layers, for example for current conduction or light emission.

FIG. 1 is a prior-art illustration of a typical pixel 100 used, for example, in an LCD display. The pixel 100 includes three subpixels 104a, 104b, and 140c (collectively 104). In some cases, these are red subpixel 104a, green sub pixel 104b, and blue subpixel 104c. A color filter is typically used to create the color for each subpixel 104 while a backlight is used to illuminate the filters. The intensity of each subpixel 104 can be controlled through the variation of voltage applied to each subpixel 104 such that a wide range of shades (e.g., 256 shades) are produced by each subpixel 104 (e.g., 256 shades of red, 256 shares of green, and 256 shades of blue). In a liquid crystal display, the voltage is applied to liquid crystals in a liquid-crystal layer. The liquid crystals twist based on the voltage applied, thereby varying the amount of light from the backlight that passes through the liquid crystals and thus through the color filters for each subpixel 104.

Figure 2:
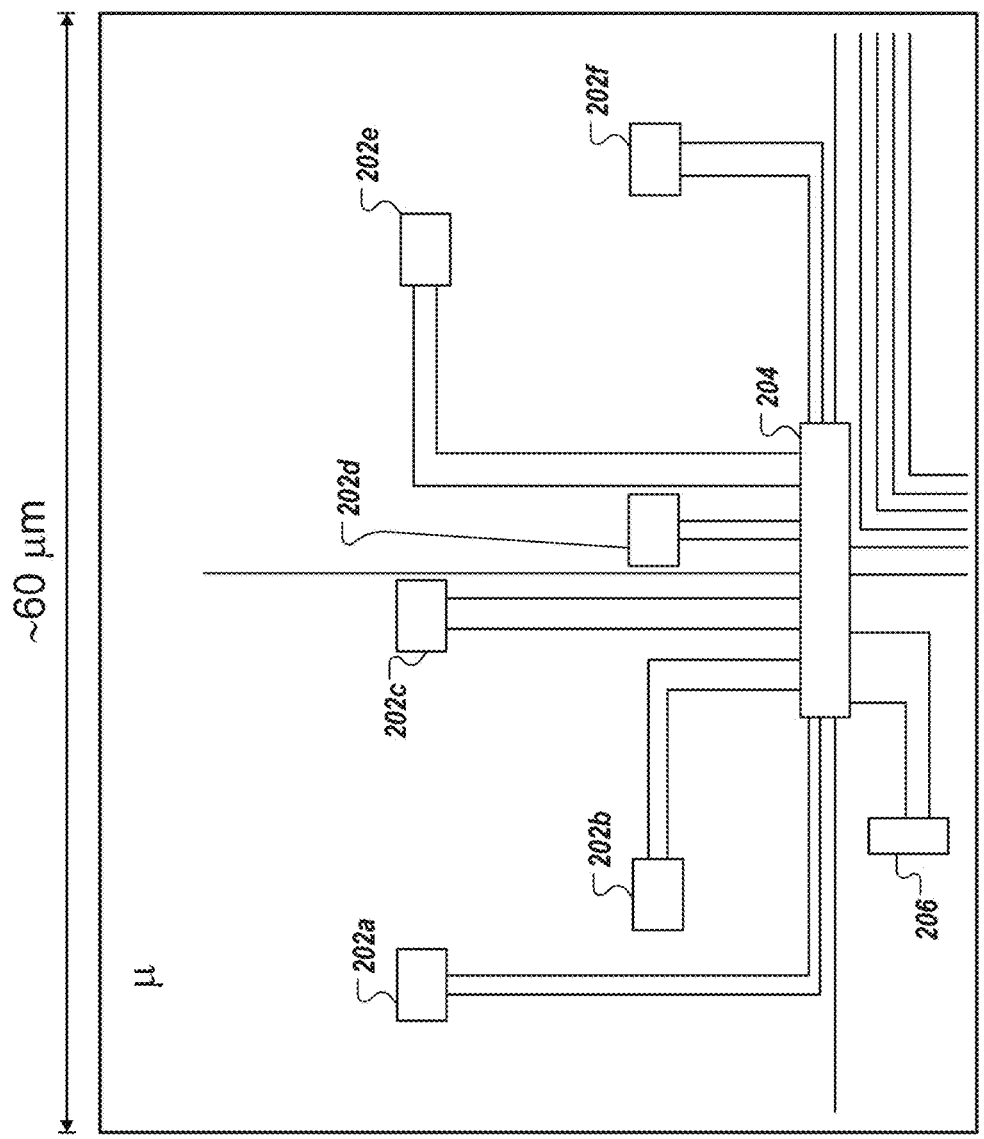
FIG. 2 is an illustration of an example pixel constructed in accordance with the disclosed technology.

FIG. 2 is an illustration of an example pixel 200 constructed in accordance with the disclosed technology. In this example, the pixel 200 has a size similar to the size of the pixel 100 shown in FIG. 1, however, the pixel 200 shown in FIG. 2 is constructed using micro-LEDs 202a-202f (collectively micro-LEDs 202). The micro-LEDs 202 can be micro-transfer printed onto a substrate, such as a transparent (including semi-transparent, virtually transparent, and mostly transparent) or flexible substrate. In some embodiments, the substrate is plastic, glass, metal, or sapphire.

Micro-assembled sparsely integrated high-performance light emitters such as micro-LEDs 202 and a driver circuit 204 (e.g., a micro integrated circuit) make bright displays that are flexible, draw less power, or occupy only a small fraction of the display substrate. In some embodiments, the additional free space facilitates locating higher-functioning devices (e.g., micro-sensor 206) on the display plane, such as devices that enable gesture sending, power harvesting, light-emitter redundancy, image capture, and wireless operation. For example, in some embodiments, a display includes a micro integrated driver circuit 204 in each pixel. Additionally, the small operational area occupied by the micro-LEDs, in some embodiments, enables the construction of transparent displays, multi-mode displays, redundant micro-LEDs and other devices, and super-bright displays.

Figure 3:
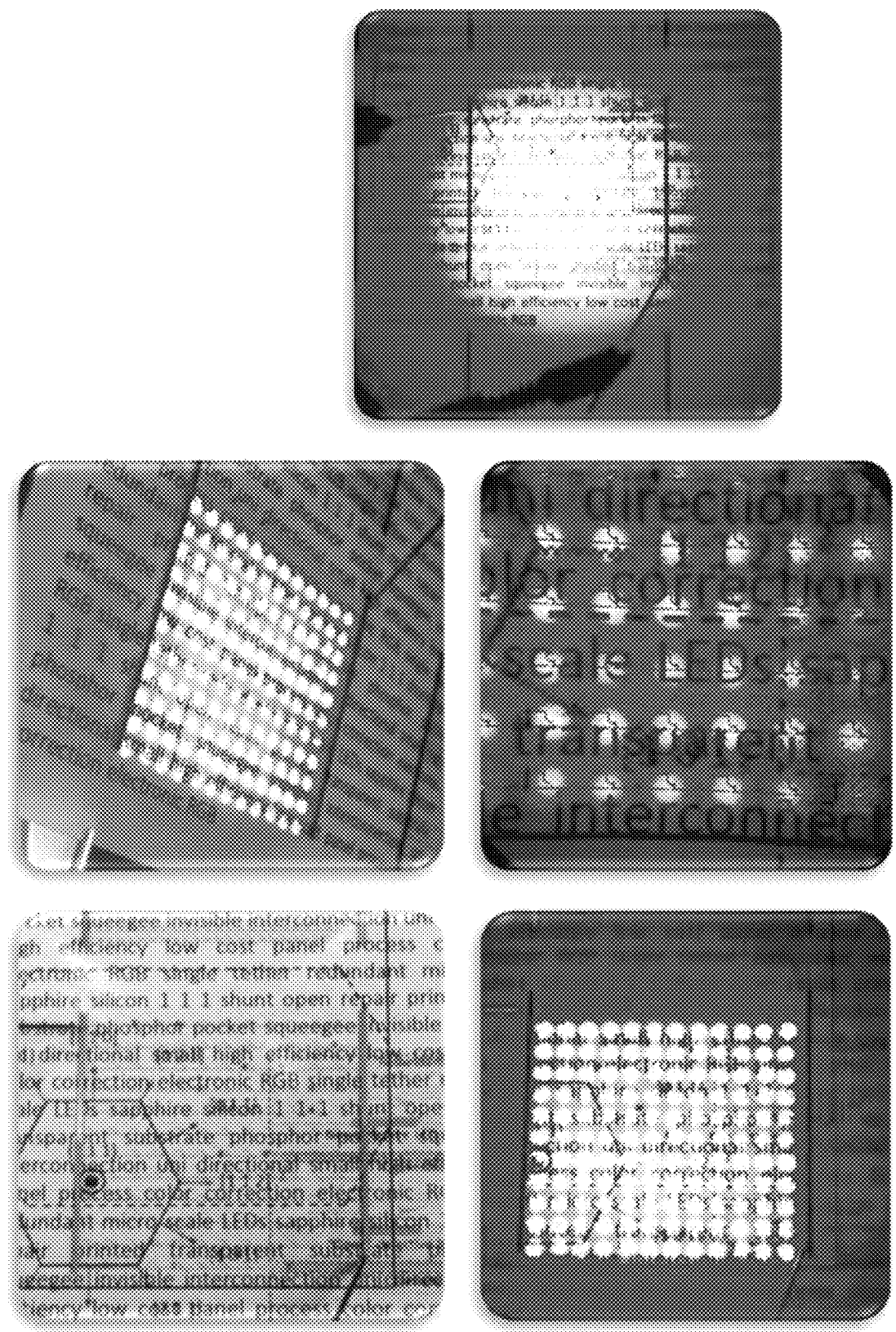
FIG. 3 is a micrograph of small micro-LEDs assembled using micro assembly on display substrates.

FIG. 3 illustrates LEDs assembled using micro assembly (e.g., micro-transfer printing) on display substrates. Small LEDs are placed on a display substrate and electrically connected in an active matrix, a passive matrix, in series, in parallel, or in some combination thereof. Micro-assembled LED displays and lighting elements exhibit many desirable properties, including superior color quality in some embodiments. They are highly efficient and have low power consumption.

As shown in this example, micro-assembled LED displays can be produced to be transparent (e.g., having a transparency greater than or equal to 50%, 80%, 90%, or 95% for visible light). Transparency can be based at least in part on fractionally low area coverage or transparency of micro-LEDs, connection features, and other constituents. The transparency is apparent in the 'off' state of the device or when viewed from certain orientations (e.g., from the side of the device opposite the viewing direction). The transparency can enable effectively invisible displays or light sources. FIGS. 49A-49G illustrate an example partially transparent display constructed using a glass substrate. In some embodiments, partial or virtual transparency is achieved without micro-assembly techniques, provided that the pixel density is sufficiently low and the intended proximity of an observer is sufficiently far.

Figure 4:
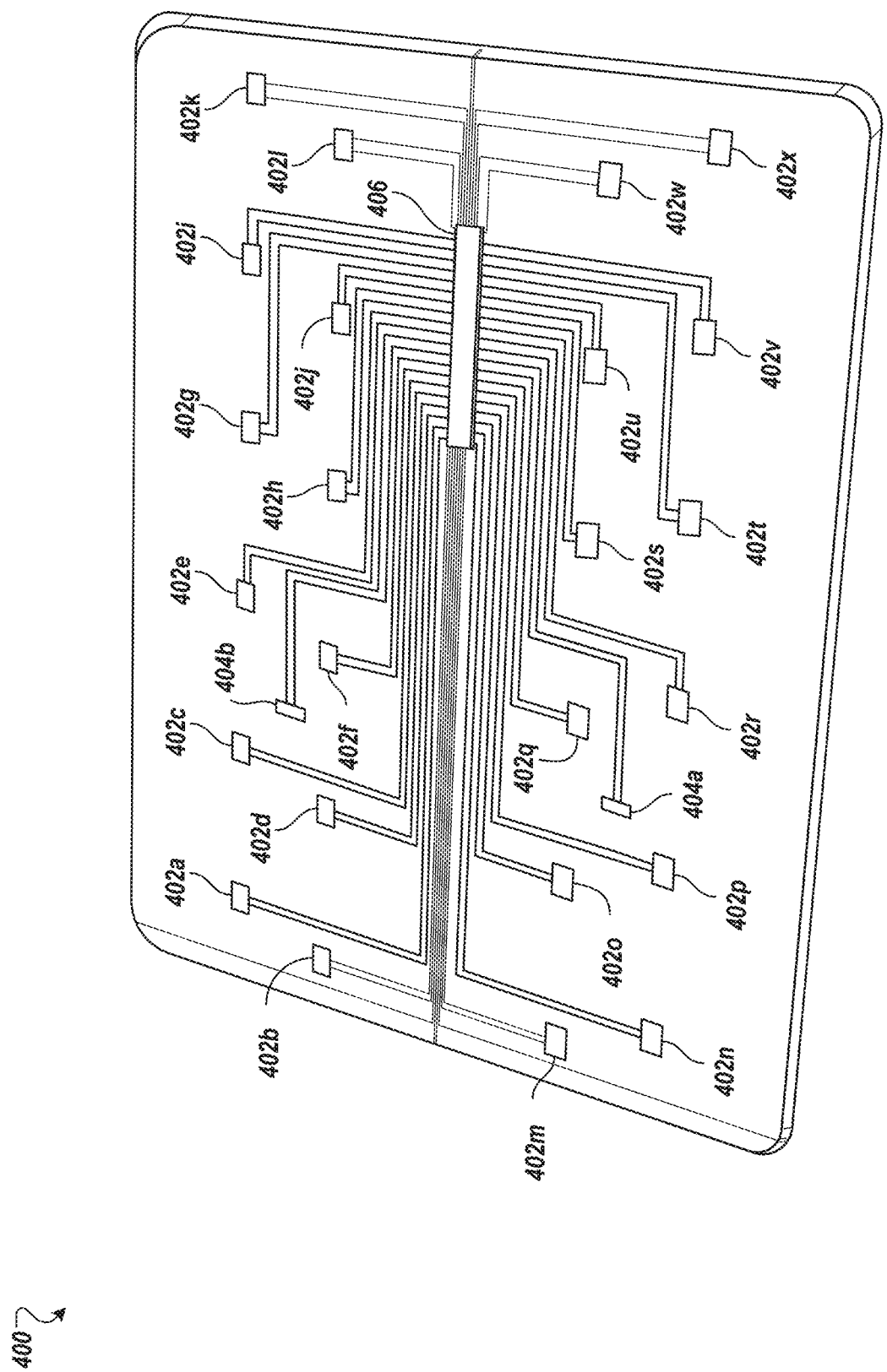
FIG. 4 is an illustration of an example micro-LED display that includes redundant RGB inorganic micro-LEDs, according to an illustrative embodiment of the invention.

FIG. 4 is an illustration of an example of a micro-LED display 400 that includes redundant RGB inorganic micro-LEDs 402a-402x, a driver circuit 406 (e.g., a micro-transfer printed integrated circuit), and micro-sensors 404a and 404b (collectively micro-sensors 404). In some embodiments, the display 400 is formed on a display substrate that can be polymer, plastic, resin, polyimide, polyethylene naphthalate, polyethylene terephthalate, metal, metal foil, glass, a semiconductor, or sapphire. The display 400 includes micro-transfer printed redundant RGB micro-LEDs 402a-402x that exhibit low power consumption while still projecting bright light. Each primary micro-LED (e.g., 402a, 402c, 402e, 402g, 402i, 402k, 402m, 402o, 402q, 402s, 402u, 402w) includes a corresponding redundant, spare micro-LED (e.g., 402b, 402d, 402f, 402h, 402j, 4021, 402n, 402p, 402r, 402t, 402v, 402x, respectively). The sparsely integrated micro-LEDs 402 allow other functional devices to be placed within each pixel, such as micro-sensors 404a and 404b, power harvesting devices, gesture sensors, or image-capture devices.

Micro integrated driver circuits 406 (e.g., CMOS circuits) can be micro-transfer printed to drive the micro-LEDs 402. The micro integrated driver circuits 406 can include embedded memory (e.g., non-volatile memory). Memory can be used to display static images without constantly needing to refresh the display (e.g., thereby saving power). The memory can also store a lookup table(s) used, for example, to adjust the output of micro-LEDs in the display. In some embodiments, each pixel has a micro integrated driver circuit 406 located thereon to drive each micro-LED in the respective pixel.

In addition to emitting light from the front of the display 400, the micro-LEDs 402a-402x can also emit light from the back of the display 400. The display 400 can include an adhesive layer on one side, producing a decal-like display. The wiring used in the display, such as the wiring used to electronically couple the micro-LEDs 402 and micro-sensors 404 to the integrated driver circuit 406, can be fine wires (e.g., with critical dimensions less than 1 μm and an overlay accuracy of less than 0.25 μm) or transparent wires.

Figure 7:
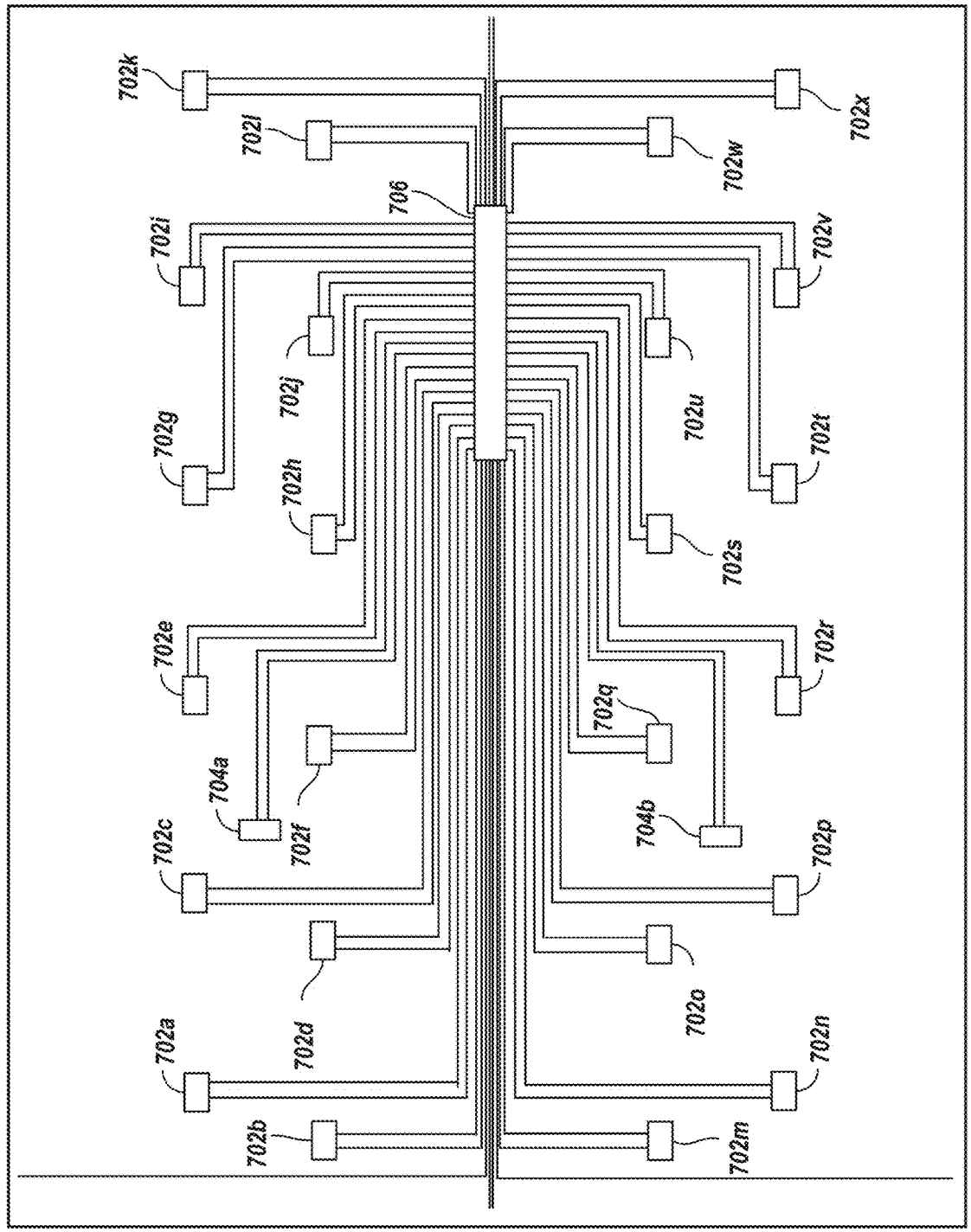
FIG. 7 is an illustration of a micro-assembled display that includes redundant RGB inorganic micro-LEDs, a driver IC, and micro-sensors, according to an illustrative embodiment of the invention.

FIG. 7 is an illustration of a micro-assembled display 700 that includes primary and redundant RGB inorganic micro-LEDs 702a-702x (collectively micro-LEDs 702) arranged in pairs of primary and redundant inorganic micro-LEDs, a driver IC 706, and micro-sensors 704a and 704b (collectively micro-sensors 704) on a substrate. The substrate can be transparent or flexible. A lookup table can be used to electronically produce a visually perfect display by providing extra light from one micro-LED of a redundant pair (e.g., micro-LEDs 702a and 702b) in the event that its mate is non-functional. For example, if micro-LED 702a is non-functional, the driver 706 can cause micro-LED 702b to be activated to compensate for micro-LED 702a. In another example, if all of the micro-LEDs are being driven to provide a high-resolution display, micro-LED 702b can be driven to provide extra light (e.g., brighter) to compensate for micro-LED 702a if micro-LED 702a is non-functional.

Figure 5:
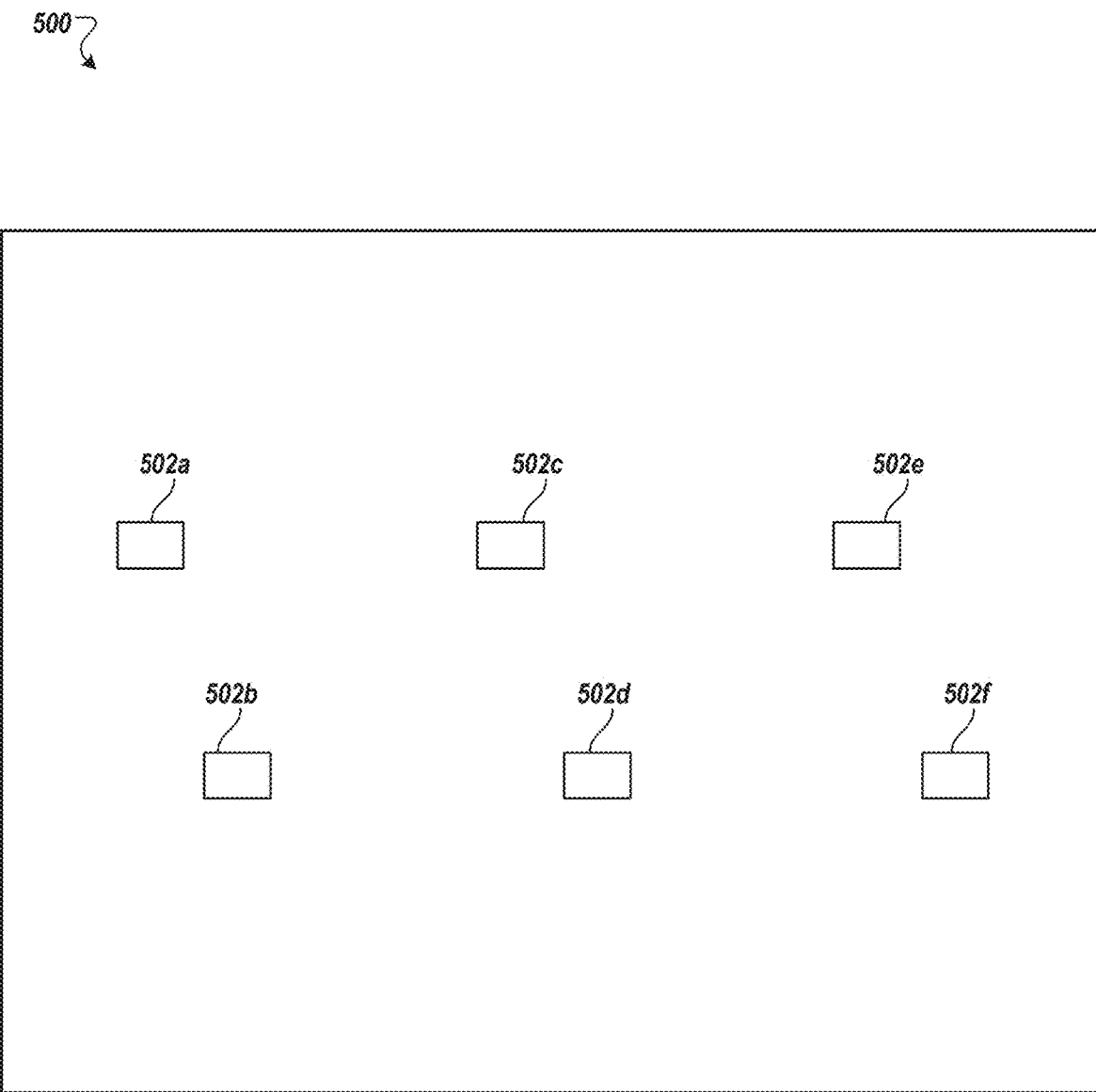
FIG. 5 is an illustration of an example pixel in accordance with the disclosed technology.

FIG. 5 is an illustration of an example pixel 500 in accordance with the disclosed technology. As explained above, small micro-LEDs 502 allow for redundancy (e.g., the LEDs with at least one of a width, length, and height from 2 to 5 μm, 5 to 10 μm, 10 to 20 μm, 20 to 50 μm. 50 to 100 μm, or 100 to 250 μm Redundancy can produce a visually perfect display and account for malfunctioning micro-LEDs (e.g., displays produced with electrically shorted or open micro-LEDs). In some embodiments, if one micro-LED is defective or missing, this will be corrected by the external drive electronics. For example, each micro-LED (e.g., 502a, 502c, and 502e) can have a corresponding spare or redundant micro-LED (e.g., 502b, 502d, 502f, respectively), thereby providing two interlaced displays—a primary display and a secondary display that can be activated on an individual micro-LED basis. In some embodiments, both the primary and secondary micro-LEDs are wired to the display or integrated circuits. In some embodiments, the redundant micro-LEDs are wired on an individual basis after testing the display. In this example, the red primary micro- LED 502a has a corresponding redundant red micro-LED 502b, the blue LED 502c has a corresponding redundant blue micro-LED 502d, and the green LED 502e has a corresponding redundant green micro-LED 502f.

Each micro-LED can have its own pixel driver (e.g., transistor circuit). This can be used to form high-resolution displays. The micro-LEDs can be chosen to operate in many different modes, such as a normal operation mode or a high-resolution mode. This provides a tunable resolution (e.g., more light emitters can be activated to provide a higher resolution display as needed) that can be set automatically (e.g., based on the material being viewed on the display) or by a user.

In some embodiments, the display has a tunable brightness dynamic range. If more emitters are turned on, the display will be brighter. This is useful for a variety of applications, including improving daylight readability or in bright ambient environments. The display can also be used to form a color-tunable flash by activating a mix of micro-LEDs (e.g., to provide a warm light glow). Alternatively, the micro-LEDs can be provided in a dense pattern to increase the intensity of the flash.

Redundant pairs of micro-LEDs can be connected physically in series or parallel, before or after a repair operation. Physical repair can include laser cutting of unwanted electrical traces, direct writing of electrical traces by chemical vapor deposition or laser-assisted chemical vapor deposition or inkjet printing. Redundant pairs of micro-LEDs can be electrically independent and operate independently. Displays can also employ redundant drive circuitry and display control elements for improved information display fidelity or to facilitate the production of visually perfect displays.

Figure 6:
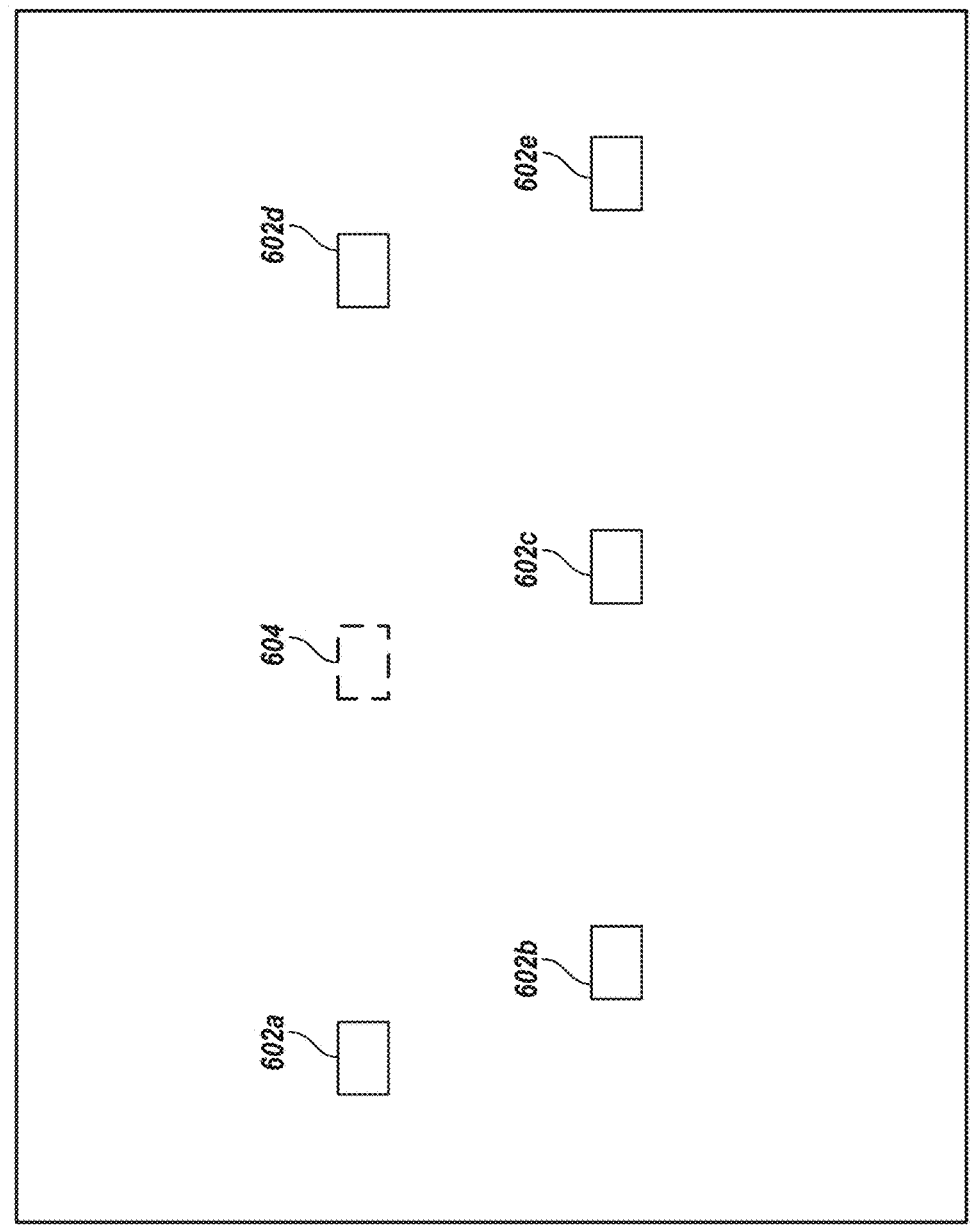
FIG. 6 is an illustration of an example pixel of a display with a missing micro-LED, according to an illustrative embodiment of the invention.

FIG. 6 is an illustration of an example multi-color pixel 600 of a display with a missing micro-LED 604. In this example, the pixel 600 is designed to include a primary set of RGB micro-LEDs—red micro-LED 602a, green micro-LED 604, and blue micro-LED 602d—and a spare set of RGB micro-LEDs—red micro-LED 602b, green micro-LED 602c, and blue micro-LED 602e. However, in this case, the primary green micro-LED 604 is missing or non-operational while the primary blue 602d and red 602a micro-LEDs are present and operational. The primary green micro-LED 604 may have been unintentionally omitted (e.g., because of a printing error), it may have been removed after printing because it was a defective micro-LED, or it can be present but non-functional (e.g., open). The spare green micro-LED 602c can supplement the omitted primary green micro-LED 604. The spare red and blue micro-LEDs can be turned off as the primary red and blue micro-LEDs 602a, 602d are operational. In some embodiments, electronic circuits sense missing or defective micro-LEDs and activate the corresponding spare micro-LED. The driving circuits for the display can sense defective micro-LEDs. In some embodiments, the defective micro-LEDs are sensed by a detection circuit that is separate from the display. Defective micro-LEDs can be removed or disconnected. In some embodiments, replacement micro-LEDs are connected to replace the defective micro-LEDs. In some embodiments, the replacement micro-LEDs are already connected and the defective micro-LEDs must just be removed or disconnected if necessary. In some embodiments, both the primary and redundant micro-LEDs are connected to the display circuit and the driving circuit(s) merely drives the appropriate redundant spare micro-LEDs if a primary micro-LED is defective.

Figure 8A:
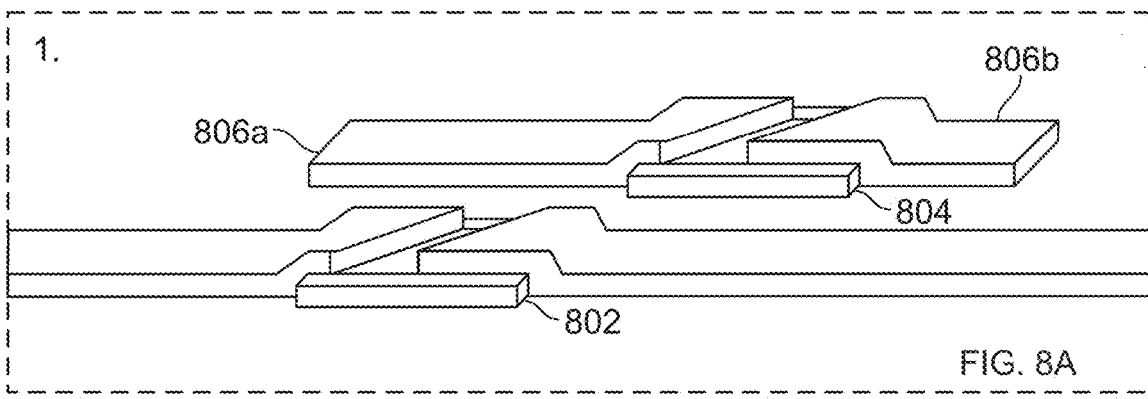
FIGS. 8A through 8D are illustrations of redundant micro-LEDs in a micro-LED panel for micro-assembled displays and lighting elements, according to an illustrative embodiment of the invention.
Figure 8B:
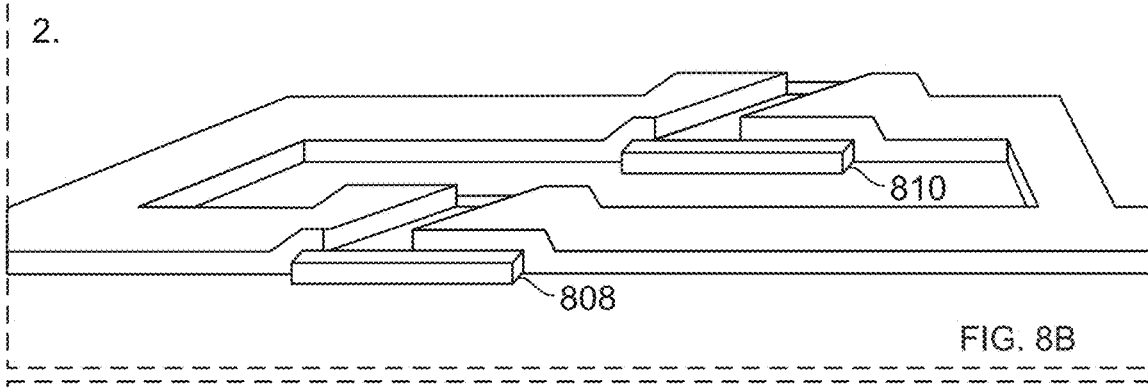
Figure 8C:
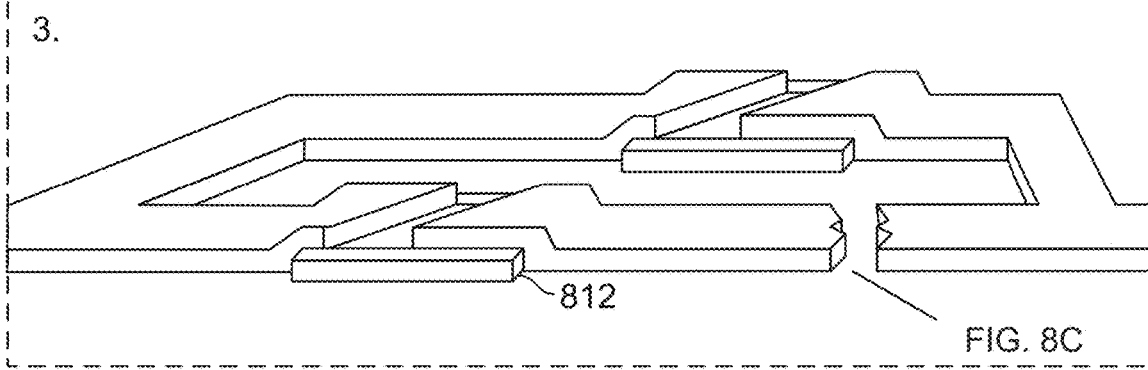
Figure 8D:
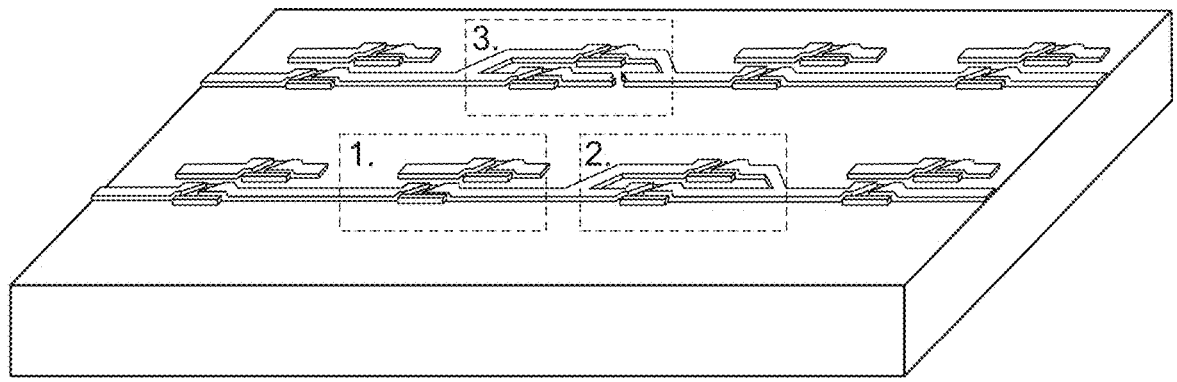

FIGS. 8A through 8D illustrate redundancy of micro-LEDs in a micro-LED panel for micro-assembled displays and lighting elements. FIGS. 8A through 8C are enlarged illustrations of the identified regions of the device shown in FIG. 8D. Redundant micro-LEDs in a micro-assembled micro-LED panel provide defect tolerance and facilitate the formation of visually perfect displays and lighting elements. During a first connection step, as illustrated in in FIG. 8A, some fraction of the micro-LEDs (e.g., micro-LED 802) are connected to form circuits, whereas the remaining micro-LEDs (e.g., micro-LED 804) are left disconnected from the circuit and form redundant micro-LEDs (e.g., back up, spare, or replacement micro-LEDs that can be used to compensate for or replace defective primary micro-LEDs). In some embodiments, when the connection to micro-LED 802 is formed, electrically conductive contact features 806a and 806b are formed to the redundant device 804 even though the redundant device 804 is not connected to the greater circuit that includes the micro-LEDs 802. Testing procedures can be used to identify defective micro-LEDs or groups of micro-LEDs that are unintentionally disconnected from the circuit (e.g., "open") or unintentionally shorted. As shown in FIG. 8B, by directly and physically writing electrical traces, redundant micro-LEDs (e.g., micro-LED 810) that are in close proximity to defective non-redundant micro-LEDs (e.g., micro-LED 808) are connected to the circuit. In some embodiments, electrically shorted non-redundant micro-LEDs (e.g., micro-LED 812) are similarly disconnected from the circuit as shown in FIG. 8C using, for example, ablation. In some embodiments, the defective, non-redundant LED (e.g., 812) is not disconnected after connecting the corresponding redundant LED to the display circuit.

Figure 9C:
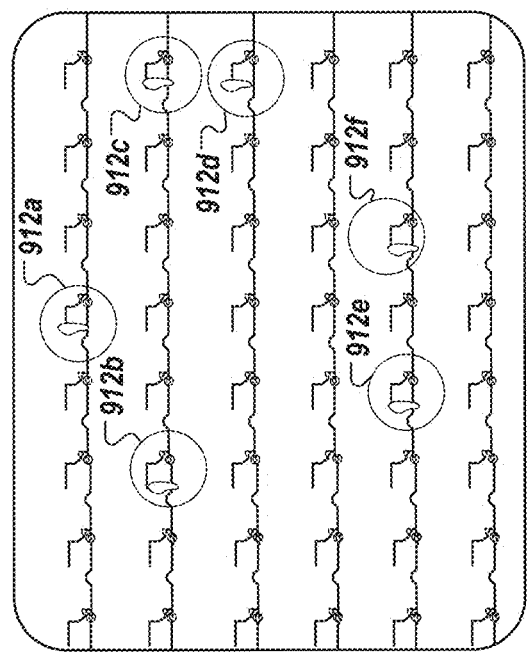
FIGS. 9A through 9C are schematics that illustrate a micro-transfer printed array of micro-LEDs on glass, according to an illustrative embodiment of the invention.
Figure 9B:
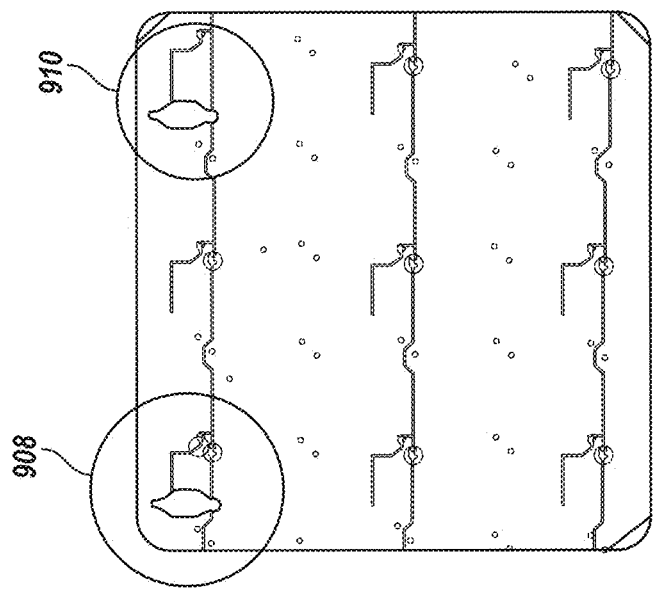
Figure 9A:
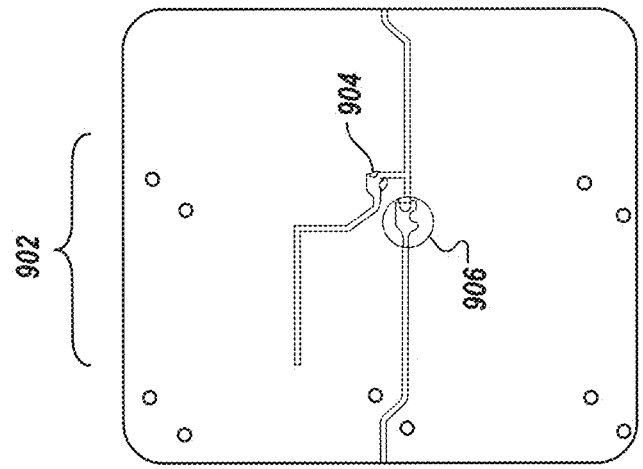

FIGS. 9A through 9C are images that illustrate a micro-transfer printed array of micro-LEDs on a display substrate, such as glass. Each pixel 902 includes a primary micro-LED 906 and a spare micro-LED 904 that can be connected after testing the display. Upon identification of an open pixel, for example, because of a missing or defective micro-LED, the spare micro-LED can be connected as shown in FIG. 9B (e.g., pixel 908 has a faulty primary micro-LED and a connected redundant micro-LED and pixel 910 has a missing primary micro-LED and a connected redundant micro-LED) and FIG. 9C. In this example, ink jet printing of colloidal silver particles serves as a direct write method to connect the spare micro-LEDs, as shown in FIG. 9B. In some embodiments, unused redundant micro-LEDs are removed from the display. In some embodiments, the defective primary micro-LEDs are removed or disconnected (e.g., before or after connecting a corresponding redundant micro-LED). In some embodiments, defective primary micro-LEDs are disconnected or removed if the defect is such that the micro-LED is shorted (e.g., if the defect is such that the defective primary micro-LED is open it may not be necessary to remove that micro-LED). In the example shown in FIG. 9C, the display includes 48 pixels, each including a primary micro-LED and a redundant micro-LED as shown in FIG. 9A. Pixels 912a-912f each include a defective primary micro-LED and thus a redundant micro-LED has been electrically connected to the display circuit to compensate/replace each of these defective primary micro-LEDs.

Figure 10:
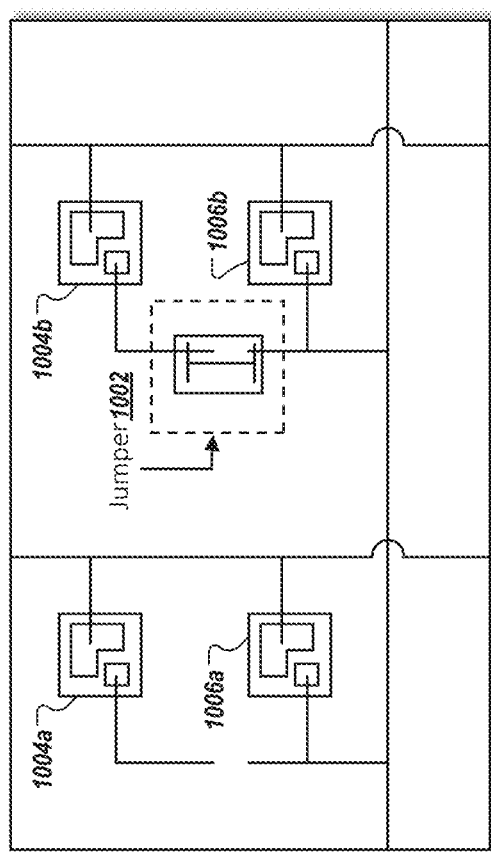
FIG. 10 is an illustration of an example structure for repairing micro-LED array devices using micro-assembled jumpers, according to an illustrative embodiment of the invention.

FIG. 10 is an illustration of an example method for repairing micro-LED array devices using micro-assembled jumpers to electrically connect a redundant micro-LED 1004b because a primary micro-LED 1006b is defective. A conductive jumper element 1002 can be placed by micro assembly (e.g., micro-transfer printing) for repairing a micro-LED array device by establishing an electrical connection to a spare, redundant micro-LED 1004b. In some embodiments, a conductive structure is prepared for micro assembly and assembled, thereby electrically connecting a redundant micro-LED 1004 to the display circuit. A connection between traces on the micro-LED array device is established thereby connecting a redundant micro-LED 1004b to the rest of the connected array. Electrical connection can be established by solder reflow, or contact between clean metal surfaces using, for example, a jumper 1002 (e.g., gold-gold interfaces).

As shown in this example, a jumper 1002 is used to connect redundant micro-LED 1004b to effectively replace defective primary micro-LED 1006b. Redundant micro-LED 1004a is not connected in this example because primary micro-LED 1006a is functioning properly. In some embodiments, redundant micro-LED 1004a is connected at a later time if primary micro-LED 1006a fails. In some embodiments, unused redundant micro-LEDs (e.g, micro-LED 1004a) are removed from the display. In some embodiments, the defective primary micro-LEDs (e.g., micro-LED 1006b) are removed (e.g., before or after connecting a corresponding redundant micro-LED). In some embodiments, defective primary micro-LEDs (e.g., 1006b or primary micro-LEDs discussed in other embodiments) are removed if the defect is such that the micro-LED is shorted (e.g., if the defect is such that the defective primary micro-LED is open it may not be necessary to remove that micro-LED).

Non-functional micro-LEDs can be sensed in a number of ways. For example, a camera can be used to detect light emitted from one or more micro-LEDs. The camera can be specific to a certain color spectrum. In some embodiments, the camera is a light sensor incorporated into the display panel (e.g., a micro-sensor micro-assembled in or on the same plane or surface as the micro-LEDs). The micro light sensor, in some embodiments, is connected to the micro integrated circuit (e.g., that forms the display driver for a pixel or the display). The light sensor signal, in some embodiments, is interpreted by the micro integrated circuit. The micro integrated circuit can drive a secondary micro-LED in the situation in which a primary micro-LED is nonfunctional. In some embodiments, the micro integrated circuit will not drive the defective/non-functional micro-LEDs. The micro integrated circuit can also alter how it drives a primary micro-LED in certain situations to ensure that the appropriate color is output by the micro-LED (e.g., the correct shade of red). In some embodiments, the display can perform this analysis and correction after it is manufactured and used by a consumer. This can increase the lifespan and quality of displays.

Figure 11A:
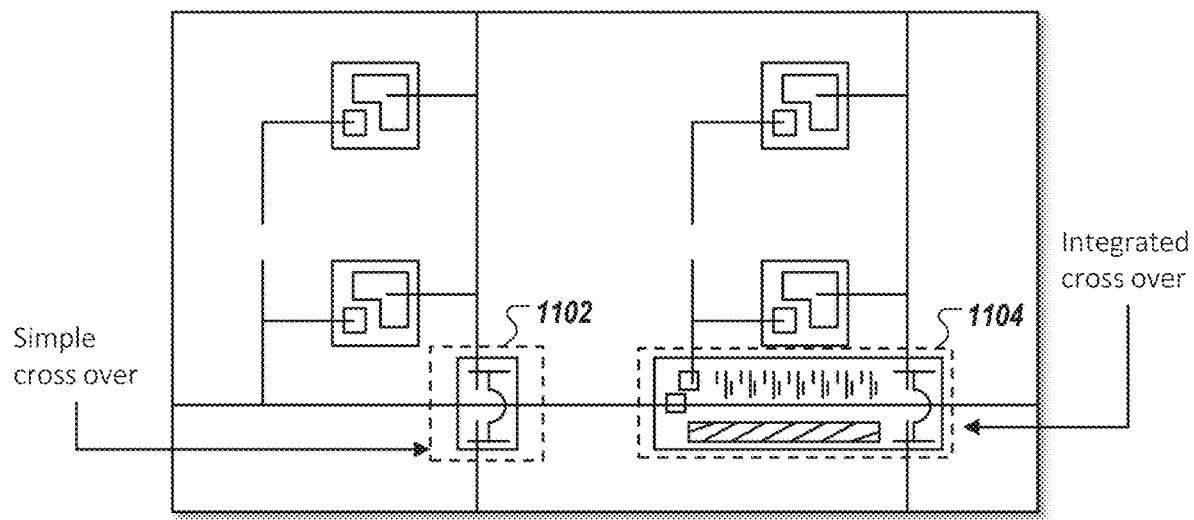
FIGS. 11A and 11B illustrate micro-assembled crossovers for layer reduction in micro-LED array devices, according to an illustrative embodiment of the invention.
Figure 11B:
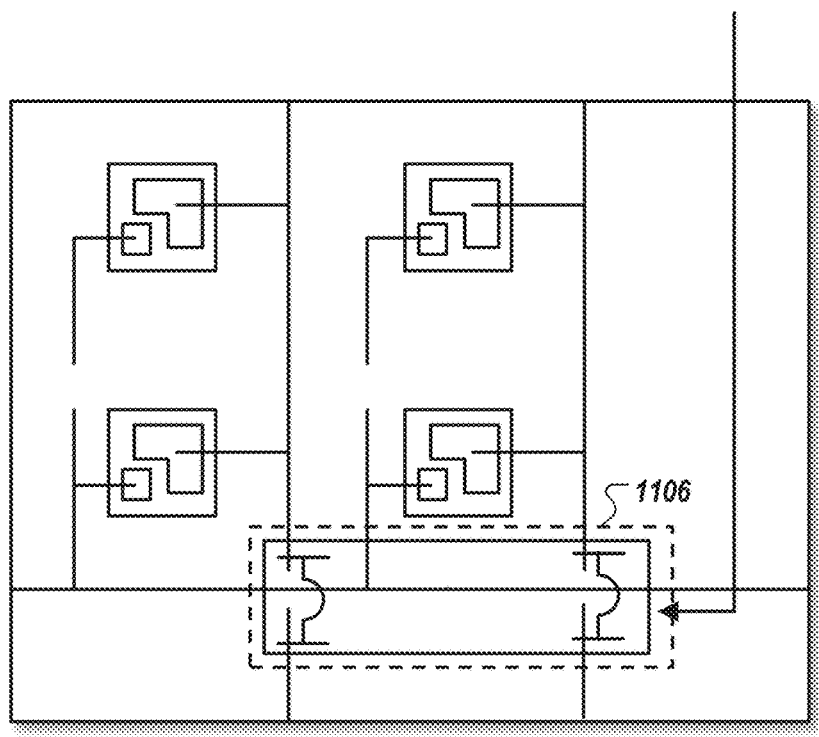

FIGS. 11A and 11B illustrate micro-assembled cross-overs 1102, 1104, and 1106, for layer reduction in micro-LED array devices. Reducing the number of process steps to be performed on the micro-LED device is often advantageous. Additionally, some micro-LED devices, such as those utilizing active- or passive-matrix architectures, benefit from or require cross-over of data or power lines and traces. A typical way to accomplish this kind of cross-over is to pattern a dielectric layer with electrically conductive vias between two metal layers to electrically connect the two metal layers. However, this increases the cost of micro-LED devices by adding additional steps to the processing of the display substrate.

Providing electrical cross-over by micro assembly (e.g., cross-overs 1104 and 1106) provides a way to eliminate the large-area processing steps of providing the dielectric layer and the second metal layer, thereby reducing costs by supplying the cross-over in an area-dense configuration on a native substrate and micro assembling the cross-over on the device substrate in a less-dense configuration. Micro-LED devices that use cross-overs assembled in this way (e.g., cross-overs 1102, 1104, and 1106) can also benefit from redundancy for defect tolerance in the micro-LED array device by providing redundant wires and a method for forming electrical connections across defective, open wires.

This type of layer reduction can be accomplished by a simple passive device 1102, such as a conductive jumper as described in relation to FIG. 13 below, or an integrated device 1104 that include cross-overs and, for example, other functionalities such as CMOS drive circuitry and/or non-volatile memory housed within a structure suitable for micro assembly. In some embodiments, the structure suitable for micro assembly includes more than one cross-over, each cross-over having electrical insulation between it and at least one other cross-over housed in the structure suitable for micro assembly.

Figure 12B:
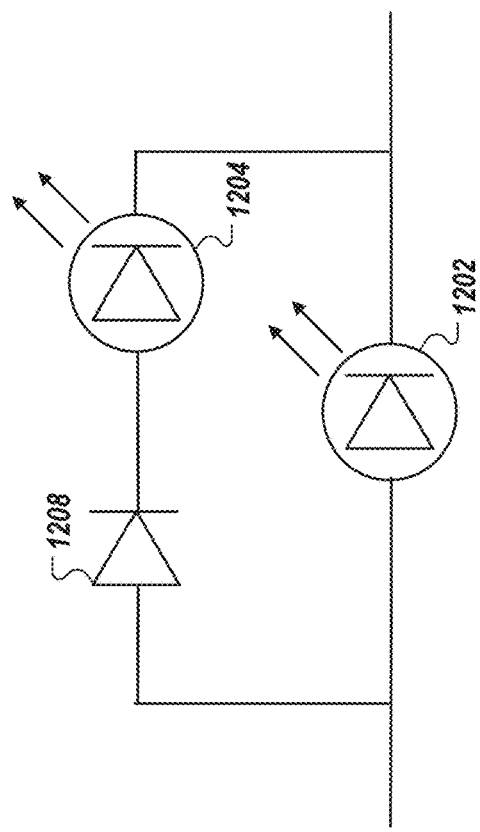
FIGS. 12A and 12B are illustrations of example circuits using a resistor and a diode to facilitate repair by providing an electrical signature of a redundant micro-assembled micro-LED pixel or sub-pixel in a lighting element or display, according to an illustrative embodiment of the invention.
Figure 12A:
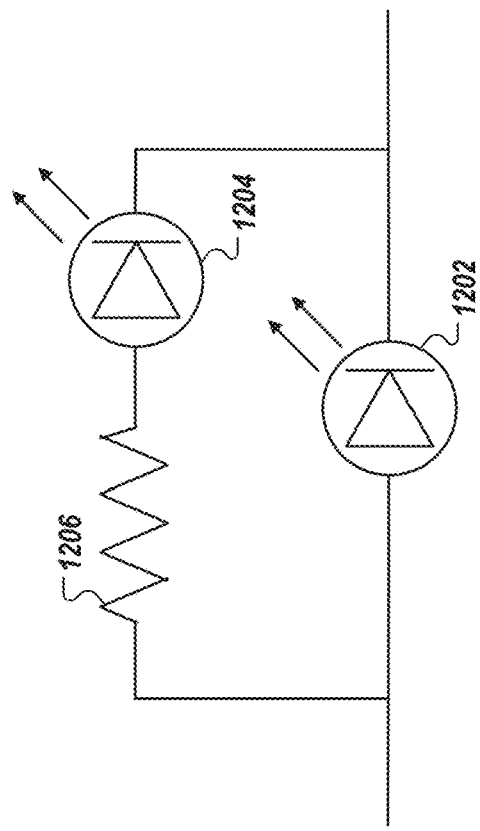

FIGS. 12A and 12B are illustrations of example systems that use a resistor 1206 or diode 1208, respectively, to facilitate repair by providing information in the form of the electrical signature of a redundant micro-assembled micro-LED pixel or sub-pixel in a lighting element or display. In some embodiments, pixels or sub pixels are provided with a spare micro-LED 1204 wired by default in parallel with each primary micro-LED 1202 of a pixel or sub pixel. For example, a repair for this embodiment can consist of severing connections to shorted micro-LEDs without providing additional directly written metal features to connect the spares. In some embodiments, each pixel or sub pixel that includes a spare micro-LED 1204 wired by default in parallel with a primary micro-LED 1202 also includes a resistor 1206 or diode 1208 in series with the spare micro-LED 1204, as shown in FIGS. 12A and 12B, respectfully.

As shown in FIG. 12A, in some embodiments, a resistor 1206 is placed in series with a spare micro-LED 1204. In this example, a severely shorted primary micro-LED 1202 will exhibit an electrical signature (a current-voltage relationship) that shows a resistance less than the resistor 1206 in series with the spare micro-LED 1204. A severely shorted spare micro-LED 1204 will show a resistance not less than the resistor in series, thereby providing an electrical signature that informs the repair process of which micro-LED, the primary 1202 or spare 1204, needs to be disconnected from the array in order to form a visually perfect micro-assembled micro-LED display or lighting element. As illustrated in FIG. 12B, a diode 1208 in series with the spare micro-LED 1204 will inform which micro-LED needs repair in a shorted sub-pixel based on turn-on voltage signatures.

Figure 13:
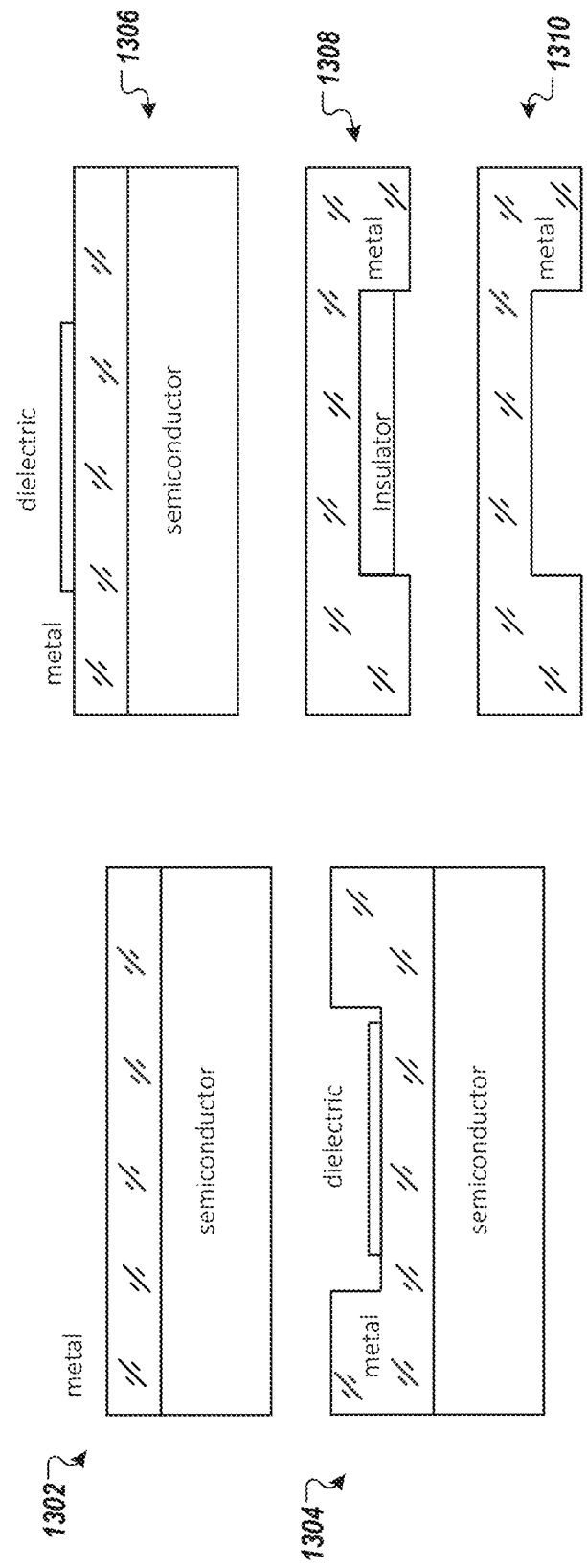
FIG. 13 illustrates electrical connectors suitable for micro assembly, according to an illustrative embodiment of the invention.

FIG. 13 illustrates cross-sectional views of five different types of electrical connectors 1302, 1304, 1306, 1308, 1310 or "jumpers" suitable for micro assembly. In some embodiments, the electrical connectors include exposed noble metal surfaces, including gold, silver, or platinum. In some embodiments, the electrical connectors include exposed metal surfaces including copper, stainless steel, aluminum, titanium, nickel, or chromium. In some embodiments, the electrical connectors include solders, like PbSn, AgSn, AgSn, or alloys thereof, or other solder alloys.

In some embodiments, the connectors (such as 1302) are formed on a native substrate, such as silicon, SOI, GaAs, polymer, or glass, and released from the native substrate by etching a sacrificial layer. The connectors can be transferred to an intermediate stamp or substrate in order to invert them. The connectors can include metals only (e.g., connector 1310).

Figure 38:
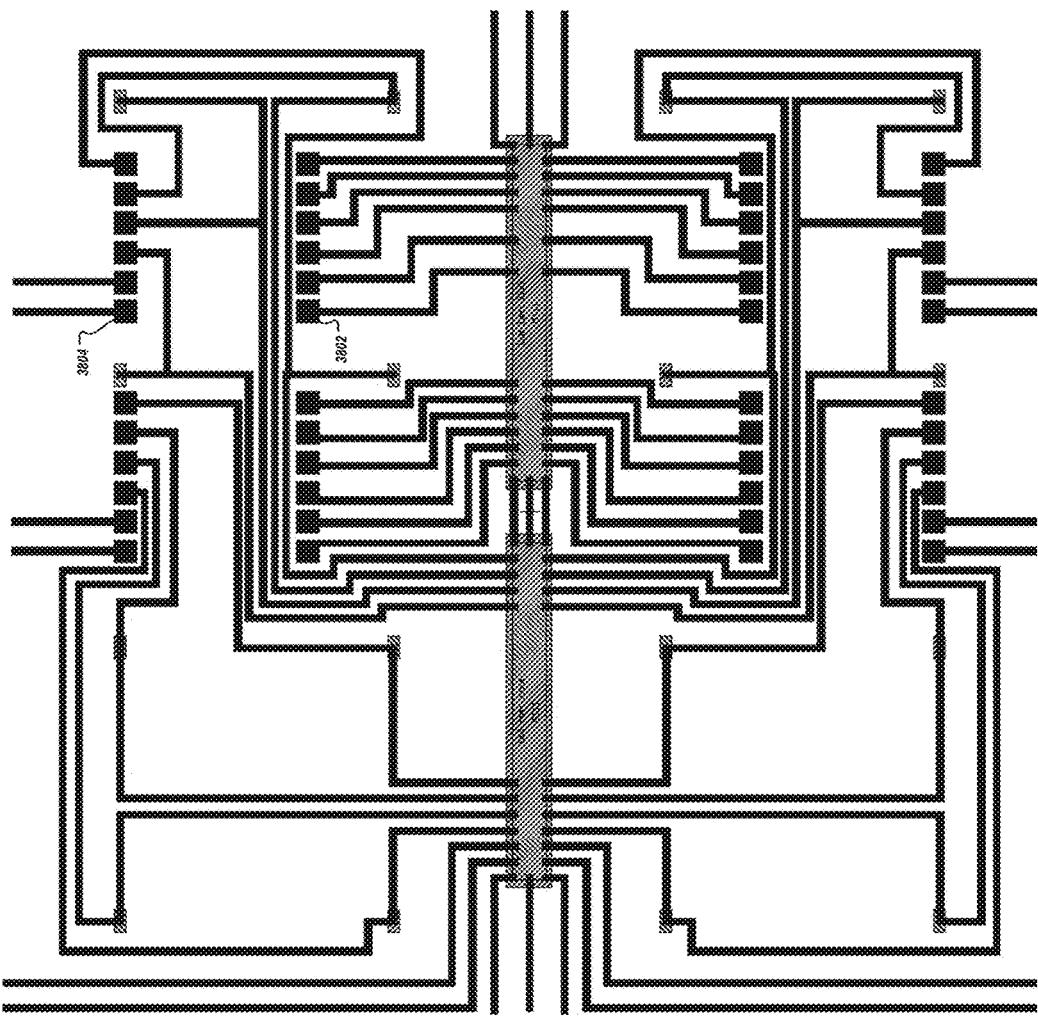
FIG. 38 is an illustration of a control element designed to have built-in redundancy, according to an illustrative embodiment of the invention.

In some embodiments, the connectors must "jump" or pass over wires to connect to points. For example, a jumper can be used to connect pad 3802 to pad 3804 as shown in FIG. 38, however, the jumper must not conductively contact the wires passing between these pads. In these cases, various designs can be used to ensure that the appropriate wires are passed ("jumped") over and not shorted. For example, connectors 1304 and 1306 include metals and dielectrics. The dielectric material can pass over the wires that are not intended to be connected by the connector, thereby ensuring these wires are not shorted to the connector or the pads 3802 and 3804. Referring back to FIG. 13, a portion of the connector can be recessed such that the wires between two jumper pads are not contacted as shown by connectors 1304, 1308, and 1310. Similarly, as illustrated by connector 1308, an insulator can be used to prevent the jumper from conductively contacting the wires passing between two pads (e.g., pads 3802 and 3804 as shown in FIG. 38).

Additionally, the connectors can include a combination of more than one of metals, polymers, inorganic dielectrics, semiconductors and semi-insulating semiconductors. The connector can have an electrically insulating exposed surface positioned between two exposed electrically conductive regions of a surface.

Figure 14:
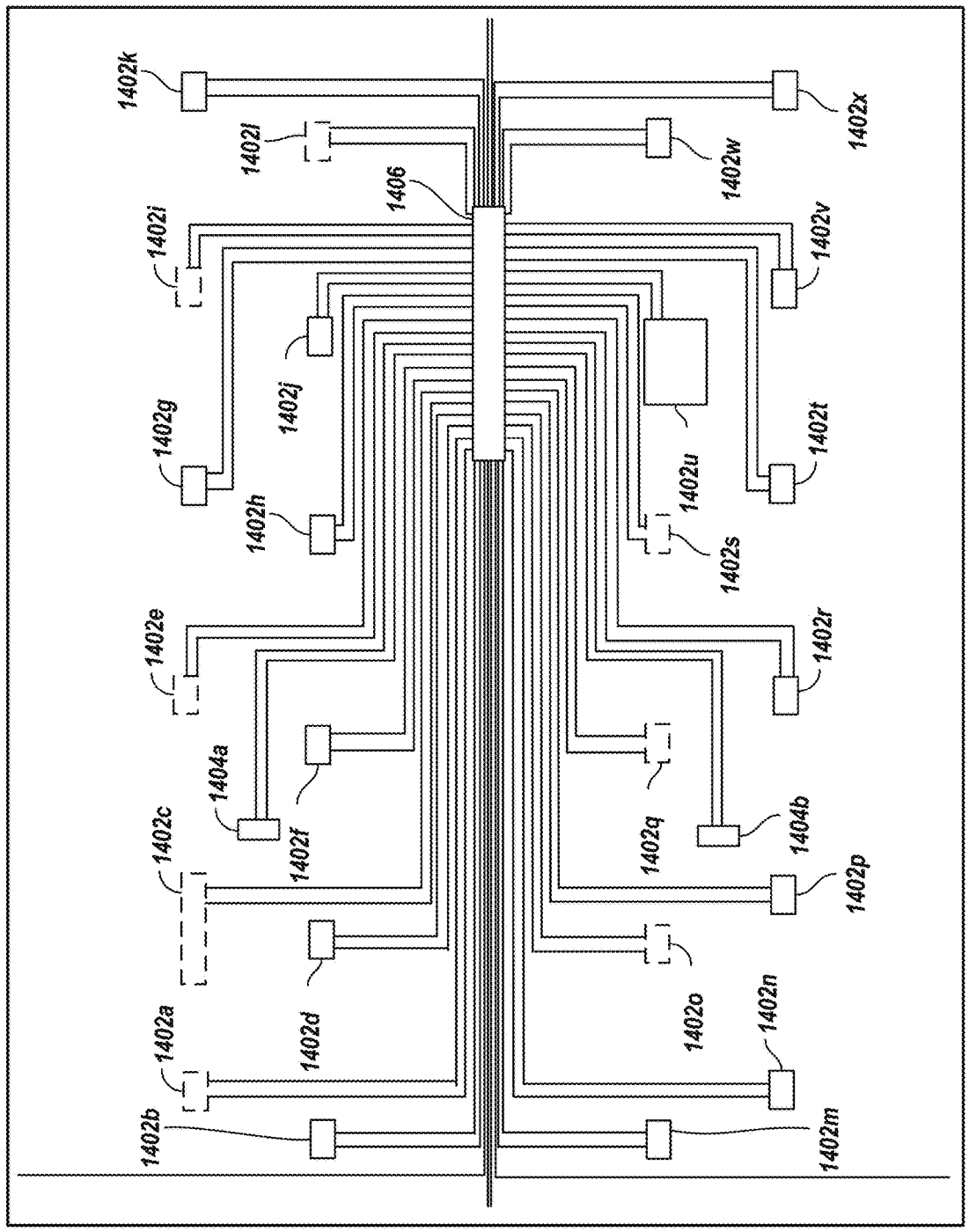
FIG. 14 is an illustration of a micro-assembled display that includes supplementary RGB inorganic micro-LEDs, according to an illustrative embodiment of the invention.

FIG. 14 is an illustration of a micro-assembled display 1400 that includes primary RGB inorganic micro-LEDs (e.g., micro-LEDs 1402g, 1402k, 1402m, 1402o, 1402u, and 1402w) and supplementary RGB inorganic micro-LEDs (e.g., micro-LEDs 1402b, 1402d, 1402f, 1402h, 1402j, 402n, 1402p, 1402r, 1402t, 1402v, and 1402x). In some embodiments, some but not all of the pixels in this display include multiple R, G, or B micro-LEDs to augment the brightness of the display for extra-bright flashes of light or camera flashes or daylight viewability. For example, micro-LEDs 1402a, 1402c, 1402e, 1402i, 14021, 1402o, 1402q, and 1402s are indicated but omitted in the example shown in FIG. 14. These omitted micro-LEDs can be intentionally or unintentionally omitted. For example, they may not have been printed or they may have been removed because they were defective.

Some of the supplementary micro-LEDs can be different shapes, sizes (e.g., micro-LED 1402u), or colors than the other micro-LEDs in the display. A lookup table can be used to facilitate image and lighting quality optimization for all conditions. In some embodiments, the display includes a micro integrated circuit 1406 and micro-sensors 1404 as described above. For example, each pixel can include a micro integrated circuit 1406 and one or more micro-sensors 1404.

Figure 15A:
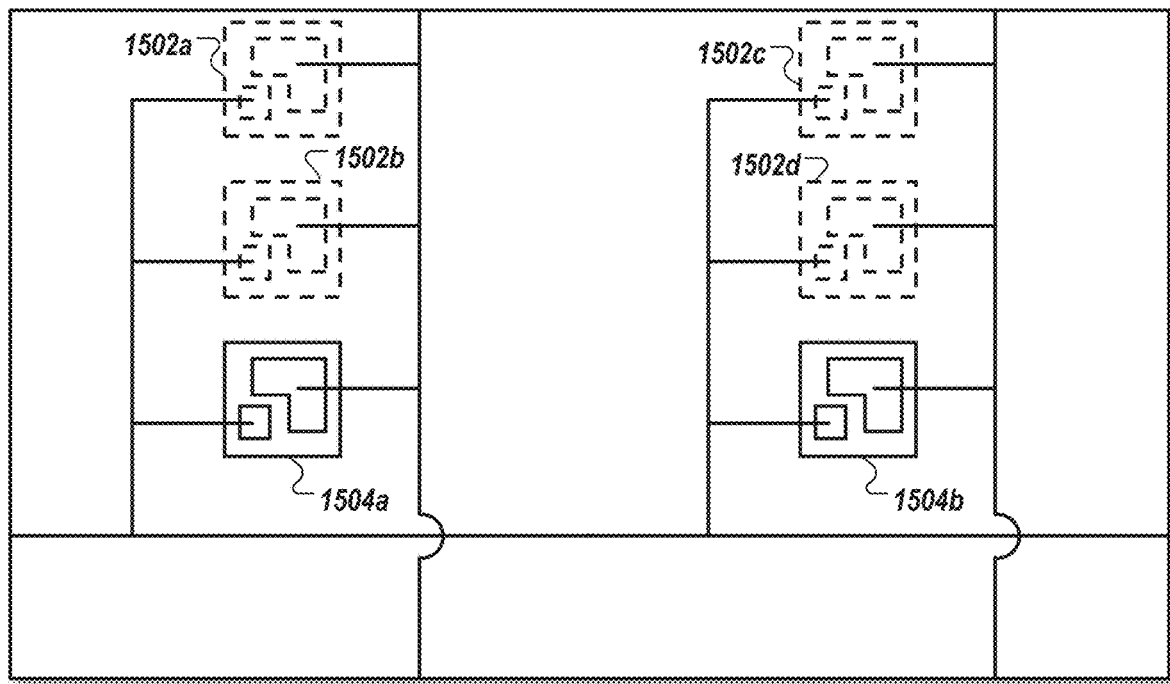
FIGS. 15A and 15B are illustrations of micro-assembled micro-LED display and lighting element architectures, according to an illustrative embodiment of the invention.
Figure 15B:
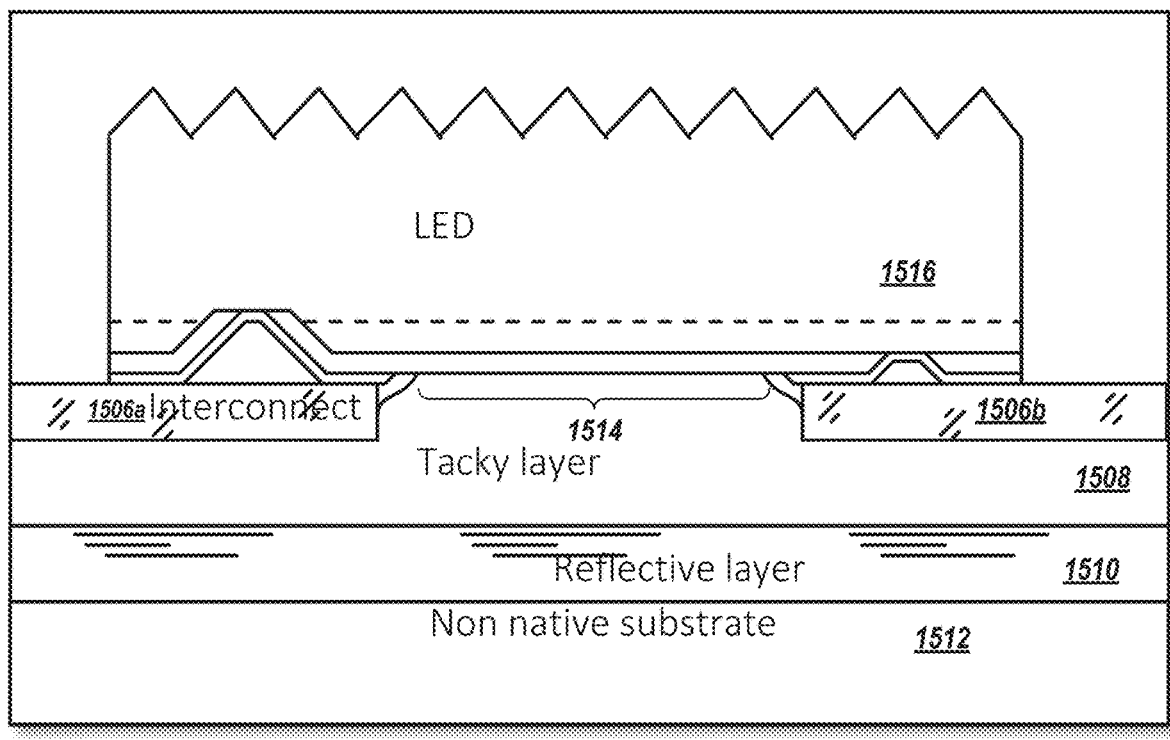

FIGS. 15A and 15B are illustrations of micro-assembled micro-LED display and lighting element architectures. In some embodiments, the display, such as the display shown in FIG. 15A, facilitates repair without built-in redundancy by providing space and circuitry on the substrate for supplementary micro-LEDs. A micro-assembled micro-LED display architecture that can incorporate spare micro-LEDs 1502 after connection of an array of primary micro-LEDs 1504 provides a way to produce visually perfect micro-assembled micro-LEDs, without requiring a supplementary micro-LED at each sub pixel as in a fully redundant architecture. A supplementary micro-LED (e.g., shown in dashed lines in FIG. 15A) is provided (e.g., by micro-transfer printing) only in instances in which a primary micro-LED is defective. The supplementary micro-LEDs can be printed to locations 1502a-1502d as necessary. In some embodiments, the connections to locations 1502a-d are already formed such that the supplementary micro-LEDs are electrically connected to the display circuit upon printing.

As shown in FIG. 15B, in some embodiments, the display or lighting element architecture including a light emitter such as a micro-LED 1516 and metal interconnection features 1506a and 1506b (collectively 1506) embedded in or placed on a tacky or conformable layer 1508 on a display substrate 1512 to which the micro-LEDs are micro-transfer printed, so that the metal interconnection features 1506 are exposed on at least one surface of the tacky 1508 or conformable layer and can be connected to the light emitter 1516.

A device can include an array of micro-assembled micro-LEDs. Each micro-LED has two contacts on one side—the same side that contacts the tacky or conformable layer 1508 so that the contacts of the micro-LEDs make contact with the metal interconnection features 1506. The spacing of the metal interconnection features 1506a and 1506b, and tacky layer 1508, as well as the design of the micro-LEDs 1516 is such that there are increased tolerances for placement of each micro-LED 1516, thereby increasing production yield. A portion 1514 of the tacky layer contacts the underside of the micro-LED 1516 thereby securing the micro-LED in place once it is micro-transfer printed to the display substrate 1512.

Micro-LEDs can be tested immediately after assembly, and additional micro-LEDs can be assembled after testing for repair. The architecture can include redundant interconnection features at each sub pixel to accept additional micro-LEDs for repair. The architecture can include a reflective layer 1510 positioned underneath at least a portion of the tacky layer. The reflective layer 1510 can be metallic and can be electrically conductive or used as an electrical conductor.

Figure 16:
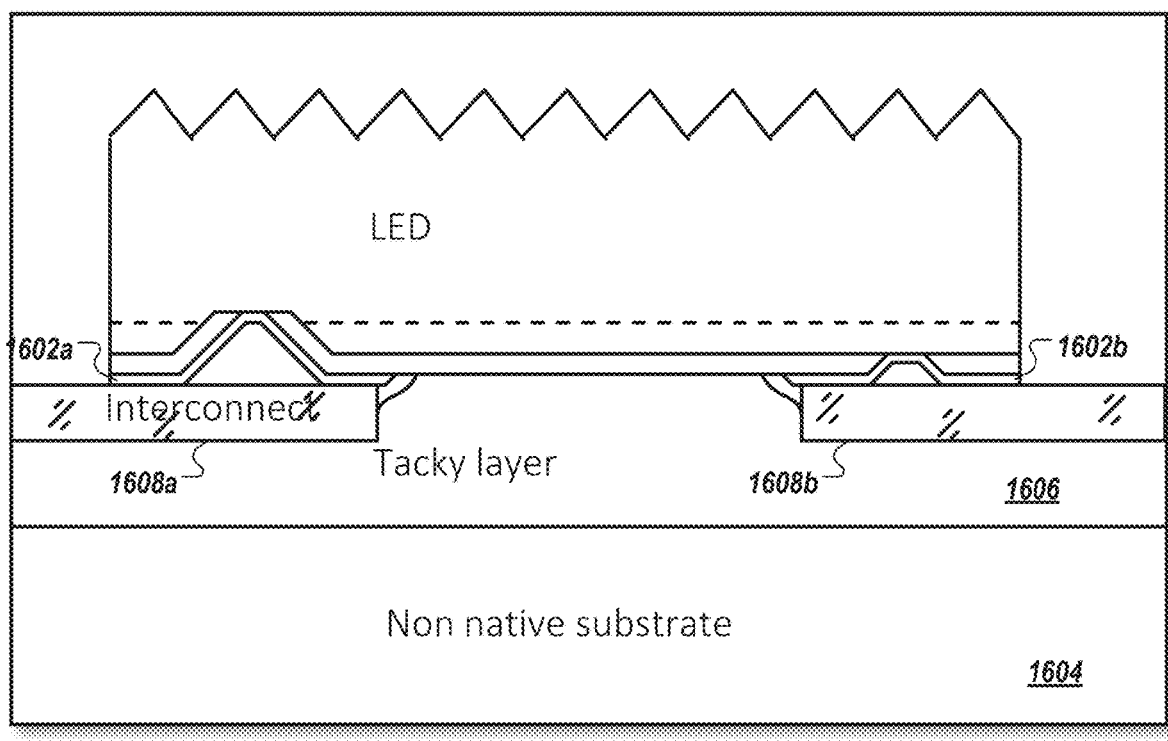
FIG. 16 illustrates a micro-assembled micro-LED display and lighting element architecture, according to an illustrative embodiment of the invention.

FIG. 16 illustrates a micro-assembled micro-LED on a non-native display substrate 1604 separate and distinct from a native source substrate on or in which the micro-LEDs are formed. In some embodiments, the architecture of the lighting element as shown in FIG. 16 facilitates repair without built-in redundancy. An array of micro-LEDs for micro assembly can be provided with the micro-LEDs having two terminals 1602a and 1602b (collectively 1602) facing downward, opposite a contact surface of the micro-LEDs that is to be contacted by a transfer element. The micro-LEDs can have one or more electrically conductive protrusions extending downward from each terminal. Additionally, the protrusions can extend beyond other features on the micro-LEDs. The protrusions (terminals 1602a and 1602b) can contact and penetrate a portion of the metal interconnection features (contact pads) 1608a and 1608b (collectively 1608) to increase electrical connectivity after printing.

A display substrate 1604 can be provided optionally with reflective layers or patterns as shown in FIG. 15B. In some embodiments, the display substrate 1604 includes a tacky or compliant layer 1606 (e.g., PDMS) and metal interconnection features 1608 (e.g., metal interconnection features with a gold, platinum, tin, copper, or silver surface).

In some embodiments, the tacky layer 1606 is deposited on the display substrate 1604, and the metal interconnection features 1608 deposited on top of the tacky layer 1606 (e.g., by physical deposition, transfer, micro assembly, transfer printing, and/or patterning). The array of micro-LEDs can be assembled onto the display substrate 1604 via a transfer element. The micro-LEDs can be adhered to the tacky layer 1606, establishing electrical connectivity from the contacts 1602 of the micro-LEDs to the metal interconnection structures 1608. In some embodiments, the micro-LEDs are adhered to the metallic interconnection layers 1608. In some embodiments, the formation (e.g., size) of the terminals 1602 is such that it provides increase tolerance for placement of each micro-LED on the display. As shown in FIG. 16, the micro-LED could be placed further to the left or right of the non-native substrate 1604 and the terminals 1602 would still contact their respective interconnection features 1608.

After depositing the micro-LEDs on the display substrate 1604, the micro-LEDs can be tested, micro-LEDs can be added as desired (e.g., to replace or substitute for defective micro-LEDs), and metal interconnection features 1608 can be severed as desired (e.g., to disconnect defective micro-LEDs). This process can be repeated as desired. These techniques can be used to produce visually perfect micro-LED displays and lighting elements.

Figure 17:
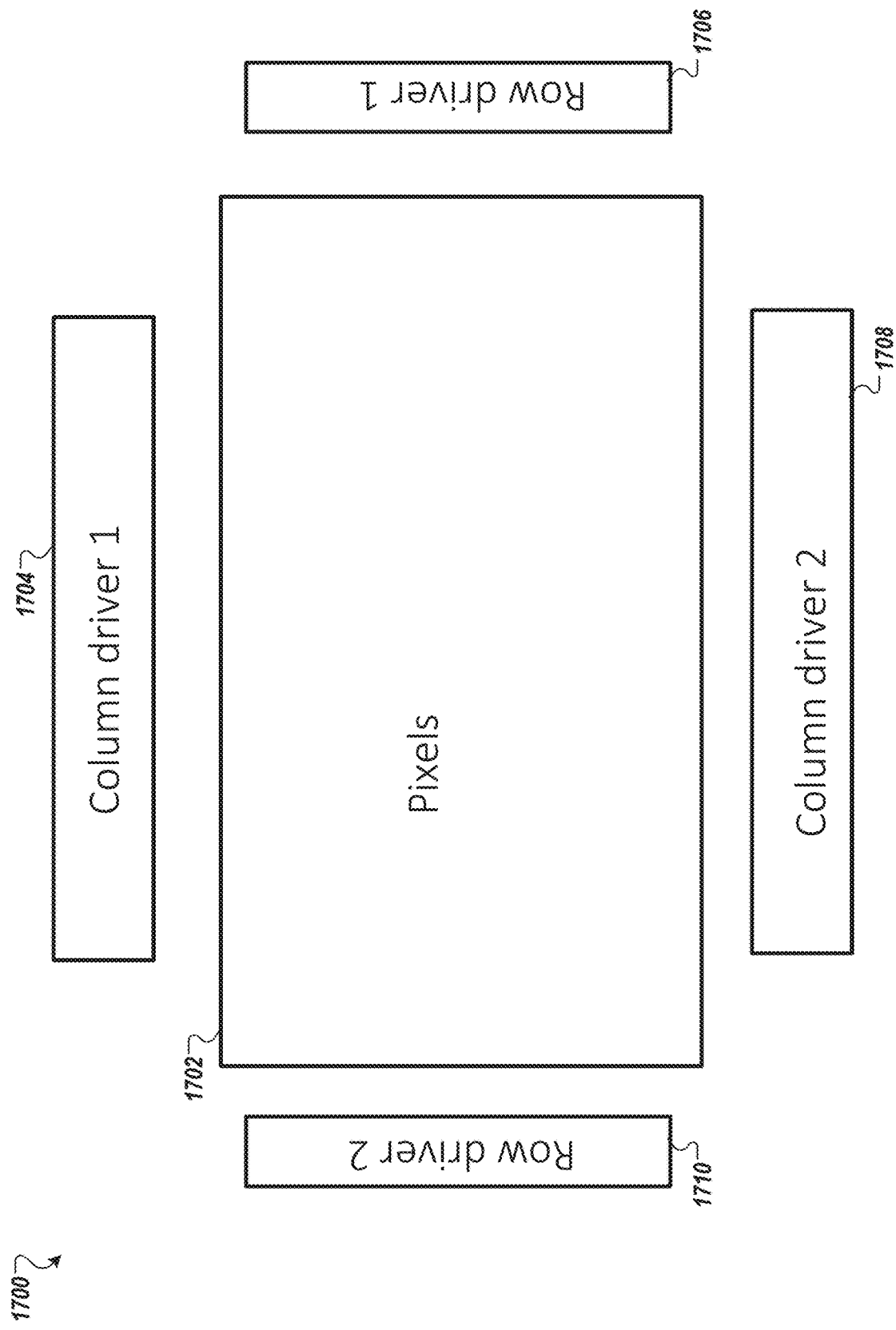
FIG. 17 is an illustration of an example display formed by two independent displays occupying the same viewable area, according to an illustrative embodiment of the invention.

FIG. 17 is an illustration of an example display 1700 formed by two independent displays occupying the same viewable area 1702. One display can compensate for defects in the other. Independent, coordinated driver chips can control each display. For example, each independent display can have its own row driver and column driver. As shown in FIG. 17, a first display is driven by column driver 1704 and row driver 1706 while the second display is driven by column driver 1708 and row driver 1710.

Figure 18:
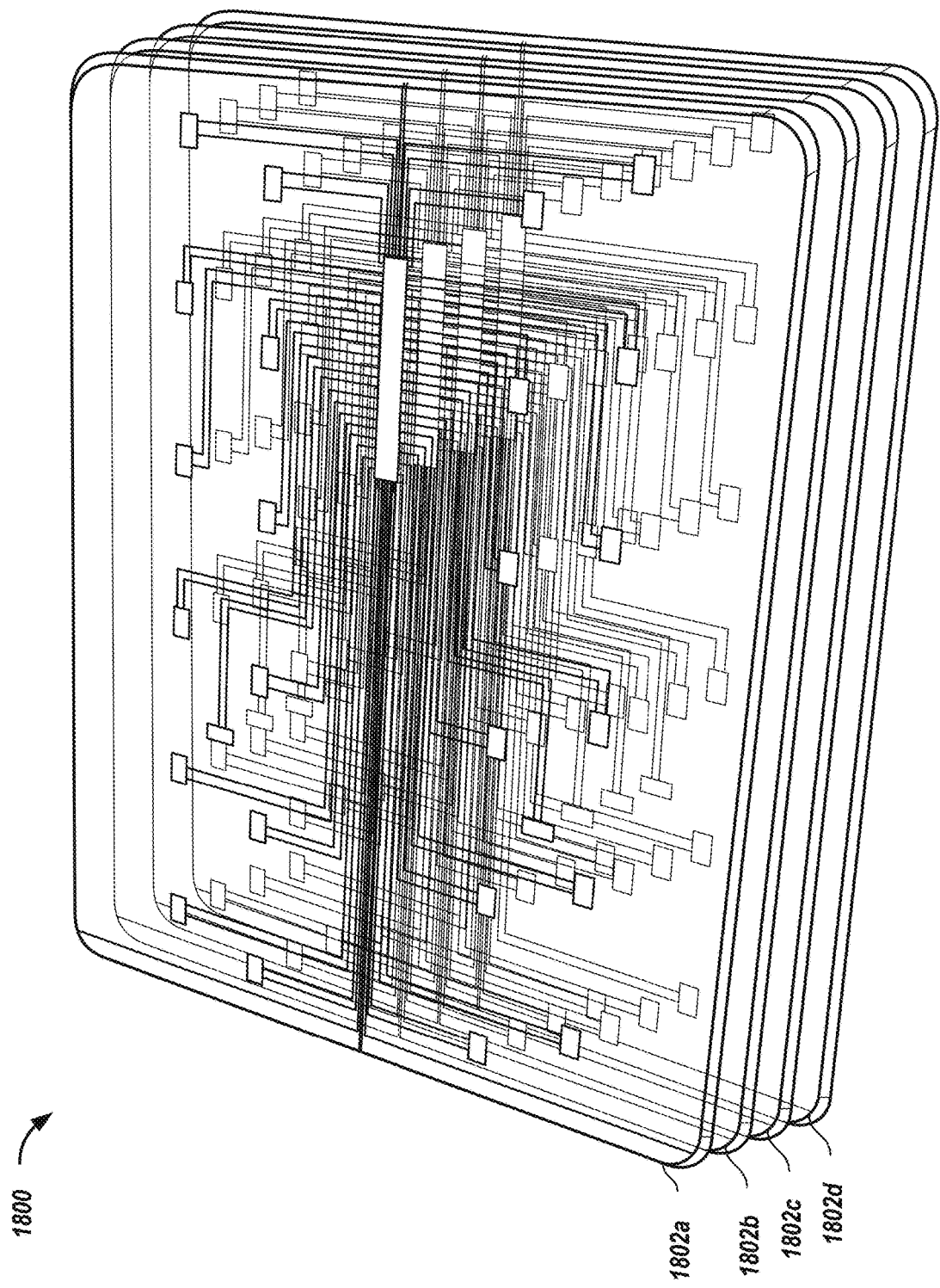
FIG. 18 is an illustration of a stacked micro-LED display, according to an illustrative embodiment of the invention.

The pixels of independent displays can occupy the same plane or be located on the same surface of the display or they can be spaced apart, for example separated by a distance (e.g., Controlled by placing a dielectric layer between each independent display). FIG. 18 is an illustration of a stacked micro-LED display 1800. Transparent micro-LED displays 1802a-1802d (each of which can be a display such as display 400 as described in relation to FIG. 4) can be stacked in a vertical dimension. This allows for tunable brightness and can also compensate for defects. For example, instead of locating spare micro-LEDs on the same surface or in the same plane as primary micro-LEDs, the spare micro-LEDs can be located on a separate surface, thereby forming a stacked display from several independent, fully-functional displays. Additionally, stacked transparent micro-LED displays can be used to form 3-D displays.

Figure 19:
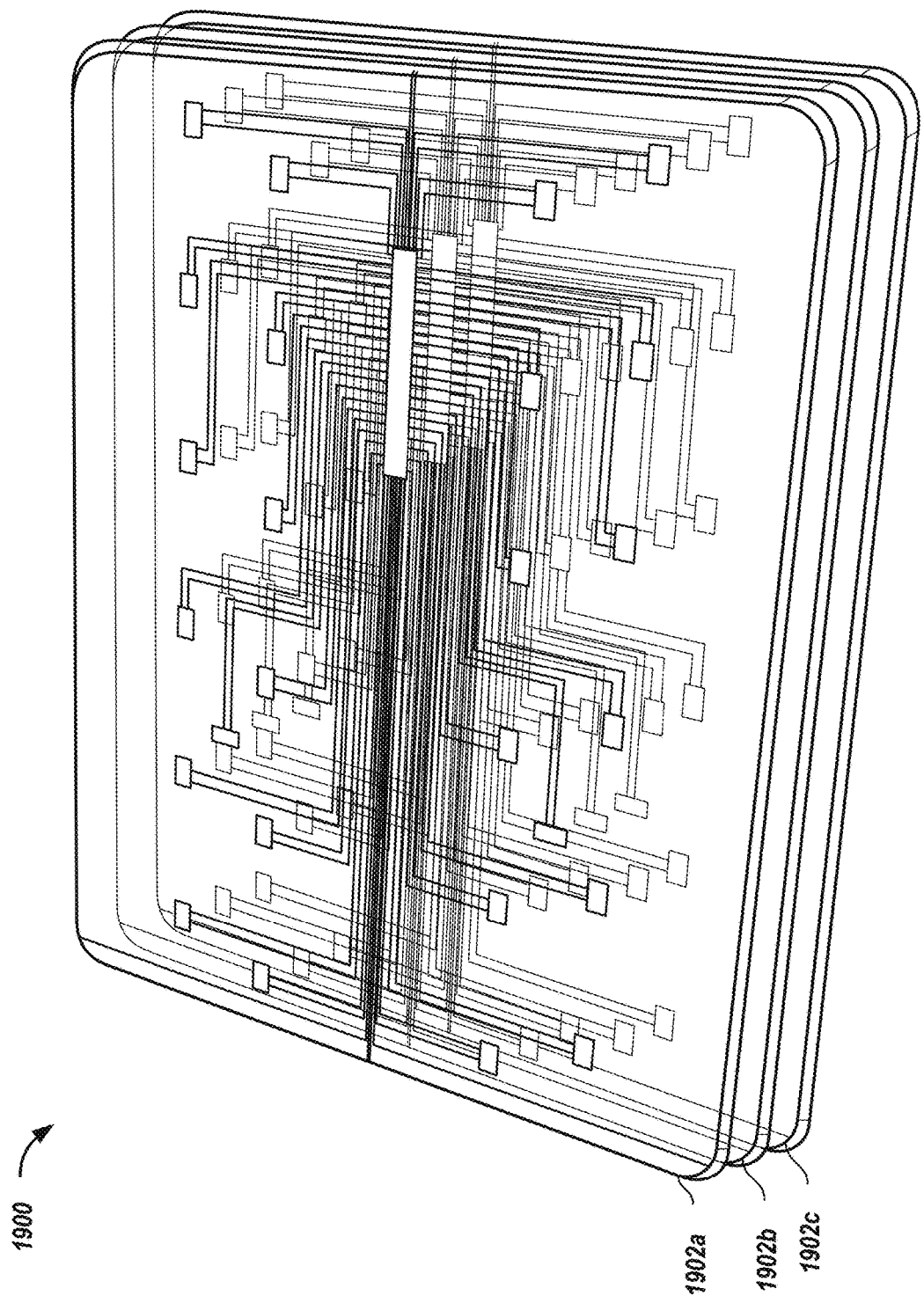
FIG. 19 is an illustration of a micro-assembled stacked display formed of three display panels, according to an illustrative embodiment of the invention.

FIG. 19 is an illustration of a micro-assembled stacked display 1900 formed of three display panels 1902a-1902c (each of which can be a display such as display 400 as described in relation to FIG. 4). Different numbers of display panels can be used to provide various effects and increased definition. In this example, the micro-assembled display includes redundant RGB inorganic micro-LEDs, driver ICs, sensors, and transparent substrates. The display uses multiple levels of display panels for defect tolerance, increased brightness, 2.5-dimensional or 3-dimensional information display, or increased resolution.

Figure 20:
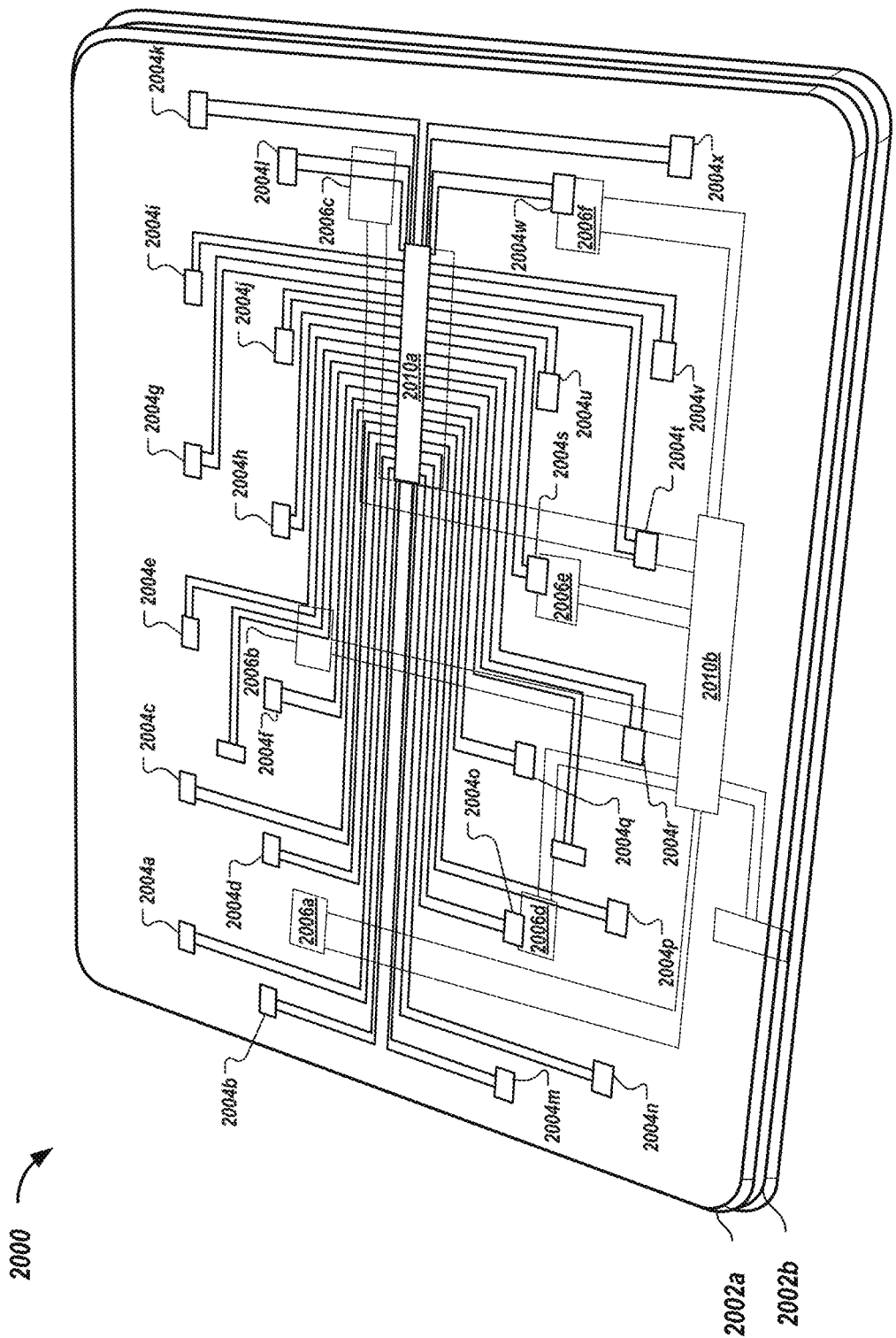
FIG. 20 is an illustration of a stacked display formed by two individual displays with different resolutions, according to an illustrative embodiment of the invention.

Display panels with different resolutions, such as display panels 2002a and 2002b, can be used to form a stacked display 2000 as shown in FIG. 20. The displays in the stack can also be different sizes. The micro-LEDs can also be different sizes, colors, or in different locations. The display 2000 shown in FIG. 20 includes two same-sized display panels 2002a-2002b. The micro-LEDs on the first display panel 2002a are smaller than the micro-LEDs on the second display panel 2002b. Additionally, the micro-LEDs on the first display panel 2002a are in a different location than the micro-LEDs on the second display panel 2002b. In this example, the display panels 2002a and 2002b have a different resolution. Display panel 2002a includes 24 micro-LEDs (e.g., micro-LEDs 2004a-2004x) and display panel 2002b includes only 6 micro-LEDs (e.g., micro-LEDs 2006a-2006f). Each display panel 2002a and 2002b, in some embodiments, includes a driver (e.g., micro integrated circuit) 2010a and 2010b, respectively. In some embodiments, a single driver is used for each display panel (e.g., 2002a and 2002b) in a stacked display.

Figure 21:
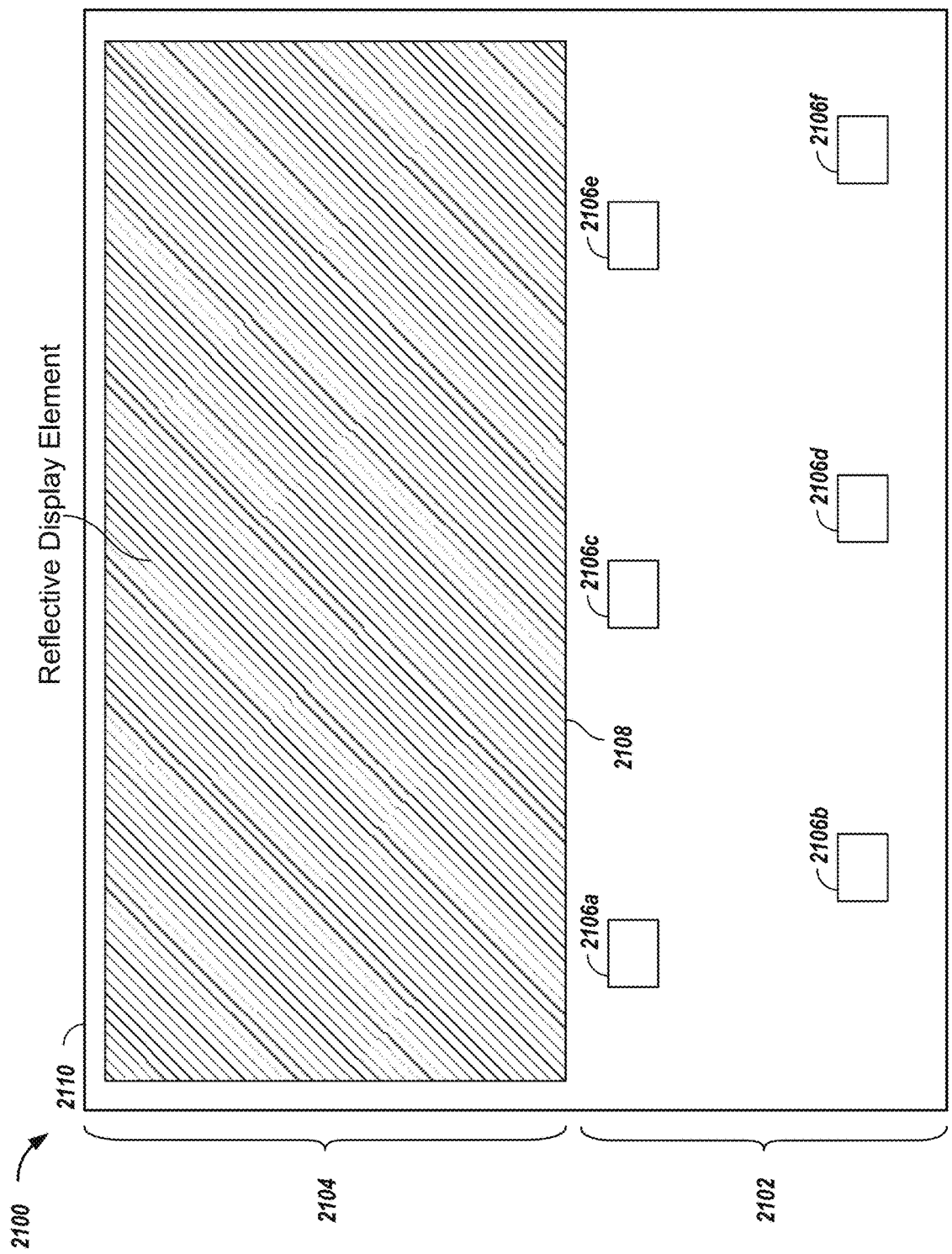
FIG. 21 is an illustration of an example pixel of a multi-mode display, according to an illustrative embodiment of the invention.

Micro-LED emitters, in some embodiments, are used to form multi-mode displays. FIG. 21 is an illustration of an example pixel 2100 of a multi-mode display. An emissive micro-LED display 2102 can be combined with a second type of display 2104, such as a reflective display, electrophoretic, or MEMs-based display to form a multi-mode display. In the example shown in FIG. 21, the second display 2104 is a reflective display. The micro-LEDs 2106a-2106f will only utilize a fraction of the pixel area while the reflective component 2104, for example, can utilize some of the area of pixel 2100 as well. For example, a mobile device, such as a cell phone (including smart phones) or a tablet computing device can switch between the display type, thereby allowing the micro-LED display 2102 to be used while watching a video or viewing pictures, for example, while an ultra-low power "paper-like" display (e.g., electrophoretic display) or reflective display (such as reflective display 2104) can be used for reading.

Figure 22:
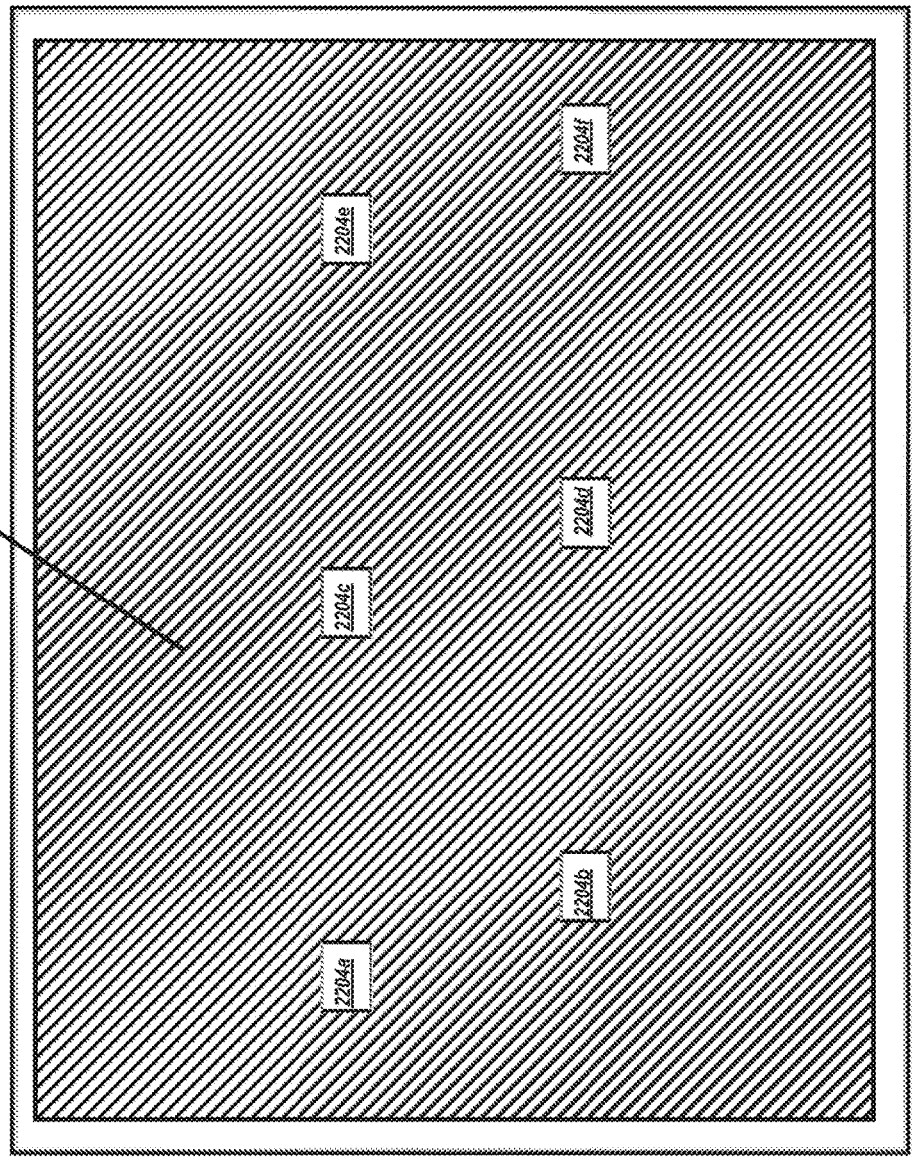
FIG. 22 is an illustration of an example pixel of a multi-mode display, according to an illustrative embodiment of the invention.

In some embodiments, as shown by the pixel 2200 illustrated in FIG. 22, micro-LEDs 2204a-2204f can be placed on top of a reflective element 2202 without greatly interfering the reflective display element given the small size of the micro-LEDs 2204a-2204f.

Figure 23:
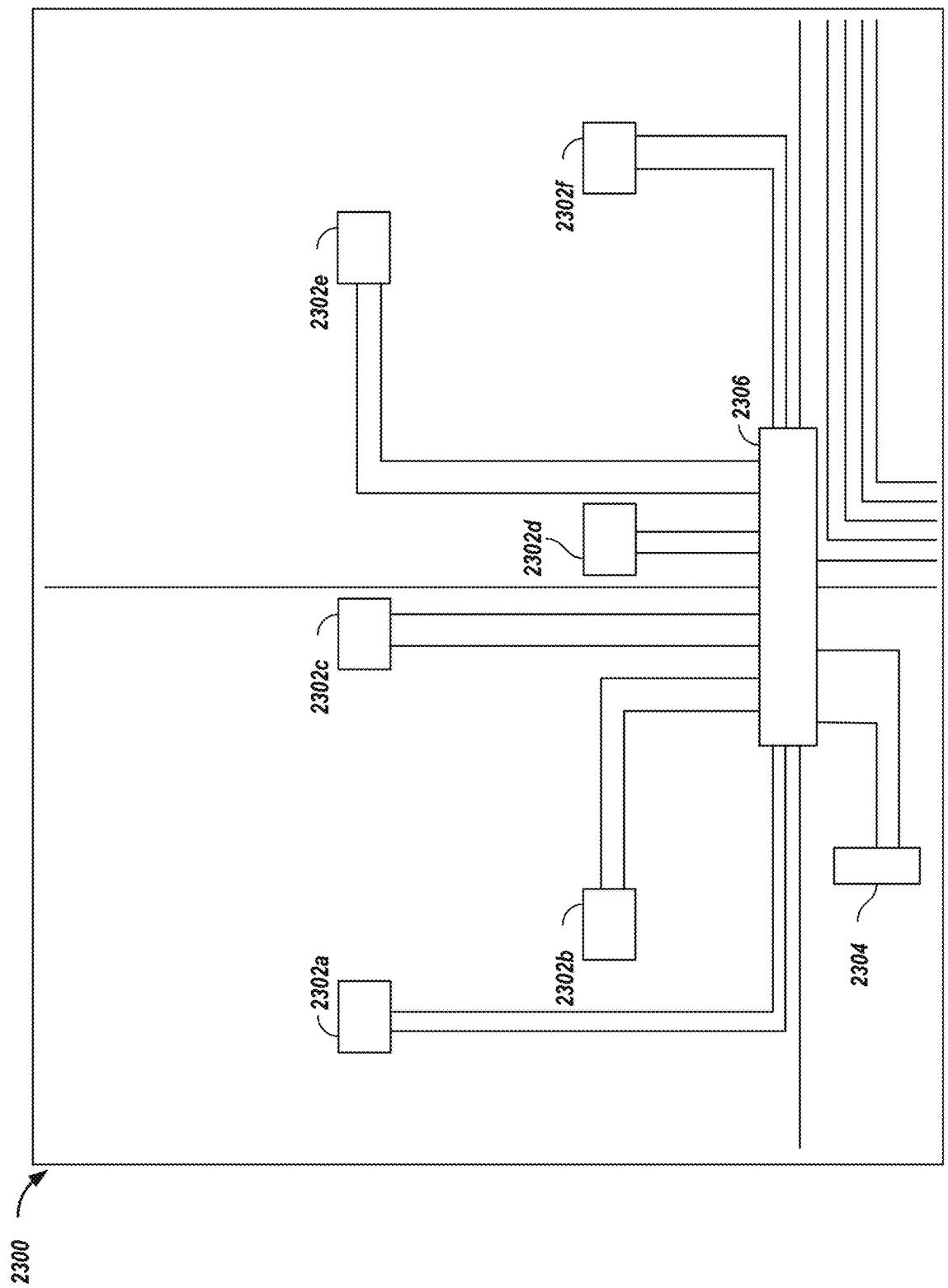
FIG. 23 is an illustration of a pixel with an integrated circuit connected to redundant micro-LEDs and a micro-sensor, according to an illustrative embodiment of the invention.

As discussed previously, displays (e.g., micro-LED displays) can be interlaced with micro-transfer printed sensors and transceivers. FIG. 23 is an illustration of a pixel 2300 with an integrated circuit 2306 connected to the micro-LEDs 2302a-2302f (e.g., micro-LEDs 2302a-2302b form a redundant pair, micro-LEDs 2302c-2302d form a redundant pair, and micro-LEDs 2302e-2302f form a redundant pair) and a micro-sensor 2304. For example, the display can be interlaced with image capture devices (e.g., optical sensors, photodiodes), infrared sensors (e.g., gesture sense or IR camera), temperature sensors (e.g., feedback regarding micro-LEDs to provide color/brightness correction), and wireless transmission devices. The display can also include power harvesting devices such as solar cells (collection of light), motion-energy scavenging (e.g., piezoelectric devices), capacitors to store energy, or antennas for harvesting electromagnetic radiation. The transfer printed elements interlaced with the display can be printed at different densities (sparseness) according to the desired function and application. For example, fewer temperature sensors are necessary, but each pixel may require an image capture device.

Figure 24:
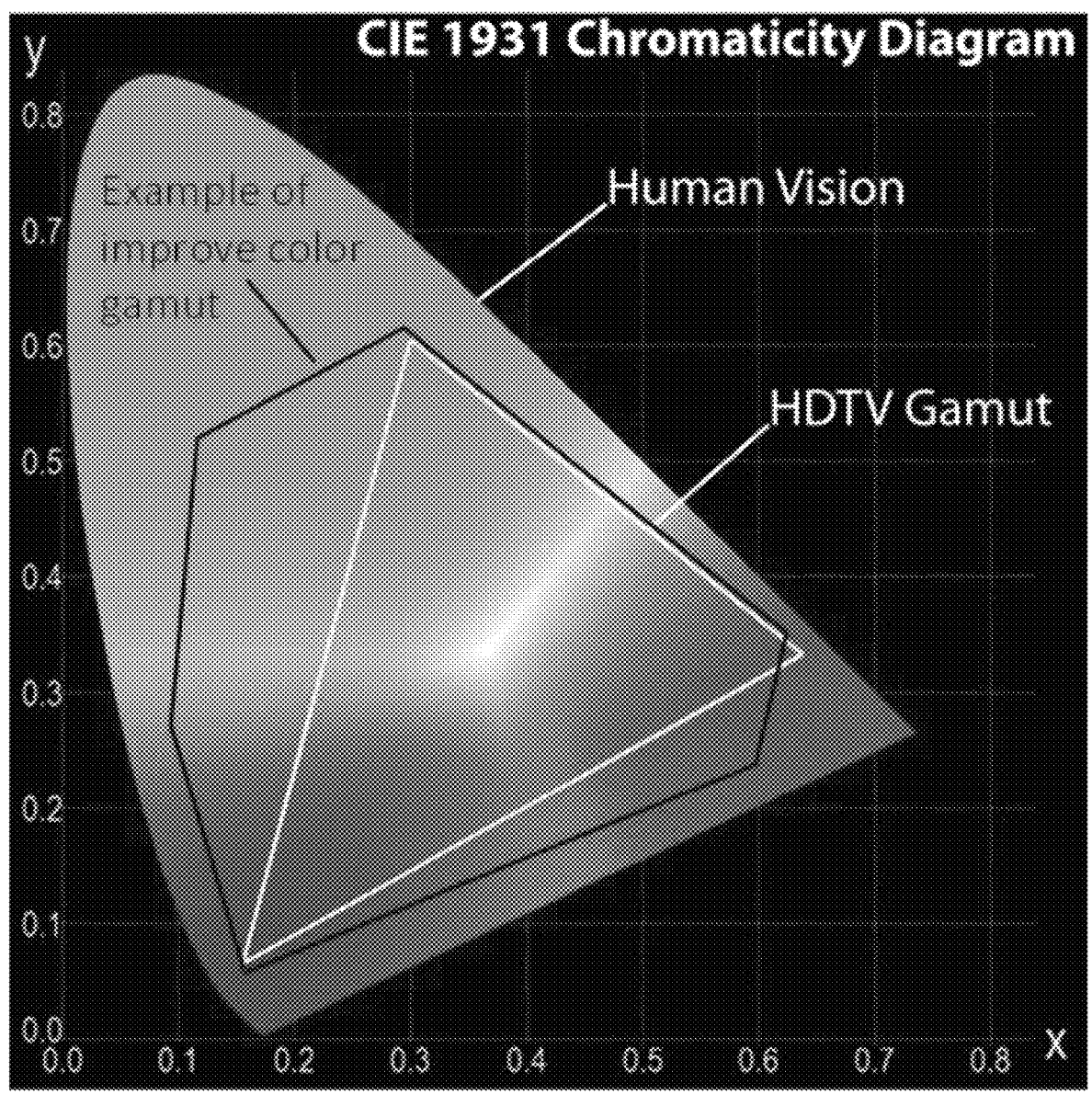
FIG. 24 is an example illustration of the color gamut of human vision and an HDTV, according to an illustrative embodiment of the invention.

FIG. 24 is an example illustration of the color gamut of human vision and an HDTV. The disclosed technology can be used to improve the color gamut of a display to more closely match the color gamut of human vision.

Figure 25:
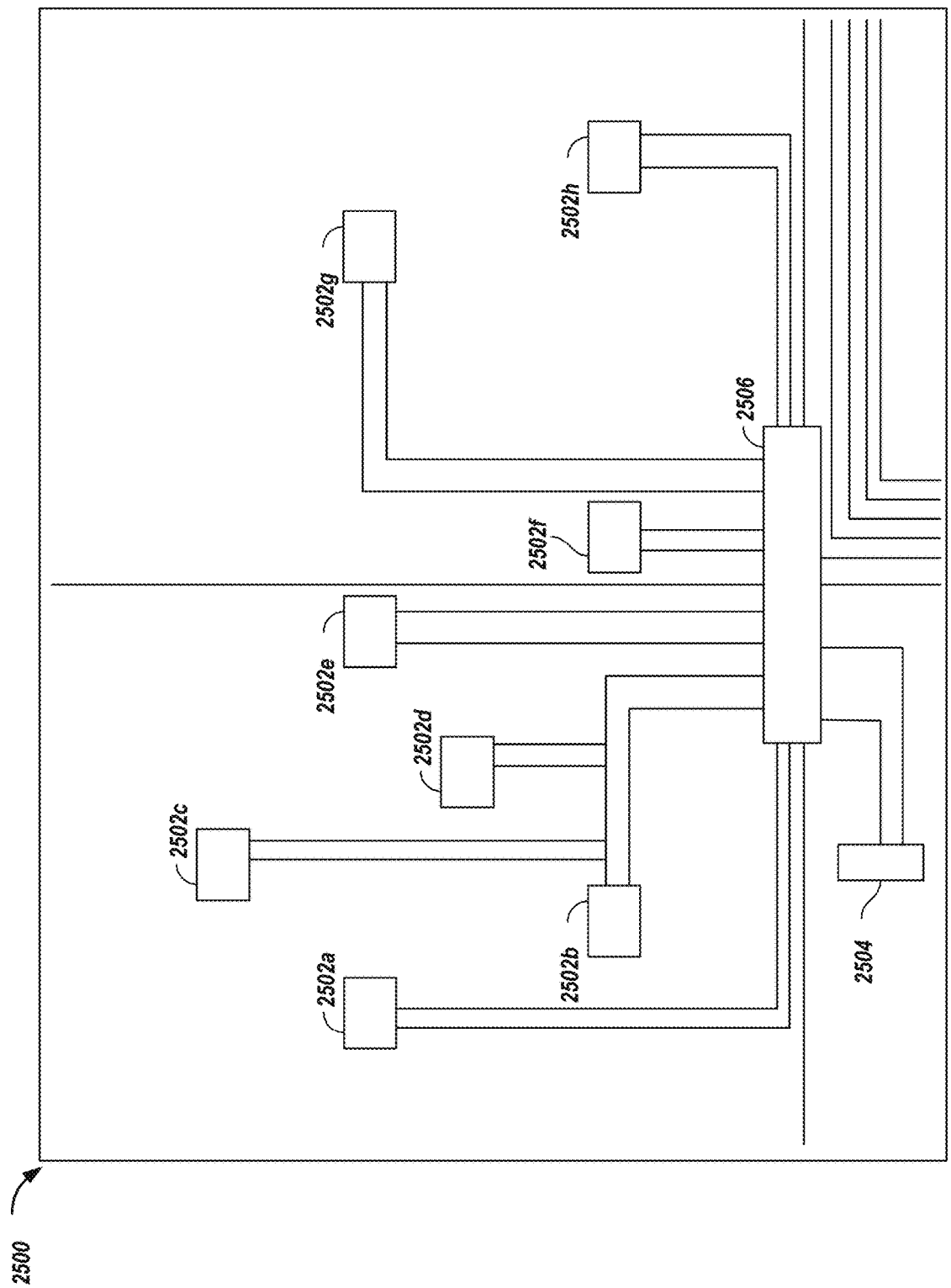
FIG. 25 is an illustration of an example pixel with improved color gamut, according to an illustrative embodiment of the invention.

As illustrated in FIG. 25, micro-LED displays can include various colored micro-LEDs to, among other things, improve the color gamut of displays. In addition to the standard red micro-LEDs 2502a-2502b, blue micro-LEDs 2502e-2502f, and green micro-LEDs 2502g-2502h, micro-LED displays, in some embodiments, include yellow micro-LEDs 2502c and 2502d, for example as in the pixel 2500 shown in FIG. 25, or other color micro-LEDs (e.g., cyan). In another example, the pixel 2500 can include two different red, green, or blue micro-LEDs (e.g., green micro-LED 2502c emits a different shade of green light than 2502d). This allows for an improved color gamut (e.g., more achievable colors). The display may also include a micro integrated circuit 2506, micro-sensor 2504, or other semiconductor elements as described above.

Figure 26:
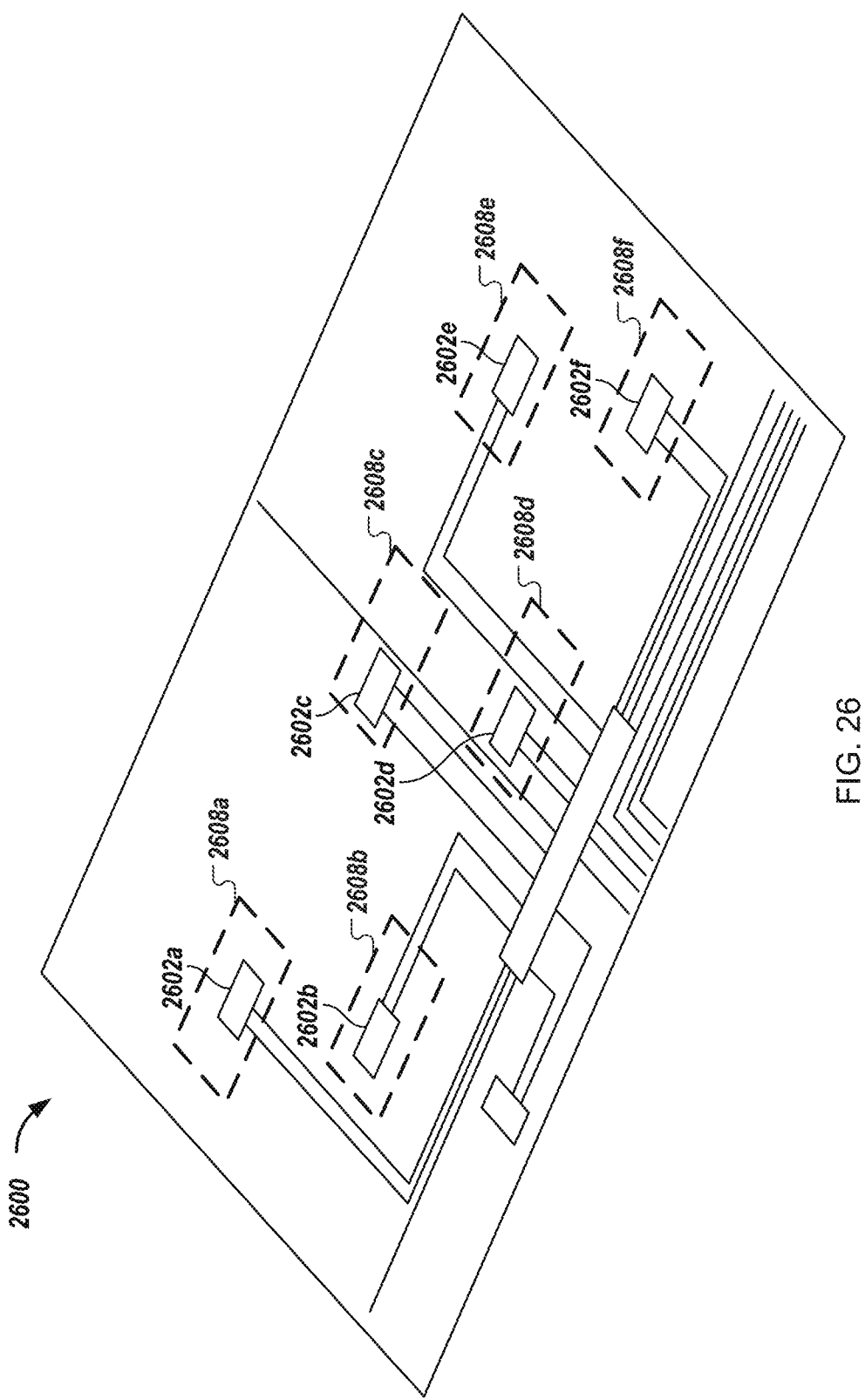
FIG. 26 is an illustration of an example pixel for use in a micro-assembled inorganic micro-LED array for yielding visually perfect devices, according to an illustrative embodiment of the invention.

FIG. 26 is an illustration of an example pixel 2600 for use in a micro-assembled inorganic micro-LED array for yielding visually perfect devices. The pixel 2600 includes six sub pixels 2608a-2608f, each having a different color (e.g., One sub-pixel 2608a having a red color micro-LED 2602a, another sub-pixel 2608b having a different red color micro-LED 2802b, one sub-pixel pixel 2608c having a green color micro-LED 2602c, another sub-pixel 2608d having a different green color micro-LED 2602d, one sub-pixel 2608e having a blue color micro-LED 2602e and one sub-pixel 2608f having a different blue color micro-LED 26020. For example, the pixel 2600 can include six subpixels 2608a-2608f, each having a micro-LED with a respective peak of output intensity at 450, 460, 530, 540, 650, and 660 nm. A lookup table can be used to compensate for pixel non-uniformities.

Figure 27A:
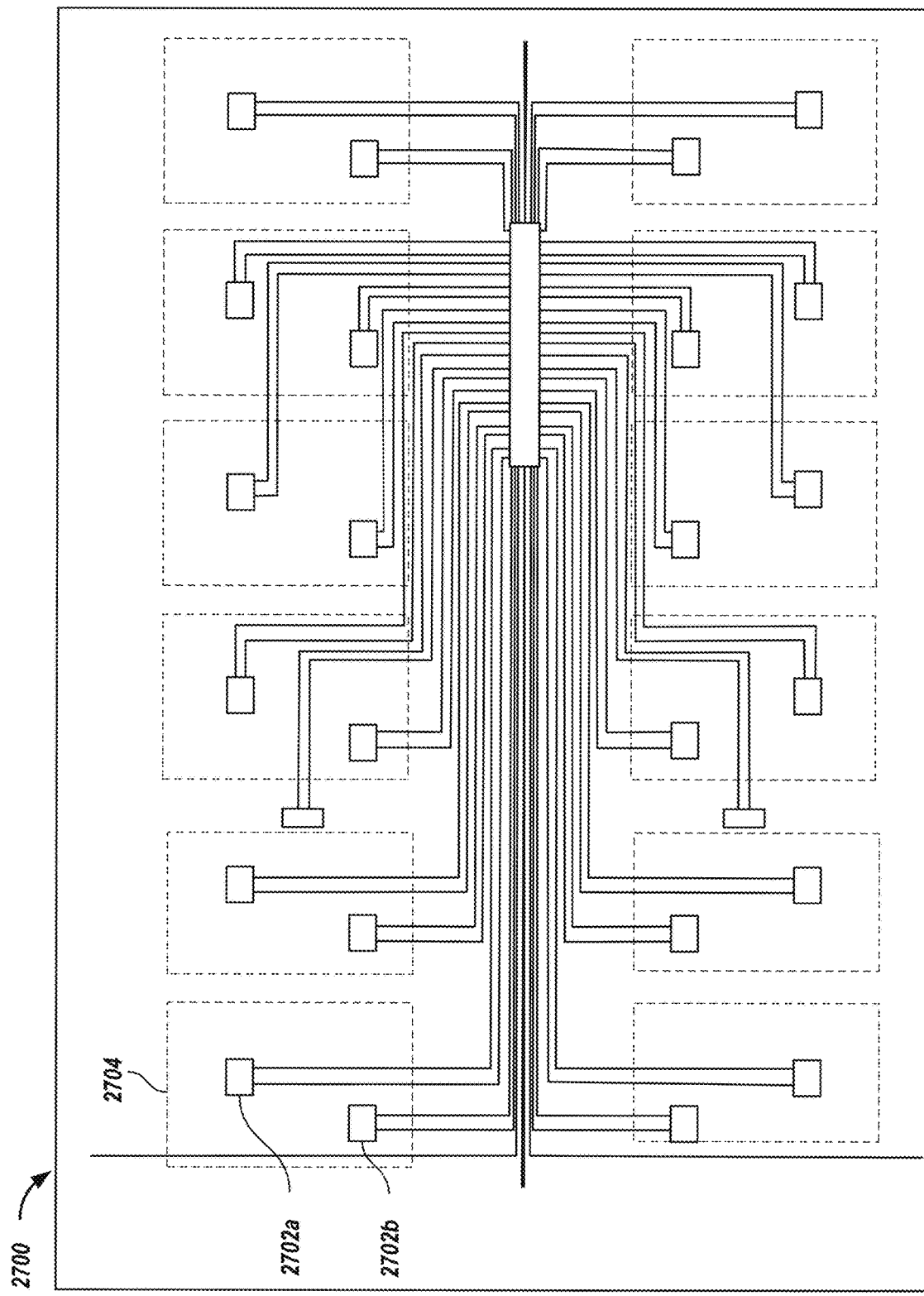
FIGS. 27A and 27B are illustrations of two micro-assembled inorganic micro-LED array strategies for yielding visually perfect devices, according to an illustrative embodiment of the invention.
Figure 27B:
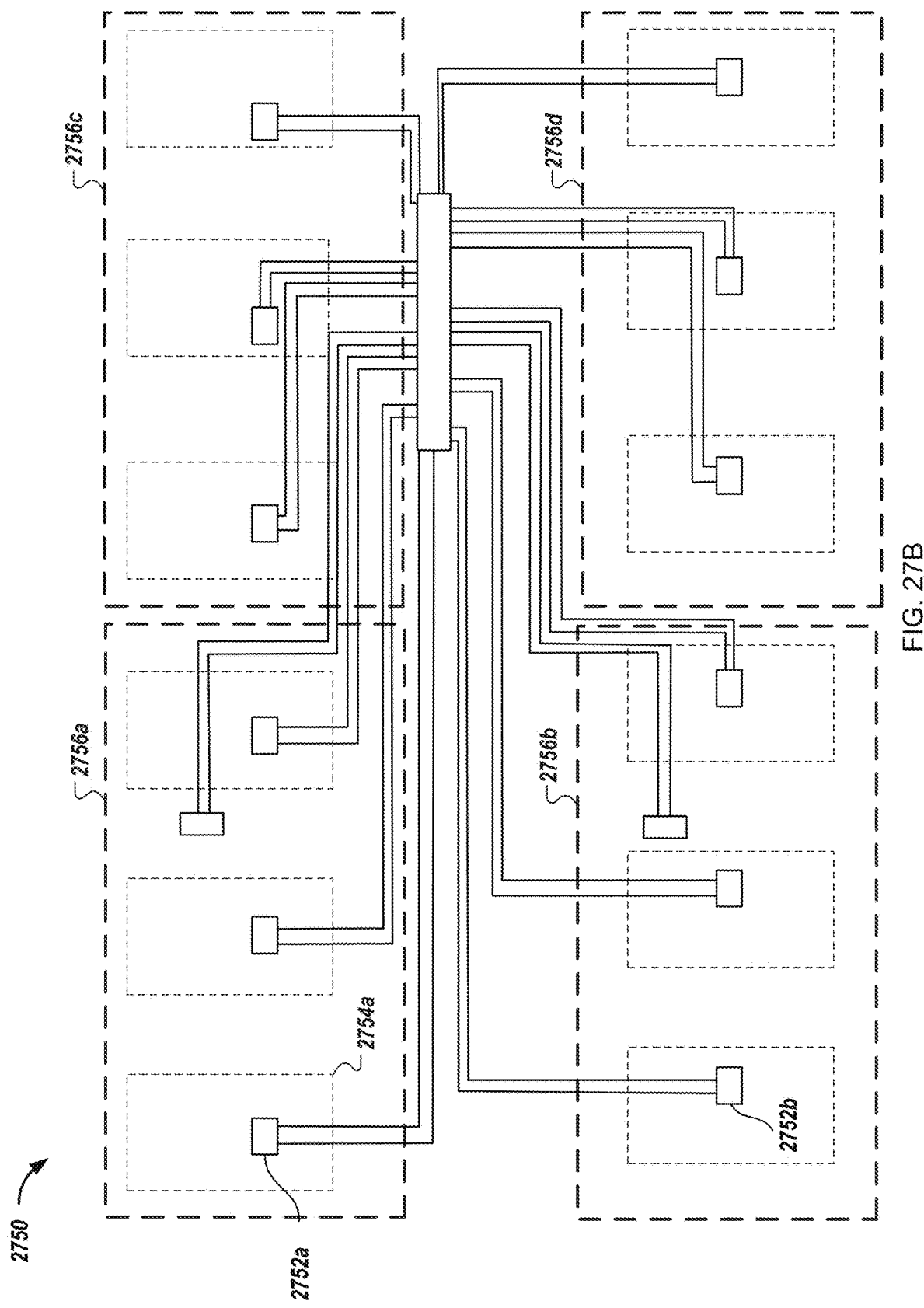

FIGS. 27A-B are illustrations of two micro-assembled inorganic micro-LED array strategies for yielding visually perfect devices. The display 2700 shown in FIG. 27A uses two micro-LEDs (2702a and 2702b) per sub pixel 2704. The display 2750 shown in FIG. 27B utilizes more pixels (e.g., 2756a-2756d) per unit of area and less subpixels and/or micro-LEDs per pixel. In the example shown in FIG. 27B, there is only one micro-LED 2752 per sub pixel 2754, however, there are two or more pixels (in this example, 4 pixels; 12 sub pixels) for each visually discernable region of the display. In the event that one micro-LED is missing in display, adjacent pixels compensate using information from a lookup table. For example, if micro-LED 2752a is missing, micro-LED 2752b can be used to compensate for the missing micro-LED.

FIG. 28 is an illustration of an example pixel 2800 prior to connection. In some embodiments, an array of micro-assembled micro-LEDs 2802a-2802f can be illuminated and the photoluminescence can be observed to identify defective micro-LEDs (e.g., 2802a and 2802e) prior to connection. This can be used to trigger a physical repair, adding an extra micro-LED to a sub pixel that includes a defective micro-LED identified by photoluminescence testing. In this example, micro-LEDs 2802a and 2802e were defective and removed. In some embodiments, as a result, only micro-LEDs 2802b, 2802c, and 2802f will be wired. In other embodiments, 2802d will also be wired. FIG. 28 also illustrates the scenario in which micro-LED 2802d is defective and an additional micro-LED 2802c was printed to compensate for this defective micro-LED 2802d.

FIG. 29 is an illustration of implementing color conversion in micro-assembled micro-LED displays and lighting elements using chips of color-conversion material, for example a polyhedron such as a cube. Displays and lighting elements in some embodiments require full RGB capabilities and/or colors that are different than the direct-emission wavelength of their constituent micro-LEDs.

One method for accomplishing this color conversion is by using micro assembly techniques to place an array of micro-LEDs 2904a and 2904b over, on, or in contact with corresponding arrays of color-conversion material, for example, by forming recesses 2902a-2902h in a display substrate 2906 that is at least partially transparent and filling the recesses with phosphors or other color-conversion materials. Color-conversion materials include phosphor-bearing gels or resins, phosphor ceramics, and single-crystal phosphors. Other color-conversion materials include direct band gap semiconductors, such as those that are parts of epitaxial stacks that in some embodiments include quantum wells and surface passivation.

In an alternative color conversion approach, chips of color-conversion material, for example, of a direct band gap semiconductor, are micro-assembled on a display substrate, and at least a portion of a micro-LED array is assembled over the chips.

In some embodiments, devices are designed such that most or all of the light emitted from the micro-LEDs emits downward, through a transparent display substrate and optionally through a color-conversion material. This attribute imparts valuable characteristics to the devices that have it, for example, as in a display or lighting element that is virtually transparent from one direction and a bright source of light or information display from the opposing direction. This attribute can be achieved by the formation of reflective structures entirely or almost entirely covering one side of the micro-LEDs (e.g., The "top" side of the micro-LEDs) with the micro-LED contacts, the array connection metals, and/or supplementary mirror structures formed on the display substrate.

In an alternative approach to color conversion, the color conversion layers are formed on top of or at least partially surrounding the micro-LEDs on more than one side of the micro-LEDs.

Figure 30B:
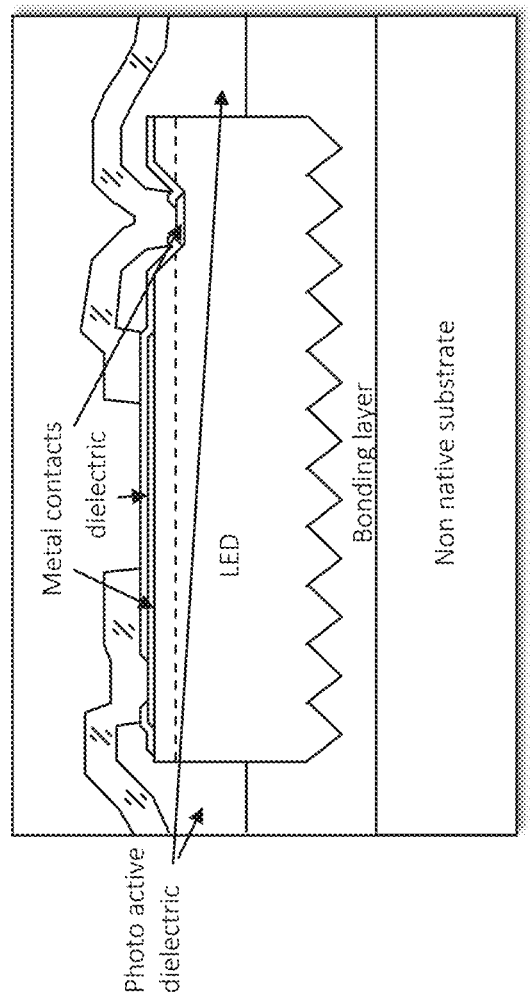
FIGS. 30A and 30B are a micrograph and illustration, respectively, of devices using self-aligned dielectrics for micro-assembled micro-LED displays and lighting elements, according to an illustrative embodiment of the invention.
Figure 30A:
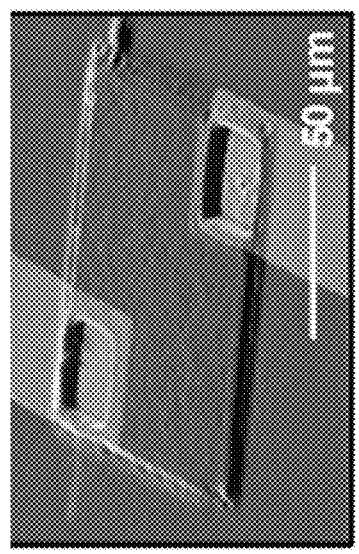

FIGS. 30A and 30B is an image and illustration of devices using self-aligned dielectrics for micro-assembled micro-LED displays and lighting elements. In some embodiments, it is advantageous to reduce the number of alignment steps on the display substrate of a micro-assembled micro-LED display or lighting element.

In some embodiments, micro-LEDs that include some materials that are substantially transparent to a specific wavelength are assembled on a display substrate that is also transparent to the same specific wavelength. The micro-LEDs have one or two metal contacts on the side of the micro-LED positioned opposite the interface between the micro-LED and the display substrate. The micro-LEDs optionally also include dielectric materials (e.g., silicon oxide or silicon nitride) covering a portion of the side of the micro-LEDs opposite the display substrate. Prior to forming connections to the micro-LEDs, in some embodiments, it is beneficial to provide an insulating layer surrounding the perimeter of the micro-LED, thereby avoiding unwanted electrical shorting. The insulating layer is formed by depositing a layer of photo-definable dielectric (e.g., BCB, polyimide, PBO, epoxy, or silicone), exposing the photoactive dielectric to light, shining the light from beneath the display substrate, and cross-linking the photo-definable material except in the regions above the two metal contacts, thereby electrically insulating the perimeter of the micro-LEDs prior to the formation of connections.

In some embodiments, cameras with spectral responses that match human vision can be used to define a lookup table for use with micro-assembled micro-LED displays. Displays that use micro-assembled micro-LEDs benefit from uniformity in pixel-to-pixel brightness and color consistency. The epitaxial and micro-fabrication processes that produce micro-LEDs typically produce micro-LEDs with a range of brightness and a range of output spectrum. Displays that use assemblies of micro-LEDs, in some embodiments, benefit from a lookup table that characterizes the output of each sub-pixel (e.g., allowing the display to drive each individual sub-pixel according to the relationship between brightness and current for that sub-pixel), thereby providing the information required to accurately render images and colors as if the micro-LEDs of the devices did not have non-uniformity of color and brightness. Furthermore, the lookup table can account for the relationship between brightness, color, and efficacy in the human visual response.

In some embodiments, a camera and optical filter with a spectral response that matches the spectral response of the human eye are used to produce a lookup table for a micro-LED display. In some embodiments, a camera and optical filter with a spectral response that matches the spectral response of the human visual blue response, a camera and optical filter with a spectral response that matches the spectral response of the human visual green response, and a camera and optical filter with a spectral response that matches the spectral response of the human visual red response are used to produce a lookup table for a micro-LED display.

In some embodiments, arrays of micro-scale functional elements are interlaced with arrays of micro-scale control elements. In some embodiments, arrays of assembled inorganic micro-scale functional devices are integrated with an interlaced array of assembled micro-scale control elements. The control elements can include micro-scale silicon integrated circuit devices that are integrated and interlaced with the micro-scale devices through micro-assembly methods. The micro-assembly method in some embodiments, is transfer-printing with an elastomer stamp, an electrostatic head, and/or vacuum-collet-based assembly tools.

The assembled micro-scale functional elements can be micro light-emitting devices such as light-emitting diodes (LEDs), vertical cavity surface emitting lasers (VCSELs) or edge-emitting lasers. The assembled micro-scale functional elements can be sensing devices such as photodiodes, radiation sensors, temperature sensors, and motion sensors. The assembled micro-scale functional elements can be energy harvesting or energy converting devices. The assembled micro-scale functional elements can be actuator devices.

A single micro scale control element can control a cluster or array of functional elements. In some embodiments, the control element is connected with the cluster of functional elements through a network of wires which fan-out from the control element to each functional element. The wiring, in some embodiments, is made of a deposited thin-film metal (e.g., Al, Cu, Mo, or Au) that is patterned.

The micro-scale control integrated circuit can include various functionalities. The control elements can include memory, both digital and analog circuits, sensors, signal processing circuits, and/or optical transceivers (e.g., providing optical I/O to and from the control element). The cluster of functional elements with a single control element can be operated as an independent unit within a larger array of clusters. Each cluster of functional elements can be operated as an independent display.

Figure 31:
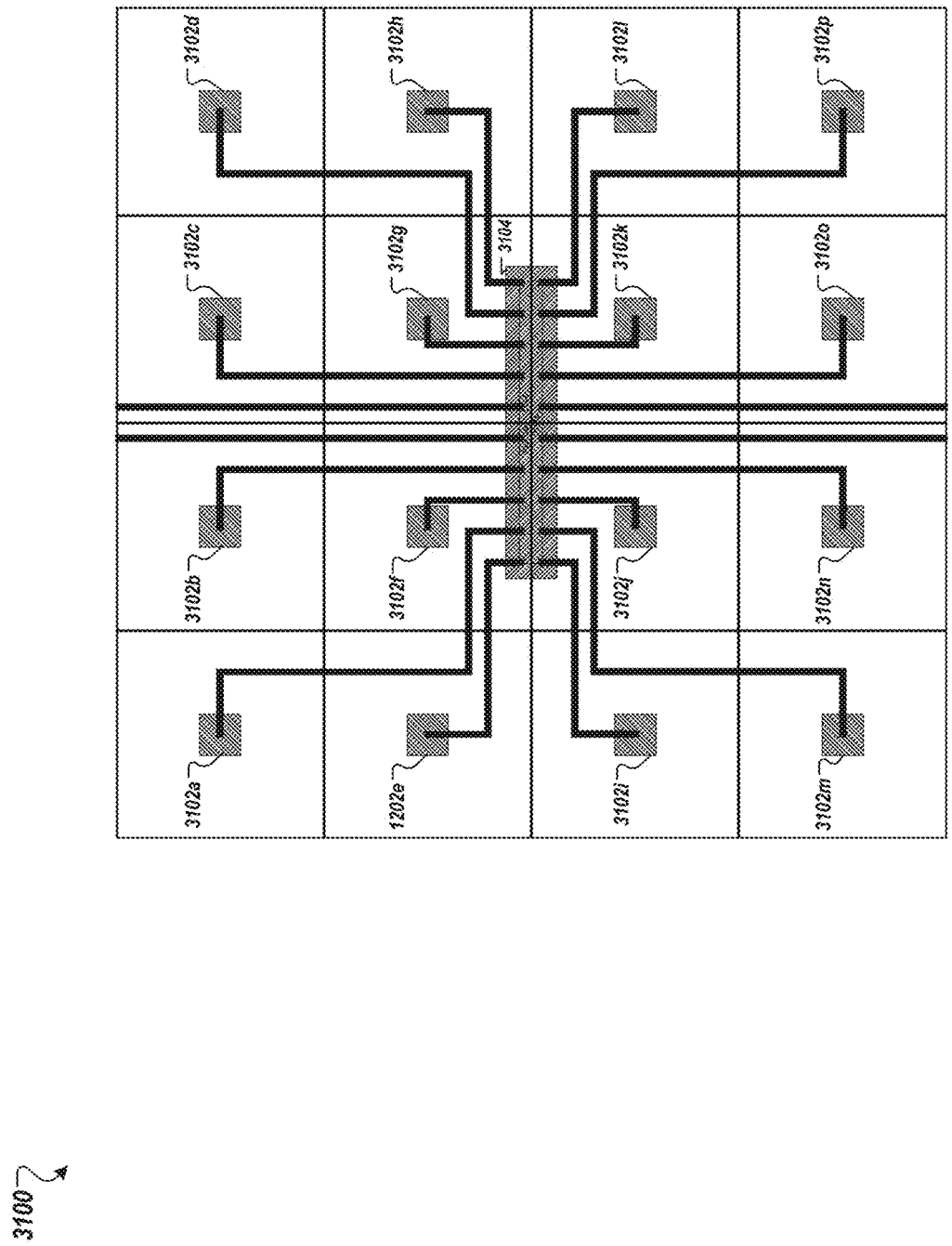
FIG. 31 is an illustration of an example 4×4 array of function elements controlled by a single micro-assembled integrated circuit, according to an illustrative embodiment of the invention.

FIG. 31 is an illustration of an example 4×4 array 3100 of functional elements 3102a-3102p (collectively 3102) controlled by a single micro-assembled integrated circuit 3104. The functional elements 3102 can be connected with the control element 3104 through a single thin-film metallization process. In some embodiments, the control element 3104 and functional elements 3102 are located in the same plane or on the same surface. The connection wiring fans-out away from the control element 3104 and can connect to each of the functional elements 3102 as shown in FIG. 31.

Figure 32:
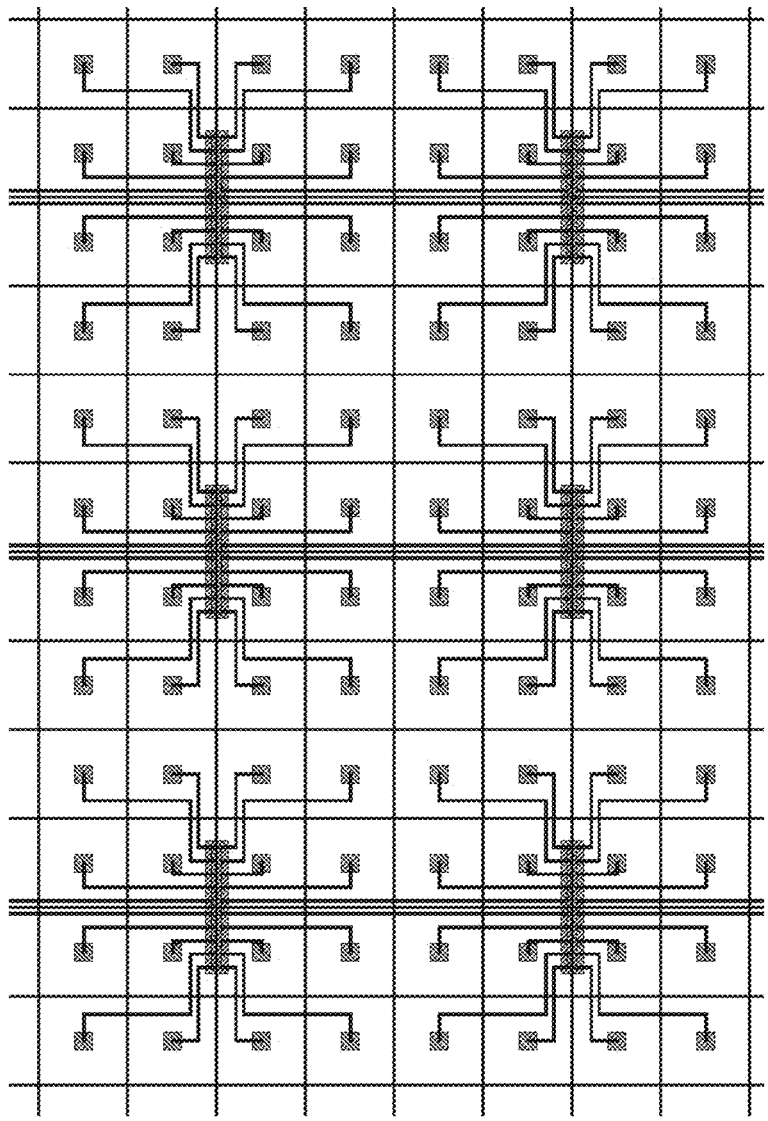
FIG. 32 illustrates an example device including several 4×4 arrays of function elements each controlled by a single micro-assembled integrated circuit, according to an illustrative embodiment of the invention.

FIG. 32 is an example device 3200 including six 4×4 arrays of functional elements each controlled by a single micro-assembled integrated circuit (e.g., as shown in FIG. 31). The array of control elements can be interlaced within the array of functional elements using micro assembly.

Figure 33:
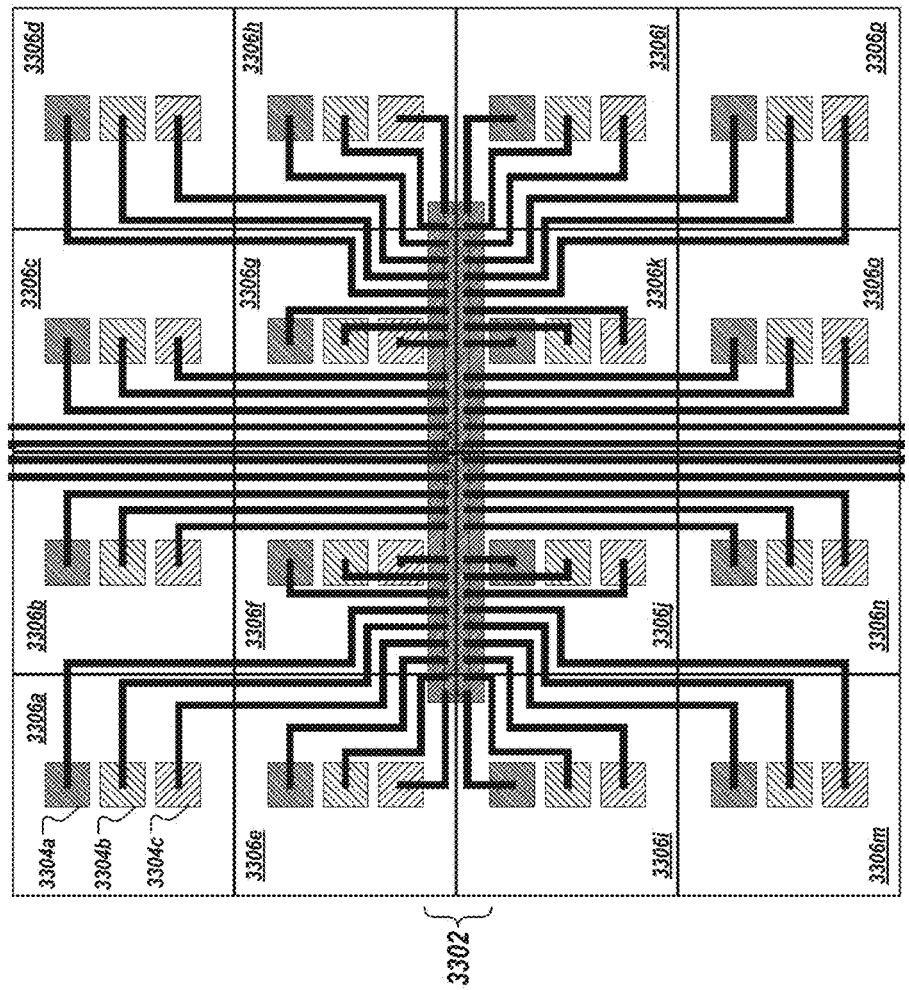
FIG. 33 is an illustration of an example array using control elements to control different types of functional elements, according to an illustrative embodiment of the invention.

FIG. 33 is an illustration of an example array 3300 using a control element 3302 to control different types of functional elements. For example, the array 3300 can include sixteen pixels 3306a-3306p (collectively 3306, although other numbers of pixels can be used). Each pixel 3306 can include a red micro-LED 3304a, a blue micro-LED 3304b, and a green micro-LED 3304c. The control element 3302 can process or read-out signals from sensing functional elements and also control or read-in signals to functional array elements. Thus, the array device can be multi-functional and can perform many tasks on the same surface or in the same plane or array area (e.g., hyper-spectral focal plane arrays). The array can use a single metal level and single control element for the functional cluster.

Figure 34:
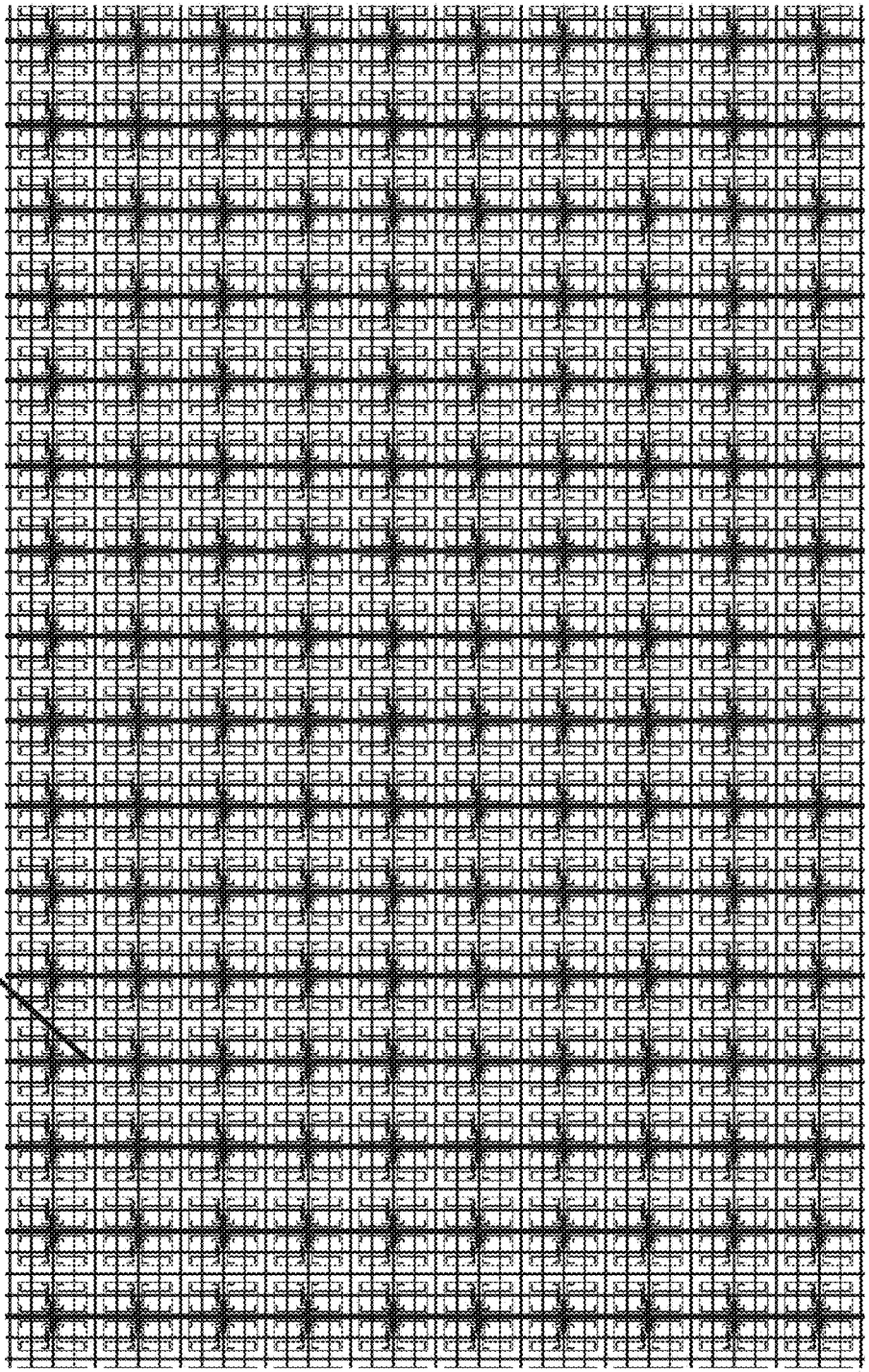
FIG. 34 is an illustration of a display formed using micro assembly with integrated circuit pixel clusters that can each act as an independent display, according to an illustrative embodiment of the invention.
Figure 35:
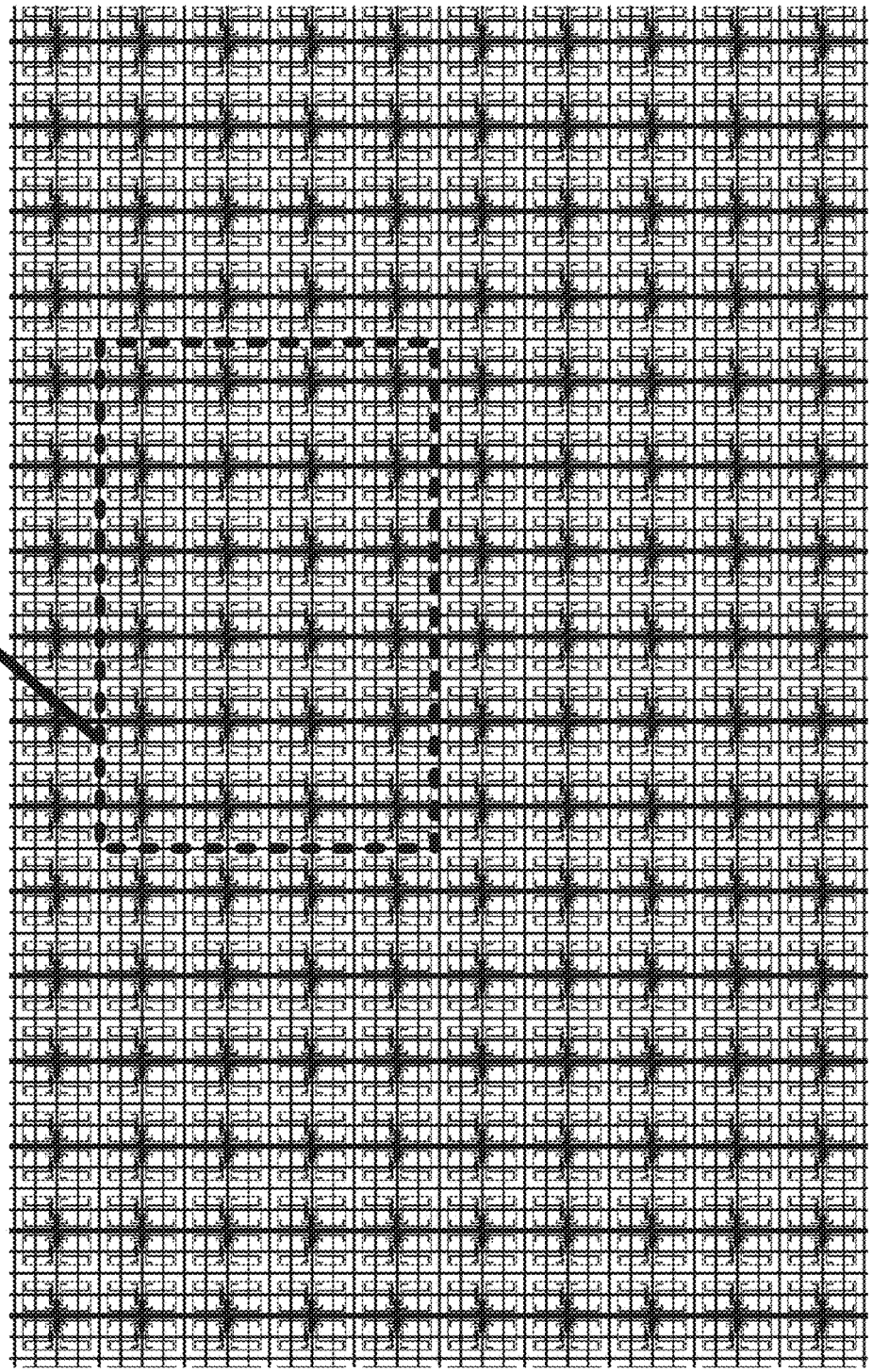
FIG. 35 is an illustration of an example in which a user has selected to turn on just a portion of the overall device, according to an illustrative embodiment of the invention.
Figure 36:
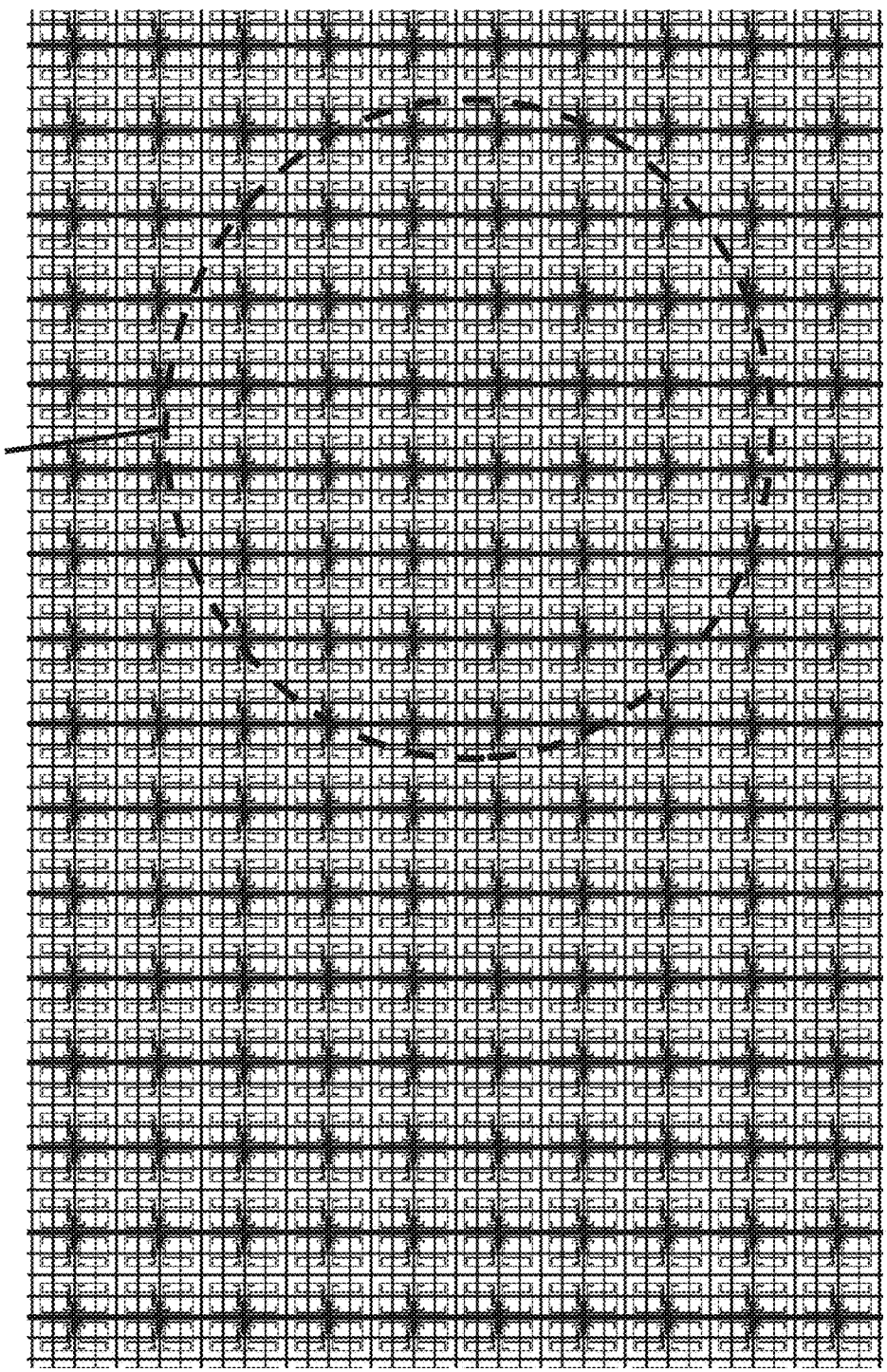
FIG. 36 is an illustration of an example in which a user has selected to turn on just a portion of the overall device in a non-standard shape, according to an illustrative embodiment of the invention.

FIG. 34 is an illustration of a display 3400 formed using micro assembly. Each integrated circuit pixel cluster can act as an independent display and each cluster of functional elements can be independently operated from the control element. For example, small portions of the overall device can be powered on when in use, and the rest of the array device (a display for example) can remain powered off. FIG. 35 is an illustration of an example display 3500 in which a user has selected to turn on just a portion of the overall device. FIG. 36 is an illustration of an example display 3600 in which a user has selected to turn on just a portion of the overall device in a non-standard shape, for example a shape that is not rectangular.

Figure 37:
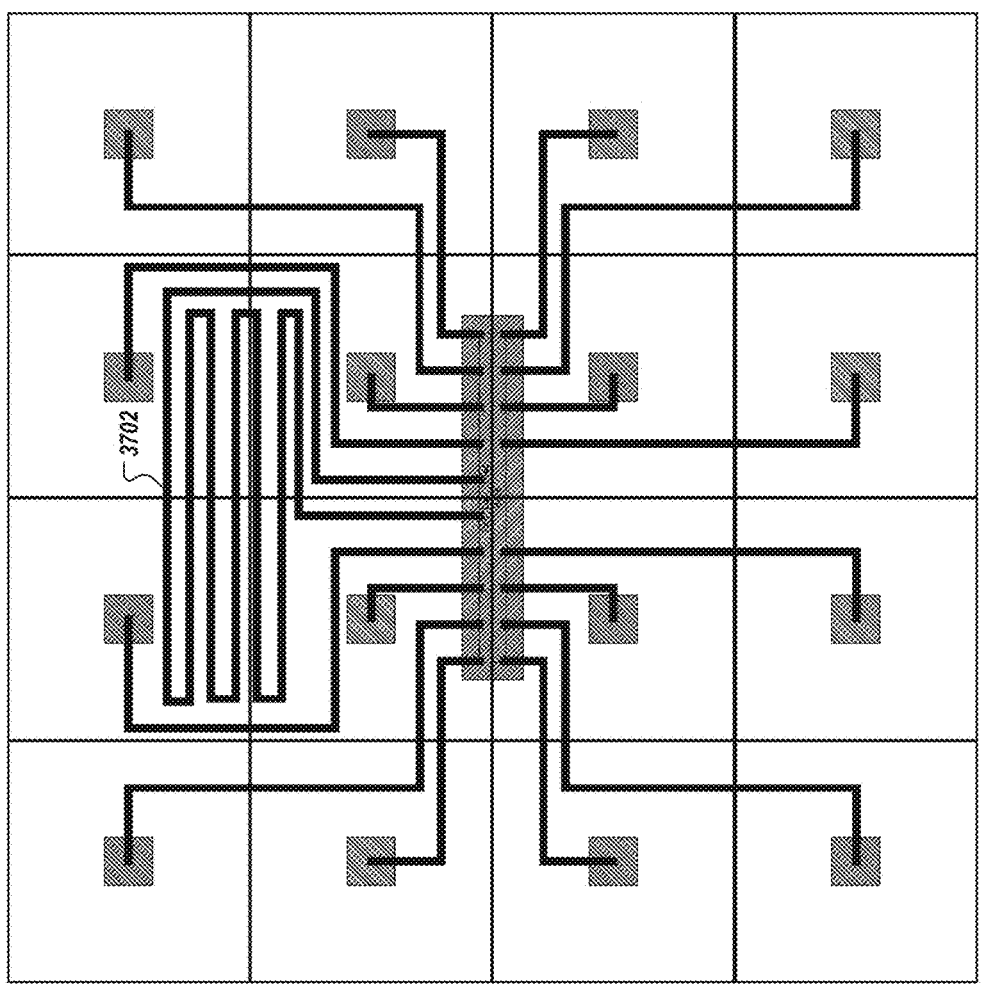
FIG. 37 is an illustration of an example array with wireless data and/or power input, according to an illustrative embodiment of the invention.

FIG. 37 is an illustration of an example array 3700 with wireless data or power input. The control element can be connected to integrated antennas 3702. Thus, display tiles can have data or power streamed into the functional device array (e.g., display) using wireless electromagnetic transmission.

FIG. 38 is an illustration of a control element designed to have built-in redundancy. For example, an extra control chip (as described above) can be printed per element cluster. Micro-assembled jumpers or cross-overs can be used to provide a means to electrically connect the back-up control element (e.g., connecting pad 3802 to pad 3804). Thus, as discussed above, a sparsely populated multi-functional array can provide space for spare devices enabling additional functionality and can use micro-assembled low-cost jumpers to connect to the spare devices.

Figure 39:
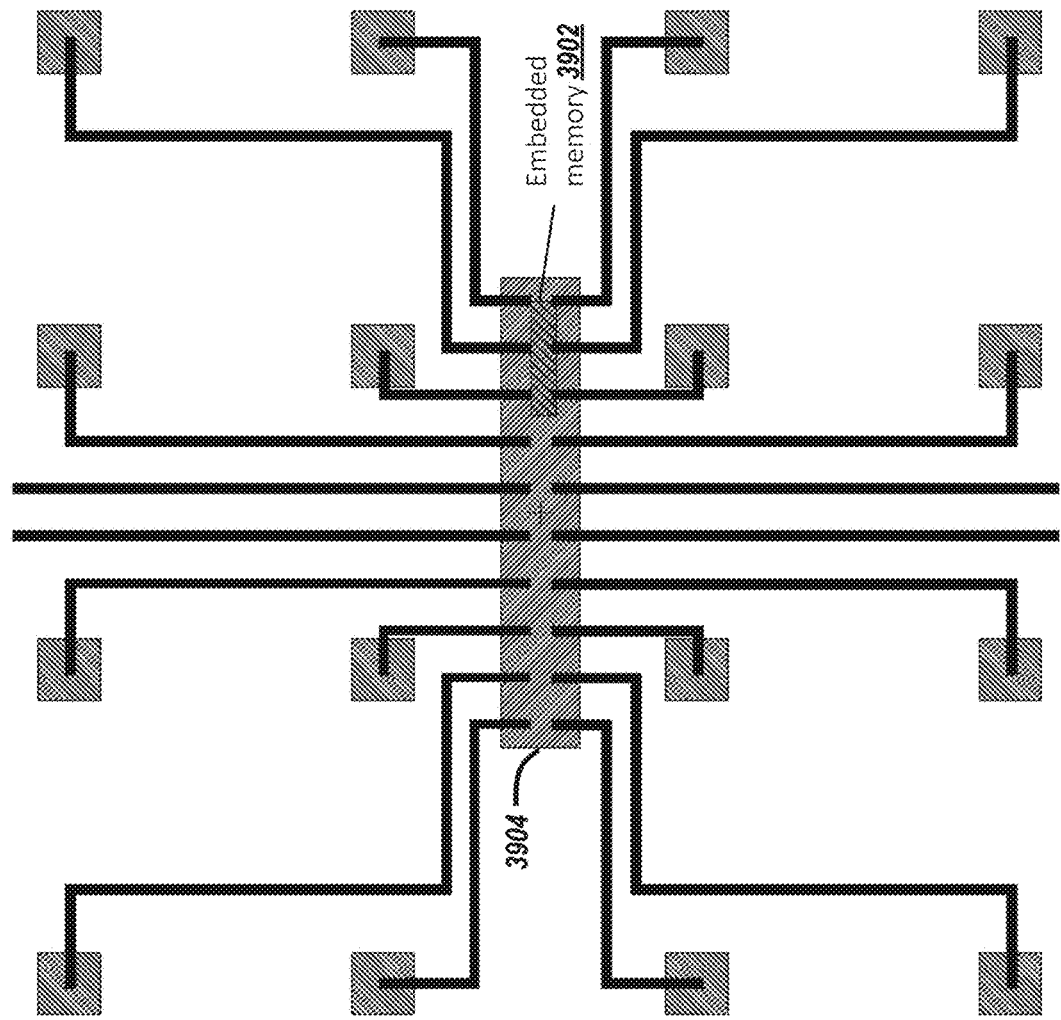
FIG. 39 is an illustration of an array with a control device with built-in memory, according to an illustrative embodiment of the invention.

FIG. 39 is an illustration of an array 3900 with a control device 3904 with built-in memory 3902. The control device 3904 can be an integrated circuit control device that includes embedded memory. This enables a refresh-on-demand power-saving display for static images.

Figure 40:
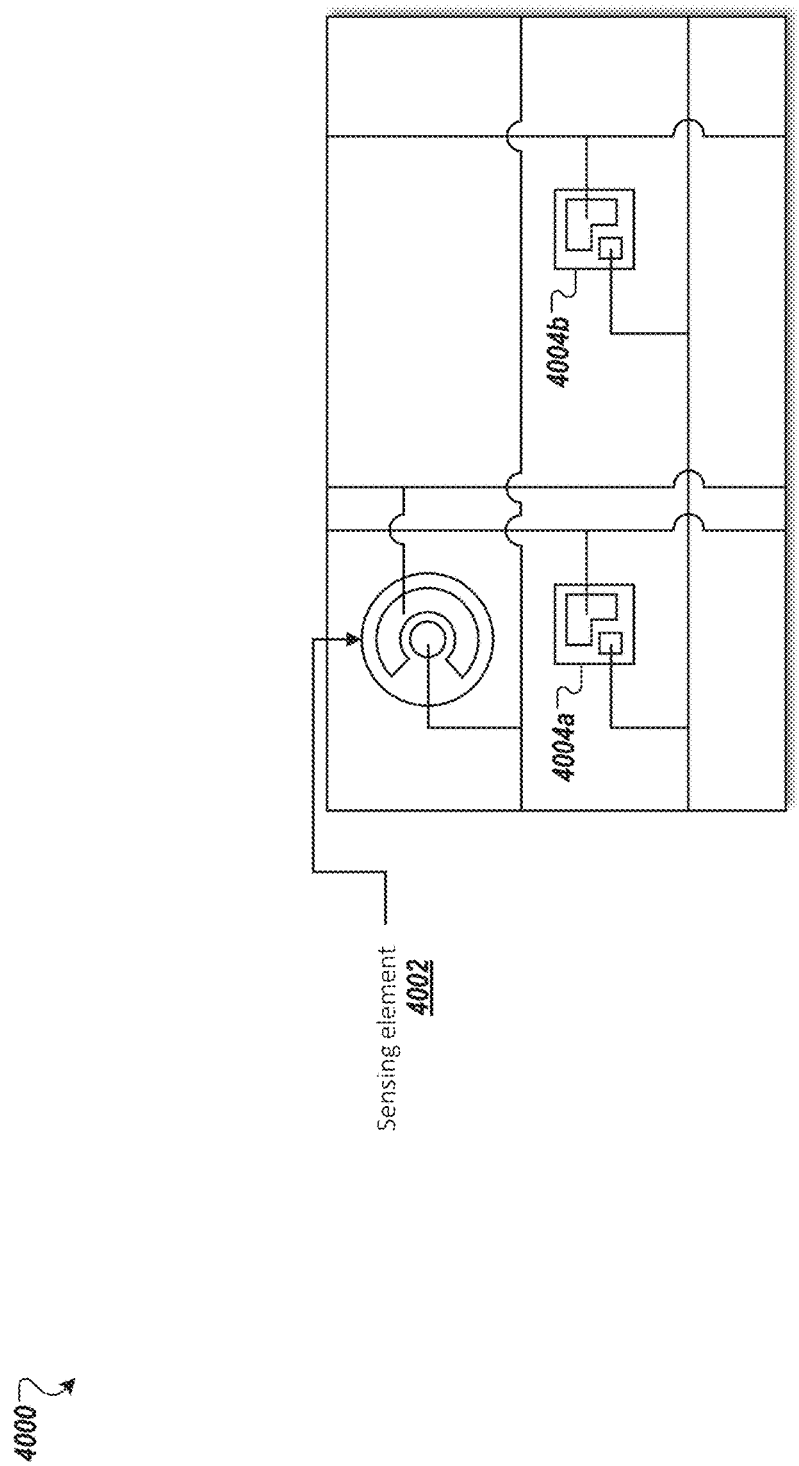
FIG. 40 is an illustration of a micro-assembled micro-LED display with micro-assembled temperature sensing elements, according to an illustrative embodiment of the invention.

FIG. 40 is an illustration of a micro-assembled micro-LED display 4000 with micro-assembled temperature-sensing elements 4002. Micro-assembly techniques facilitate the formation of micro-assembled micro-LED displays that include micro-assembled micro-LEDs 4004a and 4004b (collectively 4004) and micro-assembled IR or temperature-sensing devices 4002. Displays that include temperature or IR sensing can provide desirable data input capabilities, for example a touch-free human-device interface. IR or temperature-sensing devices, in some embodiments, include low band gap semiconductors (e.g., InGaAs, InGaAsSb, HgCdTe), pyroelectric materials (e.g., lithium tantalate or lithium niobate), thermopiles and other devices that respond electrically to temperature gradients or temperature changes. In some embodiments, it is advantageous for the display to include one type of temperature-sensing device. In some embodiments, the display includes more than one type of temperature-sensing device.

In some embodiments, the micro-assembled display includes one or more of several colors of micro-assembled micro-LEDs, several different types of micro-assembled IR or temperature-sensing devices, micro-assembled passive electrical components, or micro-assembled control or memory elements. In some embodiments, the number of sensing elements is less than the number of micro-LEDs in the display. In some embodiments, the number of sensing elements is equal to or larger than the number of micro-LEDs.

The disclosed technology, in some embodiments, provides a passive-matrix display that uses inorganic micro-LEDs and a method of manufacturing the display. Similarly, in some embodiments, the disclosed technology provides for active-matrix displays using inorganic micro-LEDs and a method of manufacturing the display.

Figure 41:
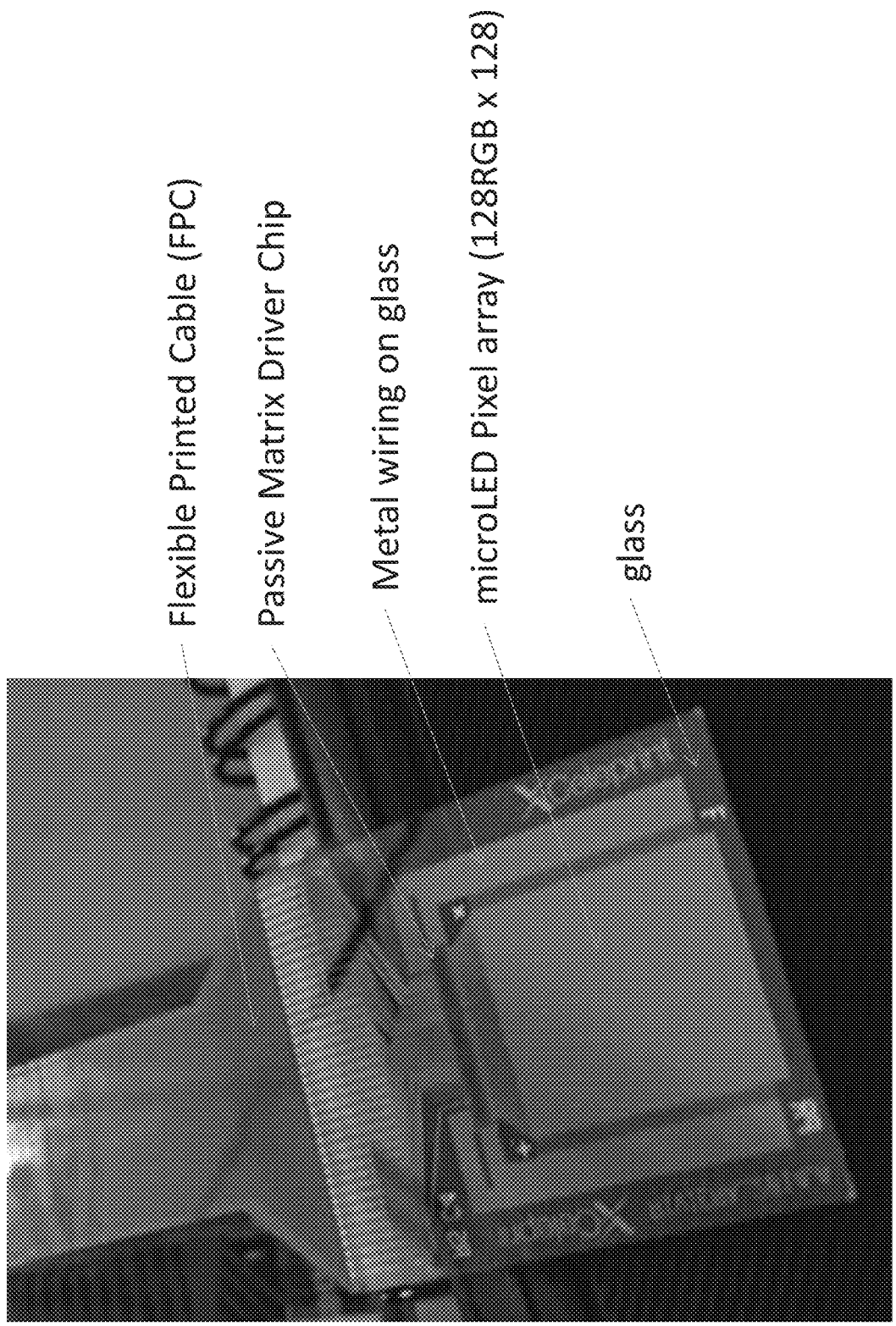
FIG. 41 is an image of a passive-matrix inorganic light-emitting diode display, according to an illustrative embodiment of the invention, according to an illustrative embodiment of the invention.

An image of a complete passive-matrix inorganic light-emitting diode (LED) display is shown in FIG. 41. This display includes a 360×90 array of micro-scale red LEDs. The micro-LEDs used in the display described herein were prepared on their native substrate, partially removed from the substrate and the position of the micro-LEDs on the native substrate was maintained by a tether (e.g., a single, off-center tether for each LED), and then micro transfer printed using a viscoelastic elastomer stamp. The micro-LEDs were formed on their native substrate with a resolution of approximately 3000 micro-LEDs per square inch. In some embodiments, the micro-LEDs are formed on their native substrate with a resolution of up to $10^6$ or $10^8$ micro-LEDs per square centimeter.

Figure 42:
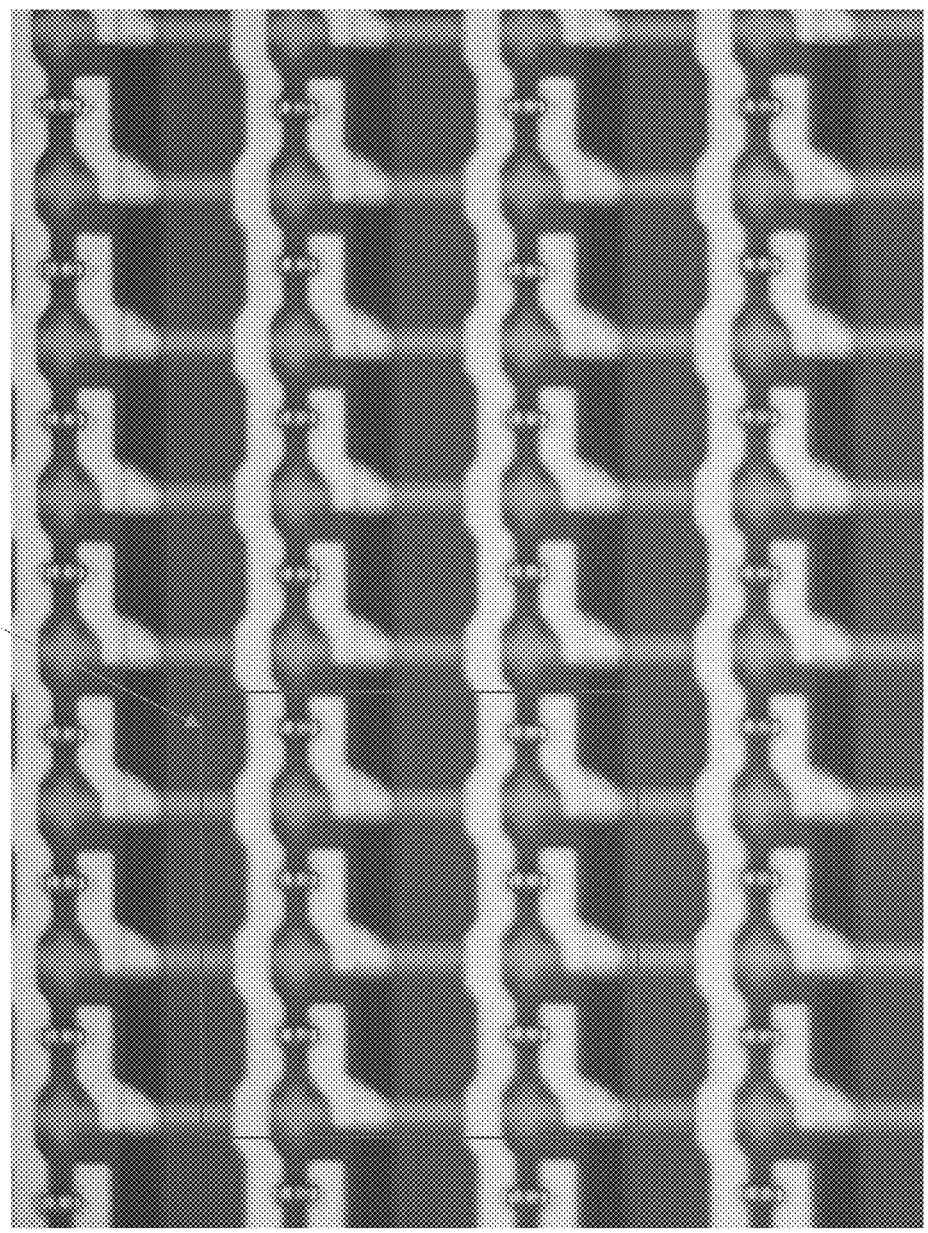
FIG. 42 is an optical micrograph of a pixel within the display, according to an illustrative embodiment of the invention, according to an illustrative embodiment of the invention.

The illustrative display is designed to support a 128×128 pixel array using red, green, and blue LEDs. Further, in this example, there are two sites for each color LED (red, green, and blue) in each pixel so that a redundancy scheme such as those described herein can be implemented (if desired). In this demonstration, red LEDs were populated into the green and blue sub pixel sites. Other color micro-LEDs can be used in addition to red in order to produce a full-color display. The pixel size is 99×99 microns as shown in FIG. 42, equating to 256 pixels per inch. The emissive area is 11.88 mm×8.91 mm. The size of the glass substrate that supports the display is approximately 25 mm×25 mm.

Figure 43:
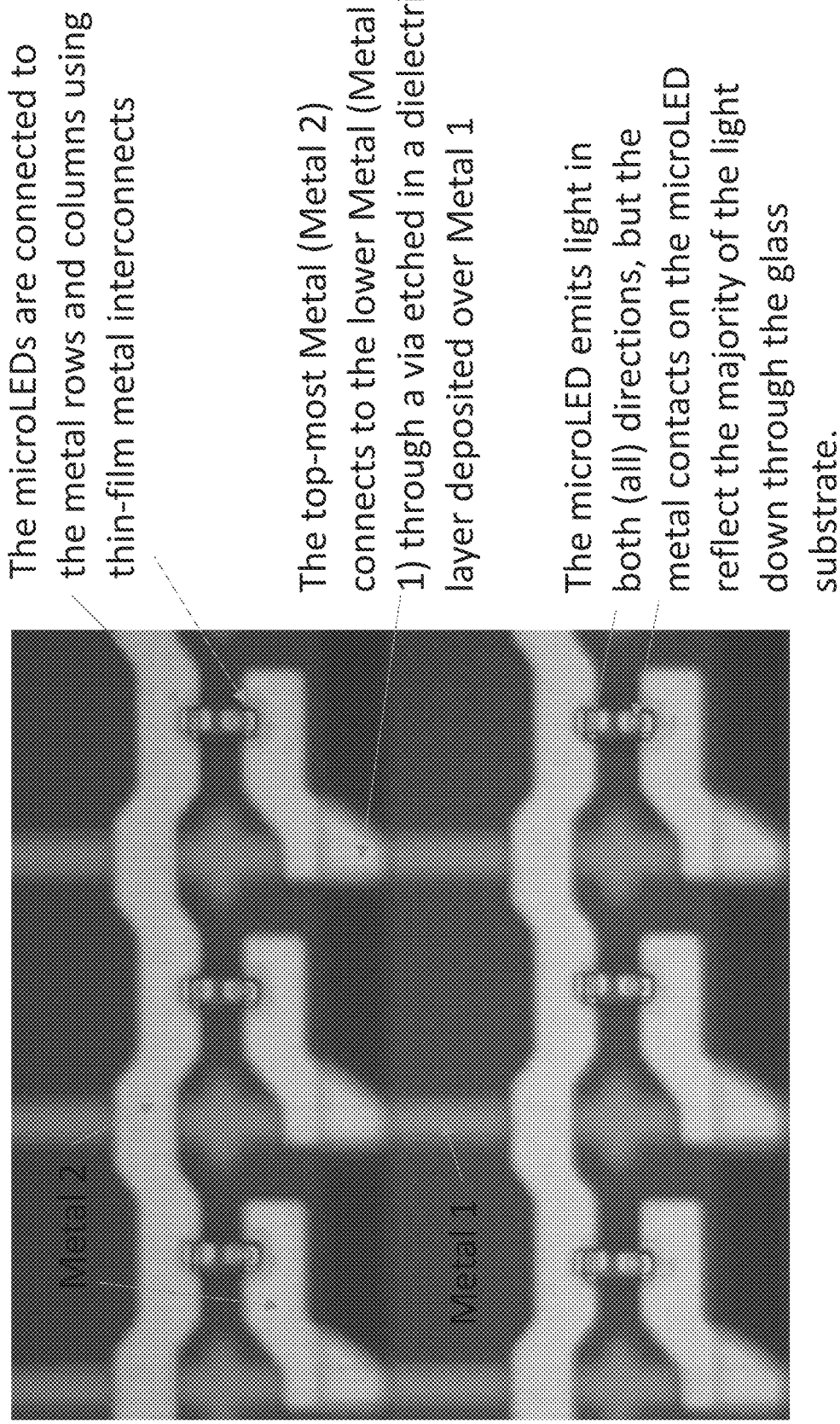
FIG. 43 is an optical micrograph of a single pixel within the display, according to an illustrative embodiment of the invention, according to an illustrative embodiment of the invention.

FIG. 43 is an optical micrograph of a single pixel within the display. The micro-LEDs are connected to the metal rows and columns using thin-film metal interconnects. The top-most metal (e.g., metal 2) connects to the lower metal (e.g., metal 1) through a via etched in a dielectric layer deposited over metal 1. The micro-LEDs emit light in both (all) directions, however, the metal contacts on the micro-LED reflect the majority of the light down through the glass substrate.

Figure 45:
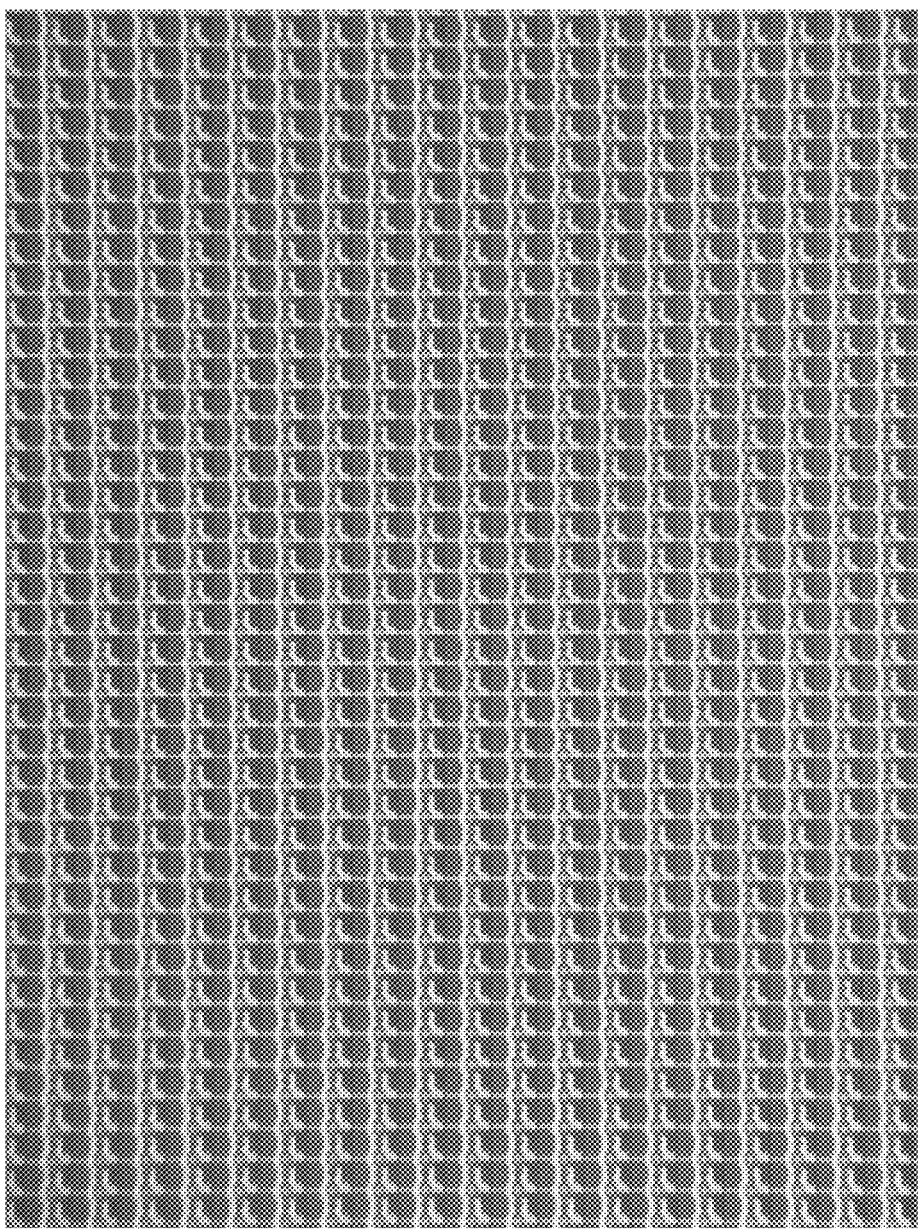
FIG. 45 is an optical micrograph of the pixel array of the display, according to an illustrative embodiment of the invention, according to an illustrative embodiment of the invention.

FIG. 44 is an image of the completed display substrate (a glass substrate) with passive-matrix displays thereon. Sixteen displays are printed to each 150 mm glass wafer. In some cases, fewer than 16 displays are printed. FIG. 45 is an optical micrograph of the pixel array of the display.

Figure 46:
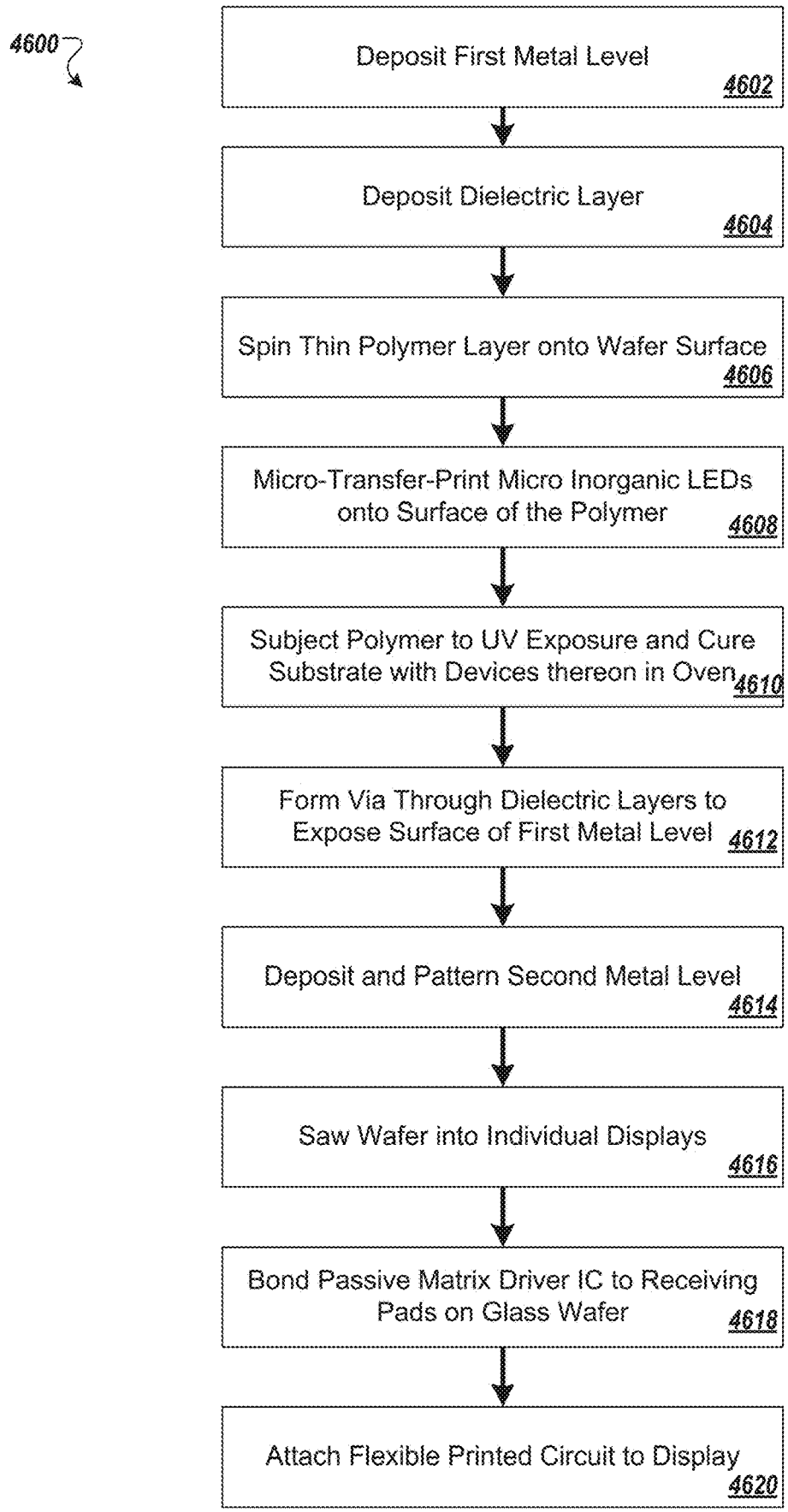
FIG. 46 is a flow chart of a method for manufacturing a passive-matrix inorganic light-emitting diode display, according to an illustrative embodiment of the invention.

FIG. 46 is a flow chart illustrating a method 4600 for manufacturing a passive-matrix inorganic light-emitting diode display such as the display shown in FIGS. 47A-B and 48A-B manufactured on a 150 mm glass wafer (0.7 mm thick). As discussed above, other substrates such as sapphire and plastic can be used as the display substrate as well. The display substrate can be thin (e.g., 0.5 to 1 mm thick).

A first metal level was deposited and patterned on the wafer surface using metal physical vapor deposition and photolithography techniques (4602). Specifically, negative-acting photoresist was exposed and developed to create a lift-off template, the metal stack of Ti/Al/Ti was deposited using e-beam evaporation, and then the patterned metal layer was completed by removing the lift-off template. Metal 1 included Aluminum (2000A) and Titanium (250A) stack. The purpose of the top-most Titanium is to protect the Aluminum from passivating chemistries later in the process flow.

A dielectric layer of silicon nitride is deposited onto the wafer surface (4604) to create an electrically insulating layer between Metal 1 and Metal 2. Next, a thin polymer layer is spun onto the wafer surface using a wafer spin-coater (4606). Here, a photosensitive negative-acting semiconductor-grade epoxy from Dow Chemical Co. of Midland, Mich. (Dow Intervia 8023) is used. The solvents are removed from the polymer using heat treatments. Specifically, a soft bake on a hot plate at 140 degrees Celsius for 4 minutes, followed by a 30-min bake in an oven at 90 degrees Celsius under flowing nitrogen.

Next, the micro-scale inorganic LEDs are micro-transfer-printed onto the surface of the polymer (4608). The micro-transfer-printing was performed using a print tool. The print process is facilitated using a viscoelastic elastomer stamp. The transfer process takes advantage of the kinetically tunable adhesion between solids (the LEDs) and the viscoelastic elastomer surface. To pick up the LEDs, the tool moves the stamp quickly away from the source surface, leading to an effective increase in the adhesion between the elastomer and the chips. During printing the print tool moves the stamp slowly away for the destination surface, thereby leaving the LED on the destination surface (e.g., the polymer surface). In addition, the print step is aided by a lateral shear imparted to the stamp during the transfer process. The stamp transfers a 120×90 array of micro-LEDs to the display. To complete the 360×90 display, three print operations are performed.

To make a full-color display (120 RGB×90), three separate print operations are needed, one for the red, one for the green and one for the blue light emitters. To achieve redundancy, additional LEDs can be printed. In this example, six LEDs were printed to each pixel as shown in FIG. 43. Thus, this configuration can implement redundant micro-LEDs.

The pixel in FIG. 43 shows an example of six micro-LEDs within a single 99×99 micron pixel. In this example, the full LED array was printed in six transfer operations. For the display shown here, only three sub pixel sites are utilized (e.g., driven with the driver chip).

Following the transfer of the micro-LEDs, the polymer is first exposed to UV radiation and then cured in an oven at 175 degrees Celsius for 3 hours under flowing nitrogen (4610). The UV exposure of the polymer is an important step to preventing the micro-LEDs from moving during the oven cure.

Next, a via (window) is formed through the dielectric layers (both the polymer and silicon nitride) to expose the surface of Metal 1 (4612). This process is performed using standard photolithography (exposure and development of a positive-acting photoresist) and reactive ion etching of the polymer and silicon nitride layers. The topmost Titanium on the Aluminum serves to prevent the Aluminum from being passivated during the reactive ion etching step.

Next, a second metal (Metal 2) is deposited and patterned (4614). The purpose of Metal 2 is to contact both the anode and cathode of the micro-LED and to connect the anode to Metal 1 through the via. This process is achieved by first patterning a lift-off mask in a negative-acting photoresist, next depositing the metal stack (Ti/Al/Ti/Au), and finally lift-off of the photoresist mask to leave behind the patterned metal wiring.

The wafer is sawn into individual displays using a dicing tool (4616) (e.g., a Dico dicing tool). The display wafer is coated with a protective photoresist layer in advance of dicing, and this protective photoresist layer is solvent stripped from each individual display die following dicing.

After cutting the individual displays from the wafer, a passive-matrix driver IC is bonded to receiving pads on the surface of the glass wafer (4618). This is accomplished using standard "chip-on-glass" bonding procedures, in which an anisotropic conductive film (ACF) is used to make electrical connections between the metal (Metal 2) pads on the glass and the metal pads on the driver IC.

Next, a flexible printed circuit (cable) is attached to the display (4620) using "flex-on-glass" technology. Here an ACF film is used to electrically interconnect the flexible printed circuit to the metal (Metal 2) pads on the display glass.

In this example, an FPGA driver board was used to send input (pictures) into the driver chip, and ultimately the display. The flexible printed circuit connects the driver chip and display to the FPGA driver board.

Figure 47A:
FIG. 47A is an image of a passive matrix inorganic light-emitting diode display, according to an illustrative embodiment of the invention.
Figure 47B:
FIG. 47B is a close up image of the passive matrix-inorganic light-emitting diode display of FIG. 47A, according to an illustrative embodiment of the invention.
Figure 48B:
FIG. 48B is a close up image of the passive matrix inorganic light-emitting diode display of FIG. 48A, according to an illustrative embodiment of the invention.
Figure 48A:
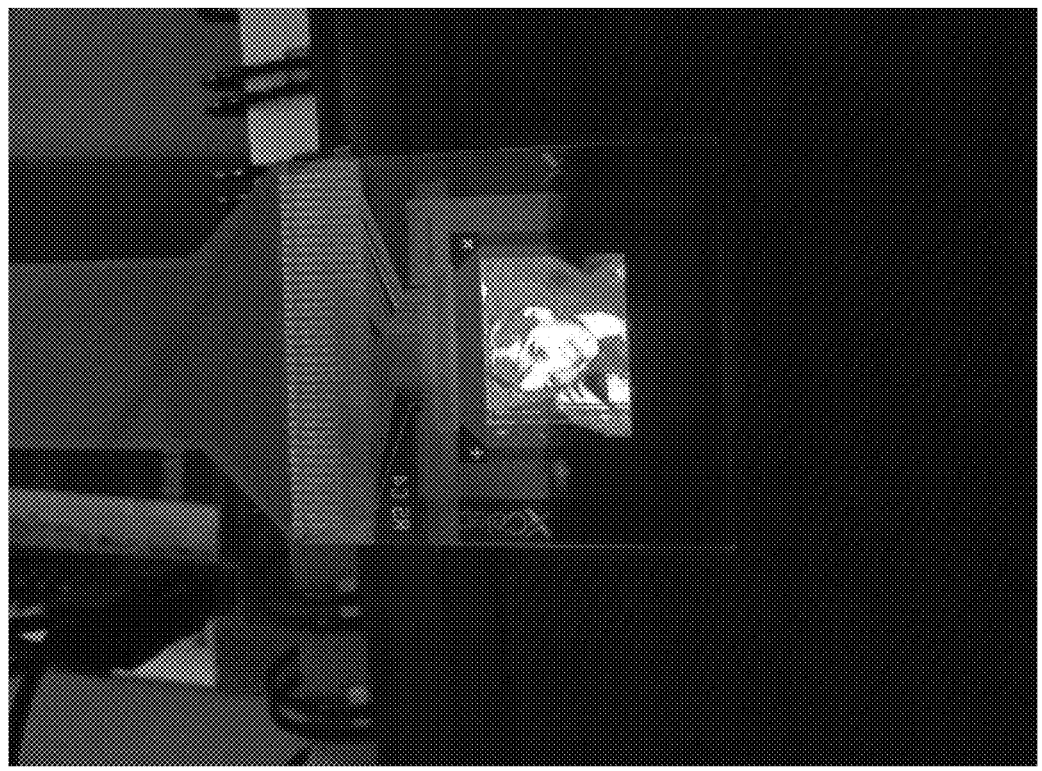
FIG. 48A is an image of the passive matrix inorganic light-emitting diode display, according to an illustrative embodiment of the invention.
Figure 49A:
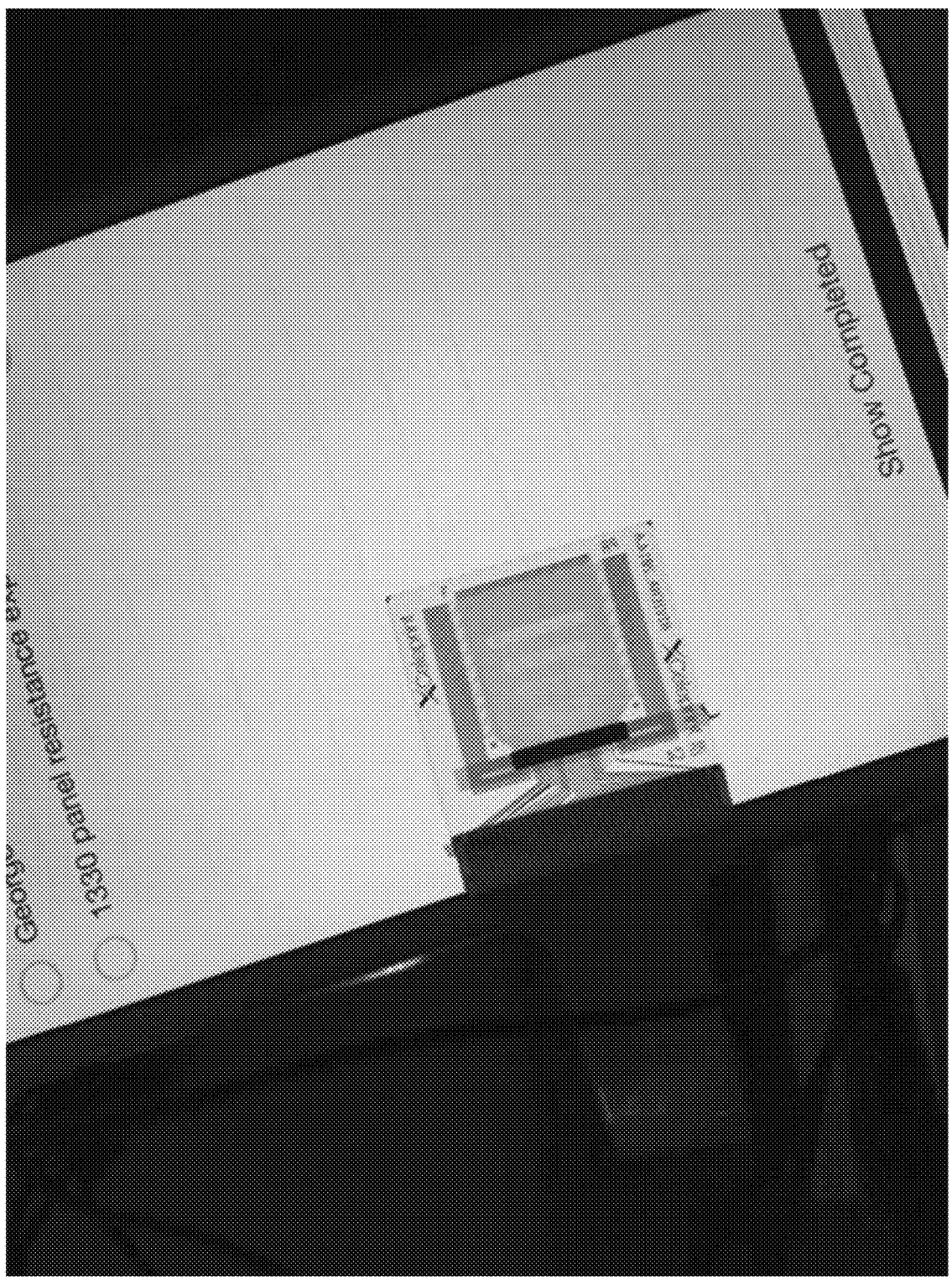
FIGS. 49A-49G are images showing that the display is partially transparent, according to an illustrative embodiment of the invention.
Figure 49C:
Figure 49B:
Figure 49E:
Figure 49D:
Figure 49G:
Figure 49F:

FIGS. 47A-47B and 48A-48B are images of the working display. FIG. 47A is an image of the passive-matrix inorganic light-emitting diode display and FIG. 47B is an enlarged image of the passive-matrix inorganic light-emitting diode display. FIG. 48A is another image of the passive-matrix inorganic light-emitting diode display and FIG. 48B is a different enlarged image of the passive-matrix inorganic light-emitting diode display. FIG. 49A-49G are images demonstrating the display transparency. Ambient light is blocked by the metal lines and the small LEDs, the remaining layers are transparent.

Figure 50:
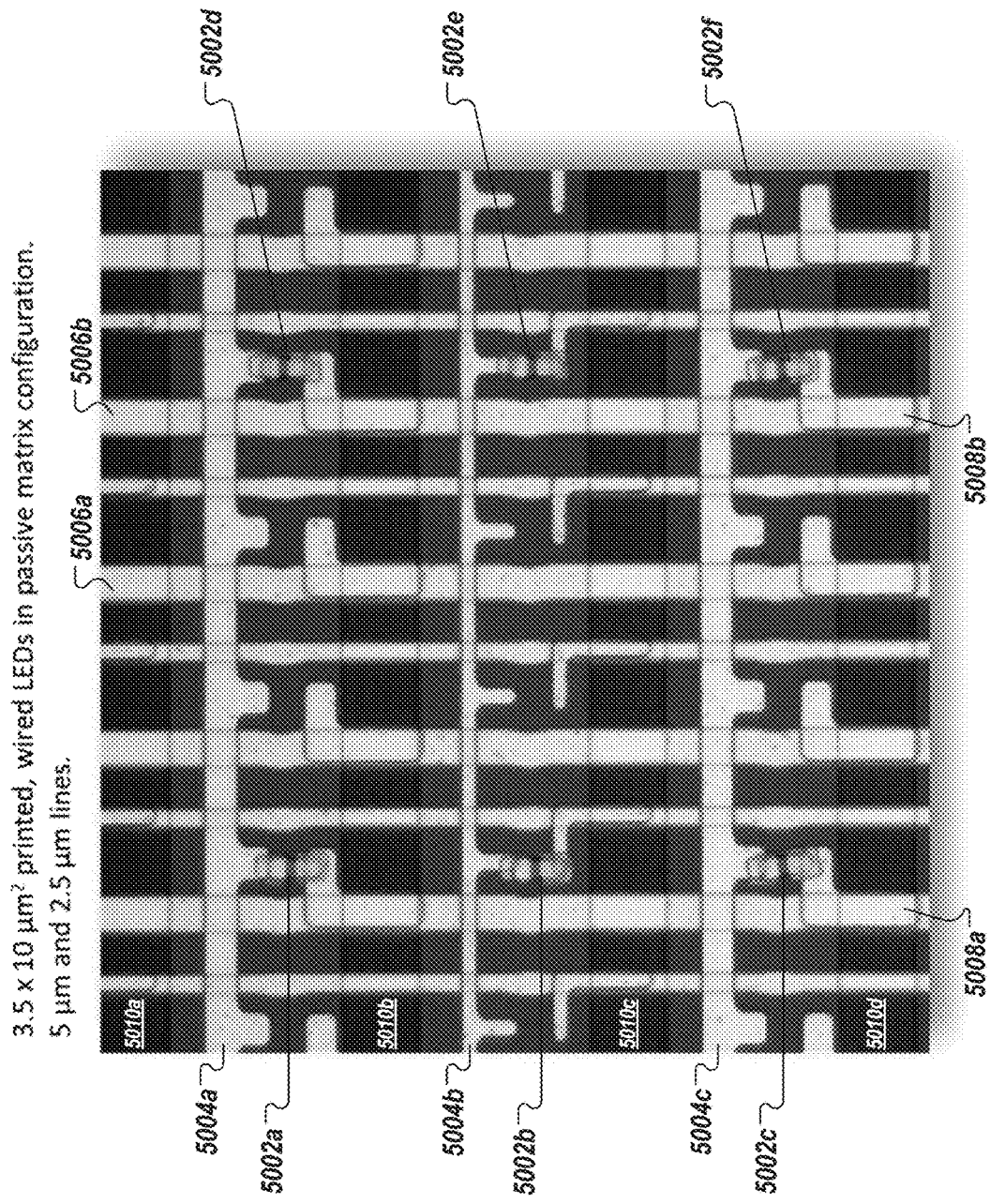
FIG. 50 is an optical micrograph of example printed LEDs wired in a passive-matrix configuration.

FIG. 50 is a micrograph of an example micro-LED display wired in a passive-matrix configuration. Micro-assembled LED displays use a plurality of micro-LEDs transferred from an epitaxial substrate to a display substrate (e.g., to a display substrate that is non-native to the LEDs, such as plastic or glass) to produce a display. The disclosed display architecture establishes contact to both terminals of each LED from the "top" of each LED. The conductive lines and spaces (or other shapes) that contact the anode of an LED are laterally separated from the conductive structures that contact to the cathode of the same LED. In this embodiment, the LED also has electrically contactable terminals (for example cathode and anode) laterally separated from each other. This configuration allows interconnection to the LEDs to be established using panel processing or other large-area processing in which the lines and spaces are relatively coarse and inexpensive to form on a per area basis (e.g., 2 micron lines and spaces to 2 mm lines and spaces). For example, the micro-LED display shown in FIG. 50 utilizes 2.5 µm and 5 µm conductive lines for the row lines 5004a-5004c, the column lines 5006a-5006b, and interconnections 5008a-5008b.

In some embodiments, the electrically contactable terminals on the micro-LEDs are formed to occupy as much of the footprint of the LED area as possible. Thus, in order to accomplish the lateral separation of the two terminals of the micro-LEDs, in some embodiments, the LEDs have a length significantly longer than its width. In some embodiments, the LEDs use fine lithography (for example wafer-scale lithography having features ranging from 100 nm to 20 microns) to reduce the separation distance between the terminals.

For example, the LEDs 5002a-5002f as shown in FIG. 50 are rectangular micro-LEDs. Specifically, in this example, the LEDs have a width of 3.5 µm and a length of 10 µm. The elongated geometry is advantageous in certain embodiments, including when the terminals for each LED are located on one face of the LED. Among other things, the elongated geometry of the LED coupled with the large terminal electrodes provides for ease of placement (e.g., decreasing the accuracy required to place each LED). In certain embodiments, the length-to-width ratio is greater than 2, for example, in a range from 2 to 5. In certain embodiments, the LEDs described herein have at least one of a width, length, and height from 2 to 5 µm, 5 to 10 µm, 10 to 20 µm, or 20 to 50 µm.

In some embodiments, the column electrodes (e.g., conductive lines 5006a-5006b) are formed on a substrate. An insulating layer is applied over the column electrodes. Holes 5010a-5010d are formed in the column electrodes to expose the column electrodes. The LEDs 5002a-5002f are micro-transfer printed onto the insulating layer. Conductive material can be applied in a single level to form the row electrodes 5004a-5004c and the interconnections (e.g., 5008a-5008b) to the column electrodes. The row electrodes 5004a-5004c electrically contact a first terminal on the respective LEDs while the interconnections (e.g., 5008a-5008b) electrically connect a second terminal on a respective LED to a respective column electrode. Thus, the LED terminals (which are on the same face of the LED) can be connected on a single level. For example, the connection to the micro-LEDs can use a single photo mask and metal level (e.g., a single level) to establish connection to the two terminals of the LED.

Figure 51:
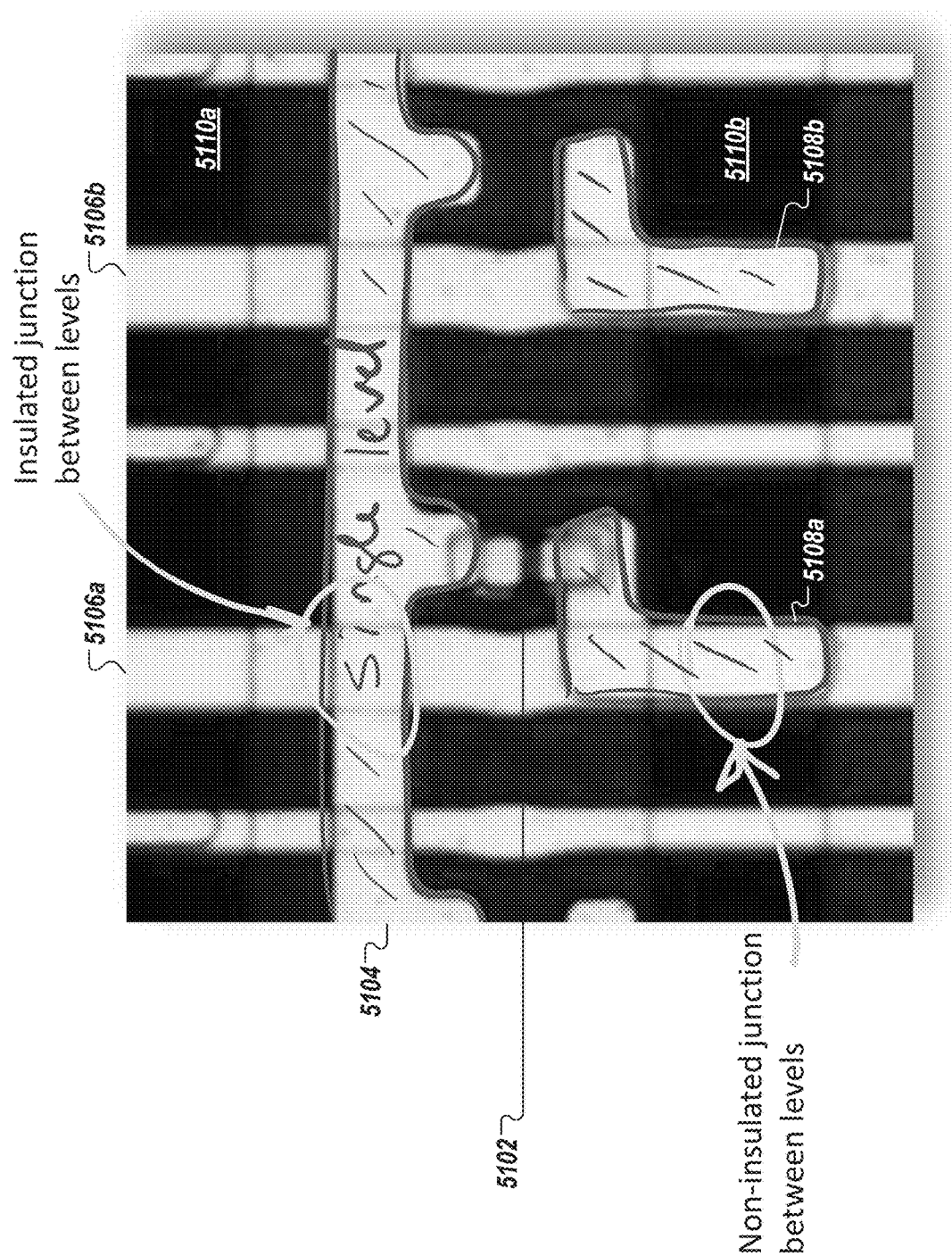
FIG. 51 is a schematic and optical micrograph of example printed LEDs wired in a passive-matrix configuration.

FIG. 51 is an illustration of example printed LEDs wired in a passive-matrix configuration. The row electrode 5104 and interconnections 5108a-5108b are formed on a single level. The interconnections 5108a-5108b are electrically connected to a respective column electrode 5106a-5106b. As shown in FIG. 51, the intersections between the interconnections 5108a-5108b and column electrodes 5106a-5106b, respectively, are uninsulated because holes 5110a and 5110b are formed in the insulation as discussed above. In contrast, the intersection between the row electrode 5104 and the column electrodes 5106a-5106b are insulated.

Figure 52:
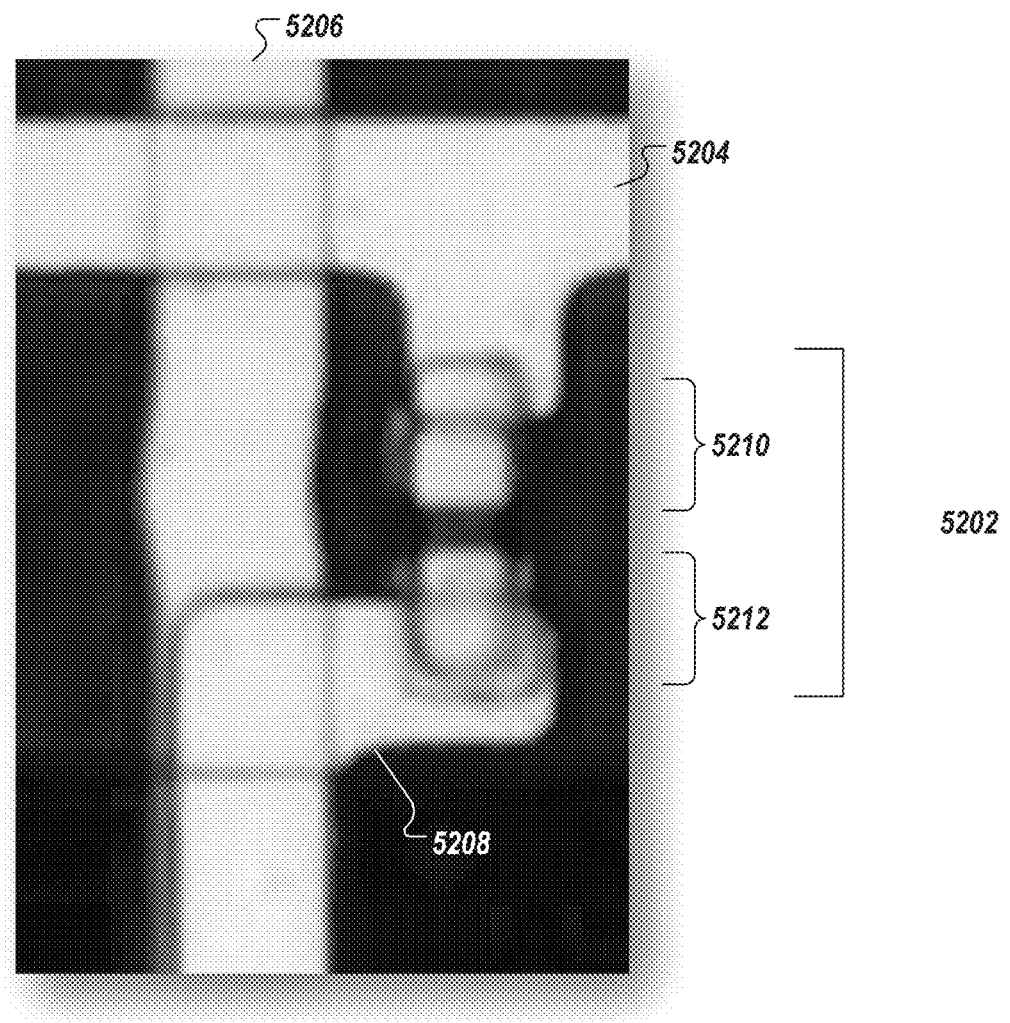
FIG. 52 is an optical micrograph of a single LED wired in a passive-matrix configuration.

FIG. 52 is an optical micrograph of a single LED 5202 wired in a passive-matrix configuration (e.g., an enlarged image of a single LED from FIG. 1). The LED 5202 includes a first terminal 5210 and a second terminal 5212. Reducing the lateral separation between terminals 5210 and 5212 of the LED and increasing the size of the terminals 5210 and 5212 within the confines of the dimensions of the LED increases the tolerance for registration and lithography errors between the assembled micro-LEDs and the relatively coarse conductive lines (5204, 5206, and 5208) used to interconnect them on the display substrate.

Figure 53A:
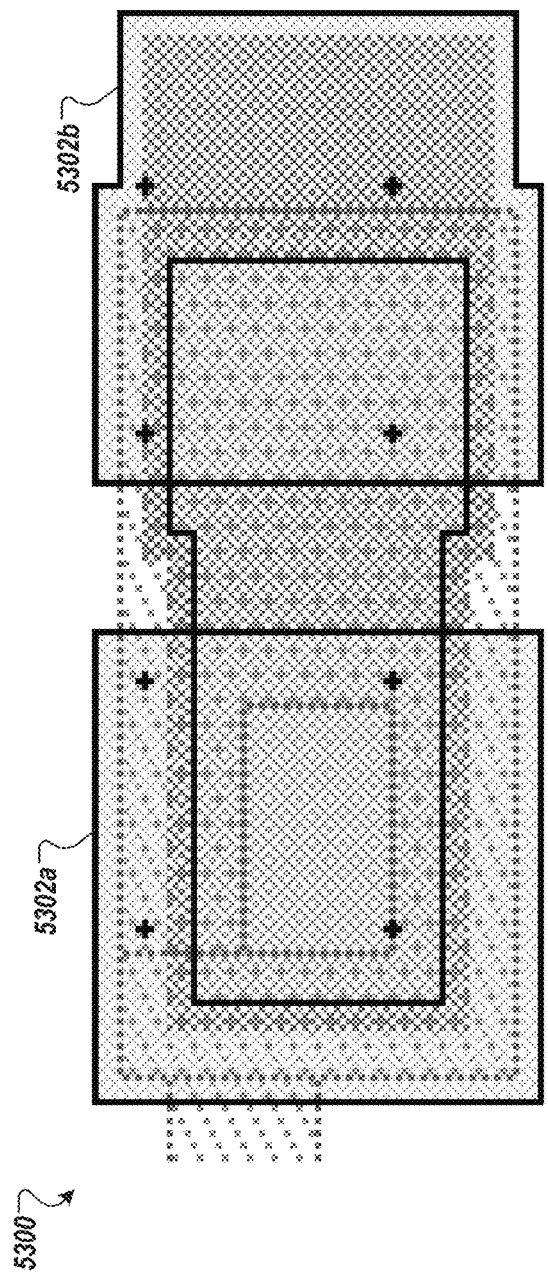
FIGS. 53A and 53B are a plan view and a cross section, respectively, of an example architecture of a micro-LED suitable for contacting both terminals from one face of the LED.
Figure 53B:
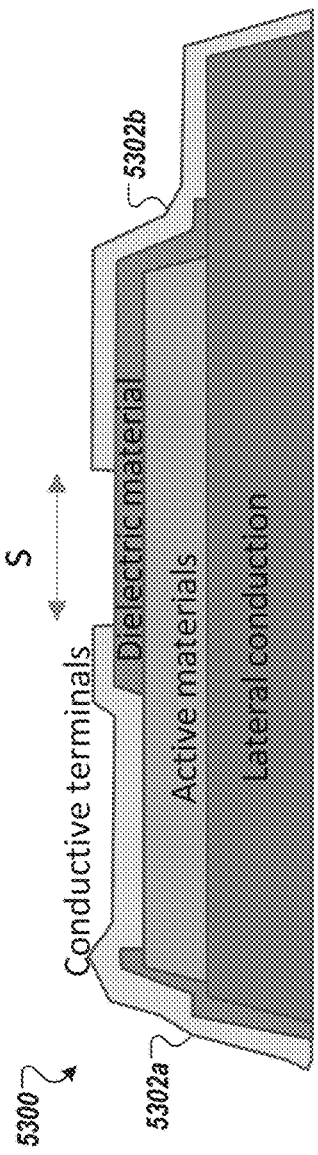

FIGS. 53A-53B are illustrations of an example architecture of a micro-LED suitable for contacting both terminals from one face of the LED. FIG. 53A is a plan view of LED 5300 and FIG. 53B is a cross section of LED 5300. As shown in FIGS. 53A and 53B, terminals 5302a and 302b cover a substantial portion of the top of the LED 5300 and both terminals 5302a and 5302b are on the top surface of the LED 5300. The gap between the electrodes is minimized (e.g., a distance of 100 nm to 100 microns) as discussed above. This configuration allows interconnection to the LEDs to be established using panel processing or other low-resolution large-area processing in which the lines and spaces are relatively coarse and inexpensive to form on a per area basis (e.g., 2 micron lines and spaces to 2 mm lines and spaces). In some embodiments, in order to accomplish the lateral separation of the two terminals of the micro-LEDs 5300, the LED 5300 has a length significantly longer than its width. In some embodiments, the LEDs use fine lithography (for example wafer-scale lithography having features ranging from 100 nm to 20 microns) to reduce the separation distance between the terminals.

The active layer is formed on a lateral conduction layer. The dielectric material is deposited on the active material and one face of the active layer and lateral conduction layer as shown in FIG. 53B. Terminal 5302a is connected to the active layer and terminal 5302b is connected to the lateral conduction layer.

In some embodiments, the LED emits a substantial majority of its externally emitted light downward. In these embodiments, the electrically contactable/conductive terminals can be formed in reflective metals, including gold, silver, nickel, aluminum, and alloys thereof. In contrast, in the downward emitting embodiments, the lateral conduction structure is formed in a material that is transparent to the light emitted from the LED, such as a semiconductor with a suitable band gap or absorption edge selected to minimize absorption in the lateral conduction layer. Mirrors (not shown here) can be formed above the LEDs to further reflect light from the LED down.

In some embodiments, the LEDs are configured to emit a substantial majority of its externally emitted light upward. In these embodiments, the electrically contactable/conductive terminals are formed in transparent materials, including transparent conductive oxides, ITO, ZnO, carbon nanotube films, and fine metal meshes. Also in the upward emitting embodiments, the lateral conduction structure can be formed in a material that is transparent to the light emitted from the LED, for example a semiconductor with a suitable band gap or absorption edge selected to minimize absorption in the lateral conduction layer. In these embodiments the lateral conduction layer can also include an optically reflective layer, including a dielectric mirror, a metal mirror and/or a material with high index of refraction to facilitate total internal reflection. Optically reflective materials or portions of the display substrate can be provided to reflect light from the LED up.

Figure 54A:
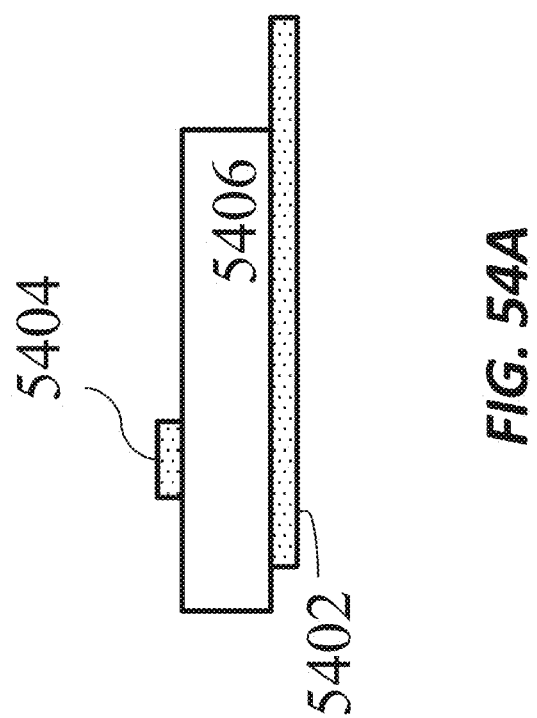

FIGS. 54A-54E illustrate embodiments of light-emitting diode structures in accordance with embodiments of the present invention. As shown in FIG. 54A, the first electrical contact 5402 is on a first side of the semiconductor element 5406 and the second electrical contact 5404 is on the opposite side of the semiconductor element 5406. In this example, the first electrical contact 5402 is accessible from the top when the semiconductor element 5406 is printed to the display substrate. The first electrical contact 5402 is formed such that a portion of it extends beyond the edge of the semiconductor element 5406, thereby enabling access to the first electrical contact 5402 from the same side of the structure as the second electrical contact 5404 when the structure is printed to a display substrate 5410. This can be advantageous when printed on a display substrate 5410 as both the first and second electrical contacts 5402, 5404 are accessible for connection in a common set of photolithographic steps.

Figure 54B:
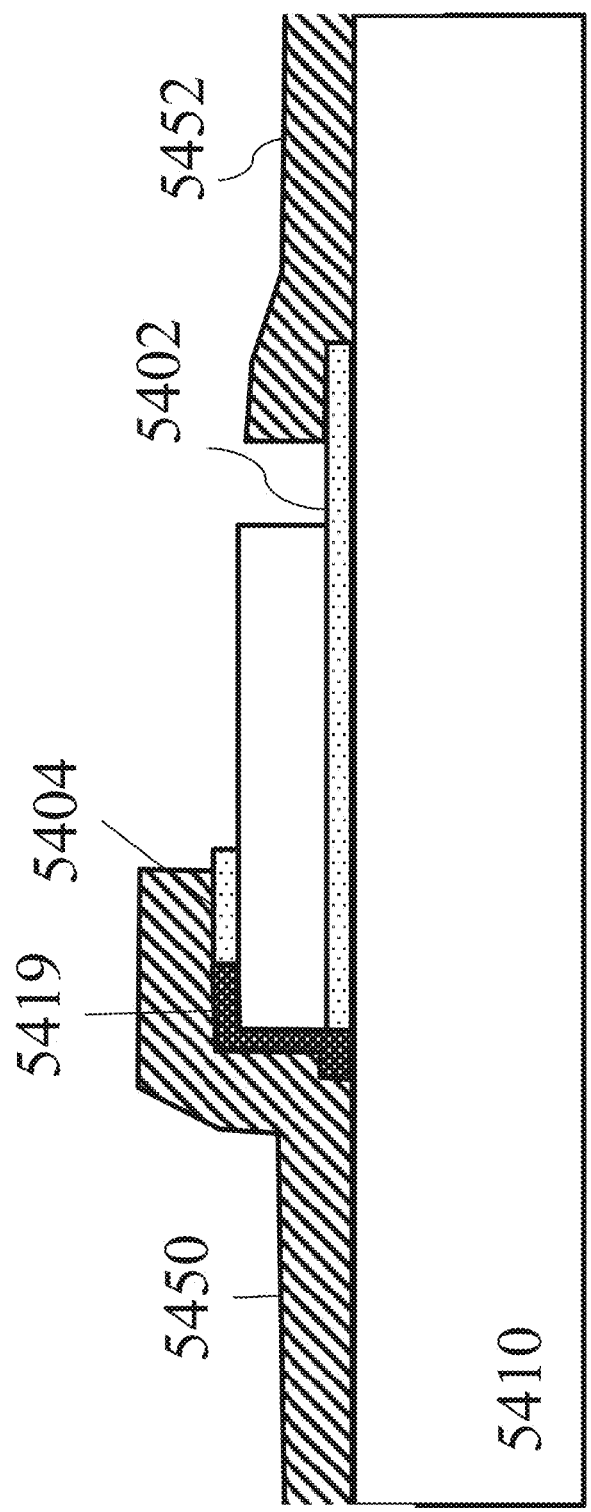

FIG. 54B illustrates the light-emitting diode of FIG. 54A on the display substrate 5410 with the first electrical contact 5402 in contact with the first contact pad 5452 on the display substrate 5410. An electrical connection 5450 can be made to the second electrical contact 5404 of the printed semiconductor structure. The passivation layer 5419 prevents unwanted electrical conduction to the semiconductor element 5406 from the first and second wires 5450, 5452.

The structure illustrated in FIG. 54A can be formed by removing a portion of the semiconductor element 5406 (e.g., by etching) such that a portion of the first electrical contact 5402 is exposed (e.g., accessible from the same side as the second electrical contact 5404) using photolithographic processes.

Figure 54C:
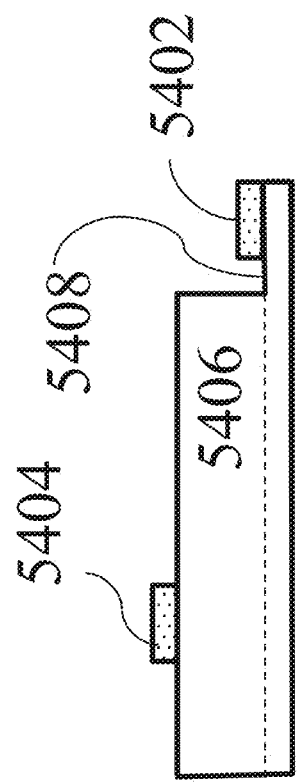

FIG. 54C illustrates an alternative structure locating both the first and second electrical contacts 5402, 5404 on the same side of the semiconductor element 5406. This structure is also made by removing a portion of the semiconductor element 5406, however, the removal of semiconductor material is stopped before the portion is etched entirely through the semiconductor element 5406 as done in the example shown in FIG. 54A, thereby leaving a cantilever extension 5408 of the semiconductor element 5406. In one embodiment, the cantilever extension 5408 is doped differently from the remainder of the semiconductor element 5406. This, for example, allows the cantilever extension 5408 to be more electrically conductive or to better prevent light emission while the remainder of the semiconductor element 5406 is doped to emit light in response to a current between the first and second electrical contacts 5402, 5404.

Figure 54D:
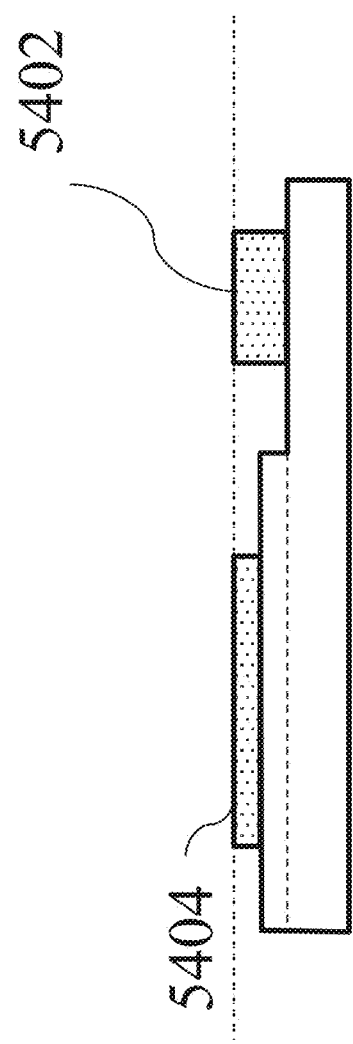

FIG. 54D illustrates an alternative structure for a light-emitting diode. This structure is similar to the structure shown in FIG. 54C, however, the first electrical contract 5402 is thicker such that the first electrical contact 5402 and second electrical contract 5404 have a top surfaces in the same plane or contacting a common surface. In some embodiments, this is advantageous as the light-emitting diode can be printed to a display substrate with co-planar connection pads already formed. This allows the light-emitting diode to electrically connect to the display circuit upon printing it to the display substrate 5410.

After the cantilever extension 5408 is formed, the first electrical contact 5402 is formed on the cantilever extension 5408 (e.g., by photolithography). In some embodiments, both the first and second electrical contracts 5402, 5404 are formed at the same time or one after the other.

The structures described above in relations to FIGS. 54A, 54C, and 54D can be printed on a display substrate 5410 using a printing process employing a stamp, such as an elastomeric stamp to form displays. FIG. 54B illustrates the light-emitting diode of FIG. 54A on the display substrate 5410 with the first electrical contact 5402 in contact with the first contact pad 5452 on the display substrate 5410. An electrical connection 5450 can be made to the second electrical contact 5404 of the printed semiconductor structure. The passivation layer 5419 prevents unwanted electrical conduction to the semiconductor element 5406 from the first and second wires 5450, 5452. Similarly, FIG. 54E illustrates the light-emitting diode of FIG. 54C on a display substrate 5406 with electrical wires 5450, 5452 formed.

Having described certain embodiments, it will now become apparent to one of skill in the art that other embodiments incorporating the concepts of the disclosure can be used. Therefore, the disclosure should not be limited to certain embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions can be conducted simultaneously.

What is claimed:

1. A method of assembling an inorganic light emitting diode (LED) display, the method comprising:
   providing a plurality of printable inorganic LEDs in or on one or more native substrates;
   transfer printing the plurality of printable inorganic LEDs onto a display substrate separate and distinct from the one or more native substrates to form a plurality of pixels, wherein each of the pixels comprises a set of primary inorganic LEDs and a set of redundant inorganic LEDs;
   connecting the primary inorganic LEDs to a display circuit in order to form the display comprising the plurality of pixels;
   testing the display to identify defective primary inorganic LEDs in the plurality of pixels; and
   establishing an electrical connection to a respective redundant LED of the set of redundant inorganic LEDs in close proximity to each of the defective primary inorganic LEDs so that each of the redundant inorganic LEDs is connected to the display circuit by placing a conductive jumper between the respective redundant LED and the one of the defective primary inorganic LEDs corresponding to the respective redundant LED by micro assembly.

2. The method of claim 1, wherein the set of primary inorganic LEDs comprises a plurality of red inorganic LEDs that emit red light, a plurality of green inorganic LEDs that emit green light, and a plurality of blue inorganic LEDs that emit blue light, and
   wherein the set of redundant inorganic LEDs comprises a plurality of redundant red inorganic LEDs that emit red light, a plurality of redundant green inorganic LEDs that emit green light, and a plurality of redundant blue inorganic LEDs that emit blue light.

3. The method of claim 1, wherein the set of primary inorganic LEDs comprises a plurality of yellow inorganic LEDs that emit yellow light; and the set of redundant inorganic LEDs comprises a plurality of redundant yellow inorganic LEDs that emit yellow light.

4. The method of claim 1, comprising disconnecting the defective primary inorganic LEDs from the display circuit.

5. The method of claim 1, wherein establishing the electrical connection to the respective redundant LED comprises directly and physically writing an electrical trace.

6. The method of claim 1, wherein establishing an electrical connection to the respective redundant LED comprises establishing electrical connection by solder reflow or contact between clean metal surfaces.

7. The method of claim 1, wherein testing the display comprises illuminating one or more of the primary inorganic LEDs and identifying the defective primary LEDs from the set of primary inorganic LEDs.

8. The method of claim 1, wherein the display substrate is a member selected from the group consisting of polymer, plastic, resin, polyimide, PEN, PET, metal, metal foil, glass, a semiconductor, and sapphire.

9. The method of claim 1, wherein the plurality of printable inorganic LEDs are micro transfer printed directly onto the display substrate.

10. The method of claim 1, wherein each inorganic LED in the plurality of pixels has a width from 2 to 5 μm, from 5 to 10 μm, from 10 to 20 μm, or from 20 to 50 μm.

11. The method of claim 10, wherein each inorganic LED in the plurality of pixels has a length from 2 to 5 μm, from 5 to 10 μm, from 10 to 20 μm, or from 20 to 50 μm.

12. The method of claim 1, wherein each inorganic LED in the plurality of pixels has a height from 2 to 5 μm, from 4 to 10 μm, from 10 to 20 μm, or from 20 to 50 μm.

13. The method of claim 1, wherein the display substrate has a transparency greater than or equal to 50% for visible light.

14. The method of claim 1, wherein the display substrate has a contiguous display substrate area that includes the set of primary inorganic LEDs and the set of redundant inorganic LEDs, wherein each LED in the plurality of pixels has a light-emissive area, and wherein the combined light-emissive areas of LEDs is less than or equal to one-quarter of the contiguous display substrate area.

15. The method of claim 14, wherein the combined light-emissive areas of the LEDs is less than or equal to one eighth of the contiguous display substrate area.

16. The method of claim 1, wherein providing the plurality of printable inorganic LEDs comprises forming the plurality of printable inorganic LEDs in or on the one or more native substrates.

17. A method of assembling an inorganic light emitting diode (LED) display, the method comprising:
   providing a plurality of printable inorganic LEDs in or on one or more native substrates;
   transfer printing the plurality of printable inorganic LEDs onto a display substrate separate and distinct from the one or more native substrates to form a plurality of pixels, wherein each of the pixels comprises a set of primary inorganic LEDs and a set of redundant inorganic LEDs;
   connecting each redundant inorganic LED of the set of redundant inorganic LEDs to the display circuit in series with a respective resistor to form an LED-resistor pair such that each LED-resistor pair is connected in parallel with a primary inorganic LED of the set of primary inorganic LEDs;
   connecting the primary inorganic LEDs to a display circuit in order to form the display comprising the plurality of pixels; and
   testing the display to identify defective primary inorganic LEDs in the plurality of pixels.

18. A method of assembling an inorganic light emitting diode (LED) display, the method comprising:
   providing a plurality of printable inorganic LEDs in or on one or more native substrates;
   transfer printing the plurality of printable inorganic LEDs onto a display substrate separate and distinct from the one or more native substrates to form a plurality of pixels, wherein each of the pixels comprises a set of primary inorganic LEDs and a set of redundant inorganic LEDs;
   connecting each redundant inorganic LED of the set of redundant inorganic LEDs to the display circuit in series with a respective diode to form an LED-diode pair such that each LED-diode pair is connected in parallel with a primary inorganic LED of the set of primary inorganic LEDs;
   connecting the primary inorganic LEDs to a display circuit in order to form the display comprising the plurality of pixels; and testing the display to identify defective primary inorganic LEDs in the plurality of pixels.

\* \* \* \* \*